(12) United States Patent
Ikeda

(10) Patent No.: US 10,455,174 B2
(45) Date of Patent: Oct. 22, 2019

(54) IMAGING DEVICE AND ELECTRONIC APPLIANCE

(71) Applicant: SEMICONDUCTOR ENERGY LABORATORY CO., LTD., Atsugi-shi, Kanagawa-ken (JP)

(72) Inventor: Takayuki Ikeda, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 15/842,938

(22) Filed: Dec. 15, 2017

(65) Prior Publication Data

US 2018/0184030 A1  Jun. 28, 2018

(51) Int. Cl.
*H04N 5/369* (2011.01)
*H04N 5/3745* (2011.01)
*H01L 29/786* (2006.01)
*H01L 27/146* (2006.01)

(52) U.S. Cl.
CPC ..... *H04N 5/3698* (2013.01); *H01L 27/14601* (2013.01); *H01L 29/7869* (2013.01); *H01L 29/78603* (2013.01); *H01L 29/78651* (2013.01); *H01L 29/78696* (2013.01); *H04N 5/3745* (2013.01); *H04N 5/37457* (2013.01)

(58) Field of Classification Search
CPC .................................................... H04N 5/3698
USPC ..................................................... 348/222.1
See application file for complete search history.

(56) References Cited

U.S. PATENT DOCUMENTS

| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,274,077 B2 | 9/2012 | Akimoto et al. |

(Continued)

FOREIGN PATENT DOCUMENTS

| JP | 2007-096055 A | 4/2007 |
| JP | 2007-123861 A | 5/2007 |

(Continued)

*Primary Examiner* — Joel W Fosselman
(74) *Attorney, Agent, or Firm* — Nixon Peabody LLP; Jeffrey L. Costellia

(57) ABSTRACT

An imaging device that operates at high speed is provided. The imaging device includes an imaging circuit, two or more image processing blocks, and two or more selectors. The image processing blocks each include an image processing unit and a retention circuit, and the selectors each include a switch unit and a retention circuit. The imaging circuit has a function of generating image data by performing imaging operation. The image processing unit has a function of processing the image data generated by the imaging circuit. The retention circuit included in the image processing block has a function of receiving and retaining a parameter that is necessary for the image processing unit to perform processing. The switch unit has a function of outputting the image data generated by the imaging circuit or the image data processed by the image processing unit. The retention circuit included in the selector has a function of receiving and retaining a parameter that is output from the switch unit. The first retention circuit and the second retention circuit each include a transistor including a metal oxide in a channel formation region.

20 Claims, 34 Drawing Sheets

(56) References Cited

U.S. PATENT DOCUMENTS

| | | |
|---|---|---|
| 8,362,538 B2 | 1/2013 | Koyama et al. |
| 8,378,391 B2 | 2/2013 | Koyama et al. |
| 8,410,838 B2 | 4/2013 | Kato et al. |
| 8,455,868 B2 | 6/2013 | Yamazaki et al. |
| 8,466,463 B2 | 6/2013 | Akimoto et al. |
| 8,575,985 B2 | 11/2013 | Ohmaru et al. |
| 8,629,069 B2 | 1/2014 | Akimoto et al. |
| 8,669,550 B2 | 3/2014 | Akimoto et al. |
| 8,705,292 B2 | 4/2014 | Fujita |
| 8,754,693 B2 | 6/2014 | Nishijima |
| 8,785,928 B2 | 7/2014 | Yamazaki et al. |
| 8,790,959 B2 | 7/2014 | Akimoto et al. |
| 8,796,069 B2 | 8/2014 | Akimoto et al. |
| 8,916,869 B2 | 12/2014 | Koyama et al. |
| 9,099,562 B2 | 8/2015 | Akimoto et al. |
| 9,207,751 B2 | 12/2015 | Nishijima |
| 9,331,112 B2 | 5/2016 | Koyama et al. |
| 9,343,120 B2 | 5/2016 | Shionoiri et al. |
| 9,349,735 B2 | 5/2016 | Yamazaki et al. |
| 9,384,813 B2 | 7/2016 | Aoki et al. |
| 9,477,294 B2 | 10/2016 | Nishijima et al. |
| 9,705,398 B2 | 7/2017 | Takahashi |
| 9,773,814 B2 | 9/2017 | Koyama et al. |
| 9,912,897 B2 | 3/2018 | Okamoto et al. |
| 2004/0250294 A1* | 12/2004 | Kim .................. G11B 27/105 725/135 |
| 2008/0308805 A1 | 12/2008 | Akimoto et al. |
| 2011/0104851 A1 | 5/2011 | Akimoto et al. |
| 2011/0121290 A1 | 5/2011 | Akimoto et al. |
| 2015/0029355 A1* | 1/2015 | Kim .................. H04N 5/23229 348/222.1 |
| 2015/0340513 A1 | 11/2015 | Akimoto et al. |
| 2016/0260718 A1 | 9/2016 | Yamazaki et al. |
| 2017/0365209 A1 | 12/2017 | Kurokawa |

FOREIGN PATENT DOCUMENTS

| | | |
|---|---|---|
| JP | 2011-119711 A | 6/2011 |
| JP | 2011-151383 A | 8/2011 |

* cited by examiner

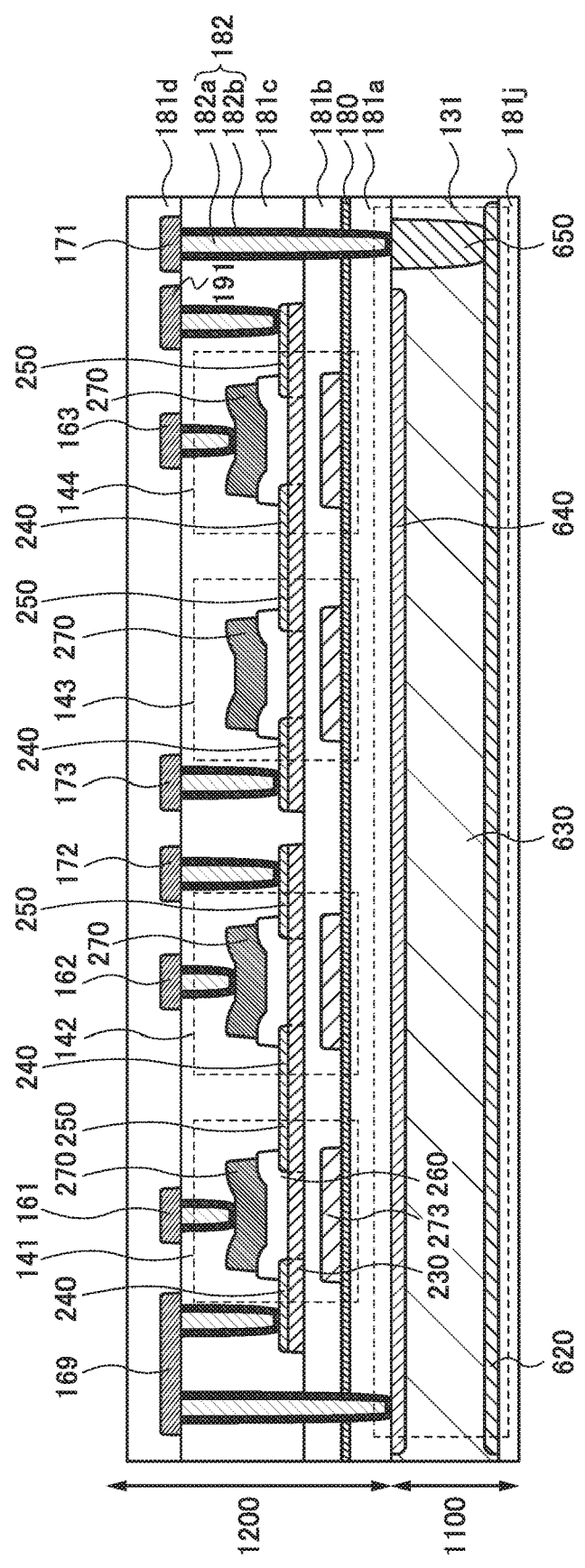

230

230a  230b
230

273  220  230c  270
260

271  272
270

240   250
$W_{SD}$   $W_{OS}$
230

240   250
$W_{SD}$   $W_{OS}$
230

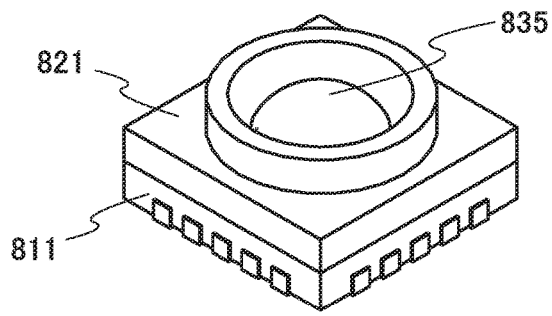
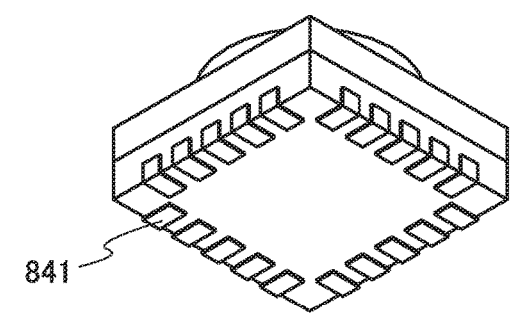
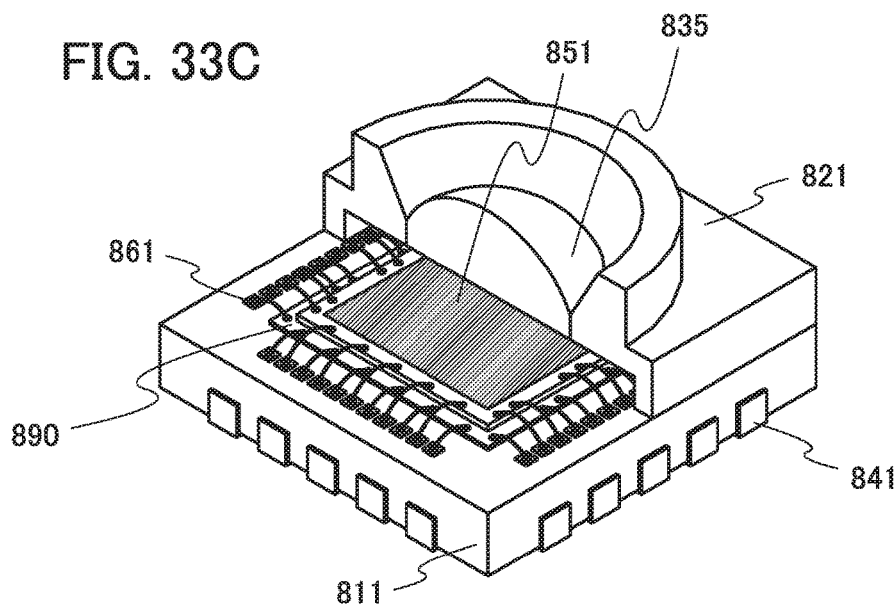
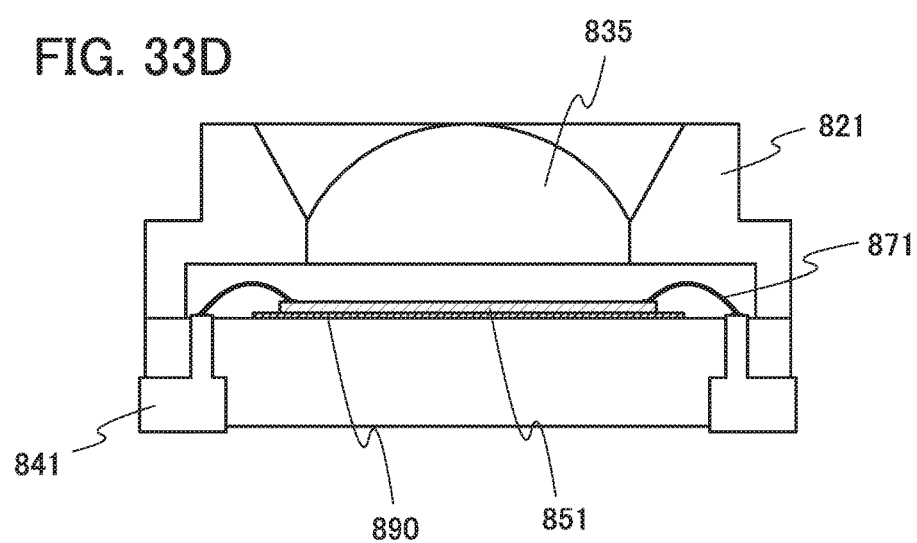

IMAGING DEVICE AND ELECTRONIC APPLIANCE

BACKGROUND OF THE INVENTION

1. Field of the Invention

One embodiment of the present invention relates to an imaging device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, an imaging device, a manufacturing apparatus, a method for operating any of them, and a method for manufacturing any of them.

In this specification and the like, a semiconductor device generally means a device that can function by utilizing semiconductor characteristics. A transistor and a semiconductor circuit are embodiments of semiconductor devices. A storage device, a display device, an imaging device, an electronic appliance, and a manufacturing apparatus include a semiconductor device in some cases.

2. Description of the Related Art

As a semiconductor material that can be used in a transistor, an oxide semiconductor has been attracting attention. For example, Patent Documents 1 and 2 disclose techniques for forming transistors using zinc oxide or an In—Ga—Zn-based oxide semiconductor as an oxide semiconductor. An extremely low off-state current is a feature of a transistor using an oxide semiconductor in its channel formation region (an oxide semiconductor transistor, hereinafter referred to as an OS transistor).

Patent Document 3 discloses an example of using an OS transistor in a nonvolatile memory device, where the extremely low off-state current of the OS transistor is utilized.

Patent Document 4 discloses an imaging device that uses an OS transistor in part of a pixel circuit. This enables a global shutter system to be employed and even an image of a moving object to be captured without distortion.

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2011-151383
[Patent Document 4] Japanese Published Patent Application No. 2011-119711

SUMMARY OF THE INVENTION

An imaging device generally includes an image processor so that generated imaging data can be subjected to image processing such as gamma correction, dimming, toning, noise removal, distortion correction, and video coding/decoding. The imaging device including the image processor can have functions such as face detection, automatic scene recognition, and high dynamic range imaging (hereinafter referred to as HDR).

All of the above functions do not need to be used; for example, any of them can be preferably selected by a user. For example, a parameter indicating whether each function is used or not is generated by a host such as a central processing unit (CPU) and supplied to an image processor, whereby a function to be used can be selected. In the case where the image processor performs image processing or the like, a parameter indicating information necessary for the image processing is generated by the host and supplied to the image processor.

The image processor includes a memory such as a register that has a function of retaining the parameter, and an image processing unit that performs image processing. The parameter generated by the host is retained in the memory and read from the memory by the image processing unit as needed.

In the case where the memory is a volatile memory, the parameter retained in the memory is lost when an imaging device is turned off. When the imaging device is turned on, the processor generates a parameter again. This needs time to be ready for imaging after power-on.

An object of one embodiment of the present invention is to provide an imaging device including a memory that has a function of retaining a parameter even when power is off. Another object of one embodiment of the present invention is to provide an imaging device that operates at high speed. Another object of one embodiment of the present invention is to provide an imaging device with low power consumption. Another object of one embodiment of the present invention is to provide a novel imaging device.

Note that the description of these objects does not exclude the existence of other objects. In one embodiment of the present invention, there is no need to achieve all the objects. Other objects will be apparent from and can be derived from the description of the specification, the drawings, the claims, and the like.

One embodiment of the present invention is an imaging device including a first circuit (for example, imaging circuit), a first controller, two or more second circuits (for example, image processing blocks), and two or more selectors. Each of the second circuits includes an image processing unit and a first retention circuit. Each of the selectors includes a switch unit and a second retention circuit. The first retention circuit includes a first transistor. The second retention circuit includes a second transistor. The first circuit is configured to generate image data by performing imaging operation. The first controller is configured to control power supply to the second circuits. The image processing units included in the second circuits are configured to process image data that has been generated by the first circuit. The image processing unit included in one of the second circuits is configured to process image data that has been processed by the image processing unit included in another one of the second circuits. The first retention circuit is configured to receive a first parameter. The first retention circuit is configured to retain the first parameter while power supply to the second circuits is interrupted. The switch unit is configured to output the image data selected from the image data that has been generated by the first circuit and the image data that has been processed by the image processing units. The second retention circuit is configured to receive a second parameter. The second retention circuit is configured to retain the second parameter while power supply to the selector is interrupted. The first transistor and the second transistor each include a metal oxide in a channel formation region.

In the above mode, the first parameter may indicate information that is necessary for the image processing unit to perform processing. The second parameter may indicate image data that is output from the switch unit.

In the above mode, the first retention circuit may include a first register and a second register. The second retention circuit may include a third register and a fourth register. The first register may be configured to supply the first parameter to the second register. The second register may be configured to output the first parameter, which has been received from the first register, to the image processing unit. The third register may be configured to supply the second parameter to the fourth register. The fourth register may be configured to output the second parameter, which has been received from the third register, to the switch unit.

In the above mode, the second register may include the first transistor. The fourth register may include the second transistor. The second register may be configured to retain the first parameter while power supply to the second circuit is interrupted. The fourth register may be configured to retain the second parameter while power supply to the selector is interrupted.

In the above mode, the first register and the third register may each include a flip-flop circuit.

In the above mode, n (n is an integer of 2 or more) second circuits may be included and (n+1) selectors may be included.

In the above mode, the first retention circuit may include a first capacitor. The second retention circuit may include a second capacitor. A source or a drain of the first transistor may be electrically connected to the first capacitor. A source or a drain of the second transistor may be electrically connected to the second capacitor.

In the above mode, a second controller may be included. The second controller may control power supply to the first circuit and the first controller.

In the above mode, a host may be included. The host may be configured to generate the first parameter and the second parameter.

In the above mode, the first controller may be configured to receive the first parameter that has been generated by the host. The first controller may be configured to receive the second parameter that has been generated by the host. The first controller may be configured to supply the received first parameter to the second circuit. The first controller may be configured to supply the received second parameter to the selector.

Another embodiment of the present invention is an electronic appliance including the imaging device of one embodiment of the present invention and an operation button.

According to one embodiment of the present invention, an imaging device including a memory that has a function of retaining a parameter even when power is off can be provided. According to another embodiment of the present invention, an imaging device that operates at high speed can be provided. According to another embodiment of the present invention, an imaging device with low power consumption can be provided. According to another embodiment of the present invention, a novel imaging device can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF THE DRAWINGS

FIG. 15 is a cross-sectional view showing a structure example of an imaging device.

FIGS. 33A to 33D are perspective views and a cross-sectional view of a package including an imaging device.

DETAILED DESCRIPTION OF THE INVENTION

Figure 1:
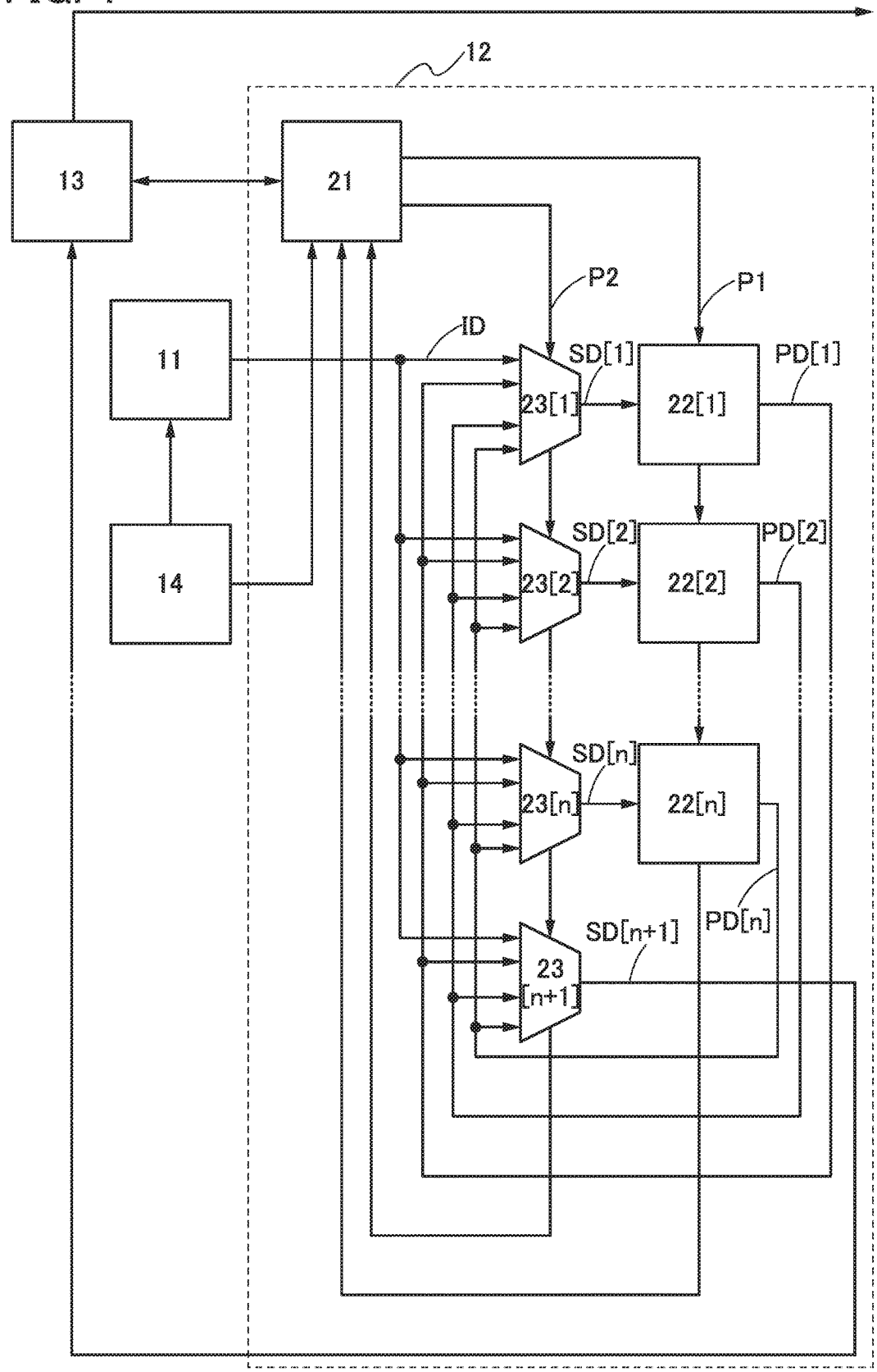
FIG. 1 is a block diagram showing a configuration example of an imaging device.

Embodiments will be described with reference to the drawings. Note that embodiments can be implemented with various modes, and it is easily understood by those skilled in the art that modes and details can be modified in various ways without departing from the spirit and scope of the present invention. Therefore, the present invention should not be construed as being limited to the description in the following embodiments. Any of the embodiments described below can be combined as appropriate.

In the drawings and the like, the size, the layer thickness, the region, or the like is sometimes exaggerated for clarity, and thus is not limited to the illustrated scale. Note that drawings are schematic views of ideal examples, and the embodiments of the present invention are not limited to the shape, the value, or the like illustrated in the drawings.

In the drawings and the like, the same elements, elements having similar functions, elements formed of the same material, elements formed at the same time, and the like are sometimes denoted by the same reference numerals, and the description thereof is not repeated in some cases.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification and the like, the terms for describing arrangement such as "over" and "under" do not necessarily mean "directly over" and "directly under", respectively, in the description of a physical relationship between components. For example, the expression "a gate electrode over a gate insulating layer" can mean the case where an additional component exists between the gate insulating layer and the gate electrode.

In this specification and the like, ordinal numbers such as "first", "second", and "third" are used in order to avoid confusion among components, and the terms do not limit the components numerically.

In this specification and the like, the term "electrically connected" includes the case where components are connected through an "object having any electric function". There is no particular limitation on the "object having any electric function" as long as electric signals can be transmitted and received between components that are connected through the object. Examples of the "object having any electric function" are a switching element such as a transistor, a resistor, an inductor, a capacitor, and elements with a variety of functions as well as an electrode and a wiring.

In this specification and the like, the term "voltage" often refers to a difference between a given potential and a reference potential (e.g., a ground potential). Accordingly, voltage, potential, and potential difference can also be referred to as potential, voltage, and voltage difference, respectively.

In this specification and the like, a transistor is an element having at least three terminals: a gate, a drain, and a source. The transistor has a channel formation region between a drain (a drain terminal, a drain region, or a drain electrode) and a source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or a direction of current flow is changed in circuit operation, for example. Therefore, the terms "source" and "drain" can be switched in this specification and the like.

Unless otherwise specified, an off-state current in this specification and the like refers to a drain current of a transistor in an off state (also referred to as a non-conducting state or a cutoff state). Unless otherwise specified, the off state of an n-channel transistor means that a voltage between a gate and a source ($V_{gs}$) is lower than the threshold voltage ($V_{th}$), and the off state of a p-channel transistor means that $V_{gs}$ is higher than $V_{th}$. That is, the off-state current of an n-channel transistor sometimes refers to a drain current that flows when the gate-source voltage $V_{gs}$ is lower than the threshold voltage $V_{th}$.

In the above description of the off-state current, a drain may be replaced with a source. That is, the off-state current sometimes refers to a current that flows through a source of a transistor in the off state.

In this specification and the like, the term "leakage current" sometimes expresses the same meaning as "off-state current". In this specification and the like, the off-state current sometimes refers to a current that flows between a source and a drain when a transistor is in the off state.

In this specification and the like, a metal oxide means an oxide of metal in a broad sense. Metal oxides are classified into an oxide insulator, an oxide conductor (including a transparent oxide conductor), an oxide semiconductor (also simply referred to as OS), and the like. For example, a metal oxide used in an active layer of a transistor is called an oxide semiconductor in some cases. That is, a metal oxide that has at least one of an amplifying function, a rectifying function, and a switching function can be called a metal oxide semiconductor, or OS for short. An OS FET refers to a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" may be stated. CAAC refers to an example of a crystal structure, and CAC refers to an example of a function or a material composition.

In this specification and the like, a CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or CAC metal oxide, separation of the functions can maximize each function.

In this specification and the like, the CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different band gaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC metal oxide is used in a channel formation region of a transistor, high current drive capability in the on state of the transistor, that is, a high on-state current and a high field-effect mobility, can be obtained.

In other words, a CAC-OS or CAC metal oxide can be called a matrix composite or a metal matrix composite.

Embodiment 1

In this embodiment, an imaging device that is one embodiment of the present invention will be described with reference to drawings.
<Imaging Device>
FIG. 1 is a block diagram showing a configuration example of an imaging device 10. The imaging device 10 includes an imaging circuit 11, an image processing circuit 12, a host 13, and a controller 14.

The imaging circuit 11 has a function of performing imaging operation and generating image data ID. As will be described in detail later, pixels including photoelectric conversion elements are arranged in a matrix in the imaging circuit 11. The photoelectric conversion elements detect light emitted from the outside, i.e., ambient light, and the imaging circuit 11 generates the image data ID corresponding to the detected light.

The image processing circuit 12 has a function of performing image processing on the image data ID. Examples of the image processing include gamma correction, dimming, toning, noise removal, distortion correction, and video coding/decoding. The image processing circuit 12 also has functions of performing face detection, automatic scene recognition, and HDR. Here, the automatic scene recognition means that exposure, focus, flash, and the like are automatically adjusted according to the ambient environment.

The image processing circuit 12 does not need to perform all the above processing, but may perform part of the processing. The following is possible for example: the image processing circuit 12 performs only gamma correction and noise removal on the image data ID, and does not perform distortion correction, video coding/decoding, and the like; or the image processing circuit 12 performs face detection but does not perform automatic scene recognition and HDR. Processing to be performed by the image processing circuit 12 can be selected by, for example, a user of the imaging device 10. Alternatively, processing to be performed by the image processing circuit 12 can be automatically selected according to, for example, the ambient environment. For example, HDR is stopped in the case where the luminance ratio between the brightest part and the darkest part in the image data ID is less than or equal to a predetermined value.

Note that the image processing circuit 12 can be, for example, a processor.

The host 13 is a circuit that has a function of generating a parameter required by the image processing circuit 12. For example, the host 13 can generate a parameter that indicates information necessary for image processing. For example, in the case where image data X, which is supplied to the image processing circuit 12, is converted into image data Y according to a predetermined formula, the host 13 can generate a parameter that indicates a coefficient of the formula. In addition, the host 13 can generate, for example, a parameter that indicates processing performed on the image data ID, as will be described in detail later.

The host 13 is a circuit that also has a function of receiving image data output from the image processing circuit 12 and outputting the image data to an external appliance. Here, the external appliance means any device provided outside of the imaging device 10, e.g., a display device and a memory device. Note that the host 13 can generate different parameters in accordance with the received image data.

Note that the host 13 includes a central processing unit (CPU), a memory, and the like. The CPU may include a graphics processing unit (GPU).

The controller 14 is a circuit that has a function of controlling power supply to the imaging circuit 11 and the image processing circuit 12. For example, in the case where a user of the imaging device 10 does not use the imaging device 10, power supply to the imaging circuit 11 and the image processing circuit 12 can be interrupted. This can reduce the power consumption of the imaging device 10.

The image processing circuit 12 includes a controller 21, an image processing block 22, and a selector 23. For example, n (n is an integer of 2 or more) image processing blocks 22 and m (m is an integer of 2 or more) selectors 23 can be provided. Note that m can be, for example, n+1. The following description is made on the case where m=n+1 as shown in FIG. 1.

In this specification, when components denoted by the same reference numerals need to be distinguished from one another, symbols for identification such as [0], [1], and [n] are added to the reference numerals in some cases. For example, symbols such as [1], [2], and [n] are used in order to distinguish a plurality of image processing blocks 22 from one another and a plurality of selectors 23 from one another.

The selector 23 includes an input terminal, an output terminal, a selection control input terminal, and a selection control output terminal. The selector 23 includes, for example, m (=n+1) input terminals, one output terminal, one selection control input terminal, and one selection control output terminal.

The image processing blocks 22[1] to 22[n] are connected in series. For example, the image processing block 22[1] is electrically connected to the image processing block 22[2], the image processing block 22[2] is electrically connected to the image processing block 22[1] and the image processing block 22[3], and the image processing block 22[n] is electrically connected to the image processing block 22[n−1].

The selectors 23[1] to 23[n+1] are connected in series through the selection control input terminal and the selection control output terminal. For example, the selection control output terminal of the selector 23[1] is electrically connected to the selection control input terminal of the selector 23[2], and the selection control output terminal of the selector 23[n] is electrically connected to the selection control input terminal of the selector 23[n+1].

The controller 21 is a circuit that has a function of receiving a parameter generated by the host 13 and supplying the parameter to the image processing block 22[1], the selector 23[1], or the like. For example, the host 13 can add a header to a generated parameter and write information on the destination of the parameter into the header. In that case, the controller 21 can read the header of the parameter and determine the destination of the parameter. For example, the controller 21 can determine which of the image processing block 22[1] and the selector 23[1] will receive the parameter. Note that in the case where the parameter is supplied to the selector 23[1], the parameter can be supplied to the selection control input terminal of the selector 23[1].

In this specification and the like, a parameter supplied to the image processing block 22 is referred to as a parameter P1 and a parameter supplied to the selector 23 is referred to as a parameter P2.

Note that the parameter P1 can be sequentially supplied to the image processing blocks 22[2] to 22[n] through a previous image processing block 22. For example, the parameter P1 can be supplied from the controller 21 to the image processing block 22[3] through the image processing block 22[1] and the image processing block 22[2]. For example, the parameter P1 can be supplied from the controller 21 to the image processing block 22[n] through the image processing blocks 22[1] to 22[n−1]. The parameter P2 can be sequentially supplied to the selectors 23[2] to 23[n+1] through a previous selector 23. For example, the parameter P2 can be supplied from the controller 21 to the selector 23[3] through the selector 23[1] and the selector 23[2]. For example, the parameter P2 can be supplied from the controller 21 to the selector 23[n+1] through the selectors 23[1] to 23[n]. The parameter P1 that has been supplied to the image processing block 22[n] can be supplied to the controller 21. The parameter P2 that has been supplied to the selection control input terminal of the selector 23[n+1] can be supplied to the controller 21 from the selection control output terminal of the selector 23[n+1]. The parameter P1 that has been supplied from the image processing block 22[n] to the controller 21 and the parameter P2 that has been supplied from the selector 23[n+1] to the controller 21 can be supplied to the host 13. Accordingly, the host 13 can recognize, for example, that the parameter P1 has been supplied to all the image processing blocks 22 properly and that the parameter P2 has been supplied to all the selectors 23 properly. In the case where the image processing block 22 rewrites the parameter P1, the host 13 can recognize the rewritten parameter P1. Note that the parameter P1 that has been supplied to the image processing block 22[n] and the parameter P2 that has been supplied to the selection control input terminal of the selector 23[n+1] are not necessarily supplied to the controller 21.

FIG. 1 illustrates a configuration in which the image processing circuit 12 includes a path through which the parameter P1 is supplied to the image processing block 22 and a path through which the parameter P2 is supplied to the selector 23; however, one embodiment of the present invention is not limited to this configuration. For example, the number of paths through which the parameter P1 is supplied to the image processing block 22 and the number of paths through which the parameter P2 is supplied to the selector 23 may each be two or i (i is a natural number). A larger number of paths through which the parameter is supplied can increase the operation speed of the imaging device 10. Note that the number of paths through which the parameter P1 is supplied to the image processing block 22 may be different from the number of paths through which the parameter P2 is supplied to the selector 23.

The controller 21 is a circuit that has a function of controlling power supply to the image processing block 22. As will be described in detail later, some of the image processing blocks 22[1] to 22[n] do not need to be used in the imaging device 10. In that case, the controller 21 can interrupt power supply to the image processing block 22 not in use. This can reduce the power consumption of the imaging device 10. Note that the controller 21 may also have a function of controlling power supply to the selector 23. For example, as will be described in detail later, power supply to some of the selectors 23[1] to 23[n+1], the output terminals of which are electrically connected to the image processing block 22 not in use, can be interrupted.

In the case where the image processing circuit 12 has the configuration illustrated in FIG. 1, the controller 14 can control power supply to the controller 21. When power supply to the controller 21 is interrupted, the controller 21 can interrupt power supply to all the image processing blocks 22[1] to 22[n], for example. The controller 21 can also interrupt power supply to all the selectors 23[1] to 23[n+1], for example. Note that the controller 14 can interrupt power supply to the controller 21 in the case where, for example, power supply to the imaging circuit 11 is interrupted.

The image processing block 22 is a circuit that has a function of processing image data SD in accordance with the parameter P1, and outputting the processed data as image data PD. The image processing block 22 is a circuit that has a function of processing the image data PD output from the image processing block 22 in accordance with the parameter P1. That is, for example, the image data PD output from the image processing block 22[1] can be processed by the image processing blocks 22[1] to 22[n].

The image processing blocks 22[1] to 22[n] can perform different kinds of processing. This means that the image processing blocks 22[1] to 22[n] have different functions from one another. For example, the image processing block 22[1] can perform gamma correction, the image processing block 22[2] can perform noise removal, the image processing block 22[n−1] can perform face detection, and the image processing block 22[n] can perform HDR.

The selector 23 is a circuit that has a function of selecting image data that is to be processed by the image processing block 22 and outputting the selected data as the image data SD. The selector 23 is a circuit that also has a function of selecting image data that is to be output to an external appliance and outputting the selected data as the image data SD. As illustrated in FIG. 1, for example, an output terminal of a selector 23[k] (k is an integer of 1 to n) is electrically connected to an image processing block 22[k]. In addition, the output terminal of the selector 23[n+1] is electrically connected to the host 13, for example. That is, for example, the selectors 23[1] to 23[n] each have a function of selecting image data that is to be processed by the corresponding image processing block 22 and outputting the selected data as the image data SD. The selector 23[n+1] has a function of, for example, selecting image data that is to be output to the external appliance and outputting the selected data as the image data SD.

In this specification and the like, the image data PD output from the image processing block 22[k] is referred to as image data PD[k]. The image data SD output from the selector 23[k] is referred to as image data SD[k]. In other words, the image processing block 22[k] has a function of processing the image data SD[k] and outputting the processed data as the image data PD[k].

The image data ID and image data PD[1] to PD[n] can be supplied to the input terminal of the selector 23. That is, the selector 23 can output image data selected from the image data ID and the image data PD[1] to PD[n]. Note that which image data of the image data supplied to the input terminal of the selector 23 is output as the image data SD can be selected by the parameter P2 supplied to the selection control input terminal.

As will be described in detail later, the selector 23 can output no image data SD in accordance with the parameter P2 supplied to the selection control input terminal. For example, one or more of the selectors 23[1] to 23[n] can output no image data SD.

In that case, processing can be stopped in the image processing block 22 electrically connected to the output terminal of the selector 23 that does not output the image data SD. As mentioned above, the interruption of power supply to the image processing block 22 that does not perform processing, i.e., the image processing block 22 not in use, leads to a reduction in the power consumption of the imaging device 10. Furthermore, power supply to the selector 23 that does not output the image data SD, i.e., the selector 23 whose output terminal is electrically connected to the image processing block 22 that does not perform processing, may be interrupted as described above.

From the above, the parameter P2 supplied to the selector 23 can be regarded as a parameter that selects image data to be processed. In addition, because the image processing blocks 22[1] to 22[n] perform different kinds of processing, the parameter P2 can be regarded as a parameter that selects processing performed on the image data ID.

<Image Processing Block>

Figure 2A:
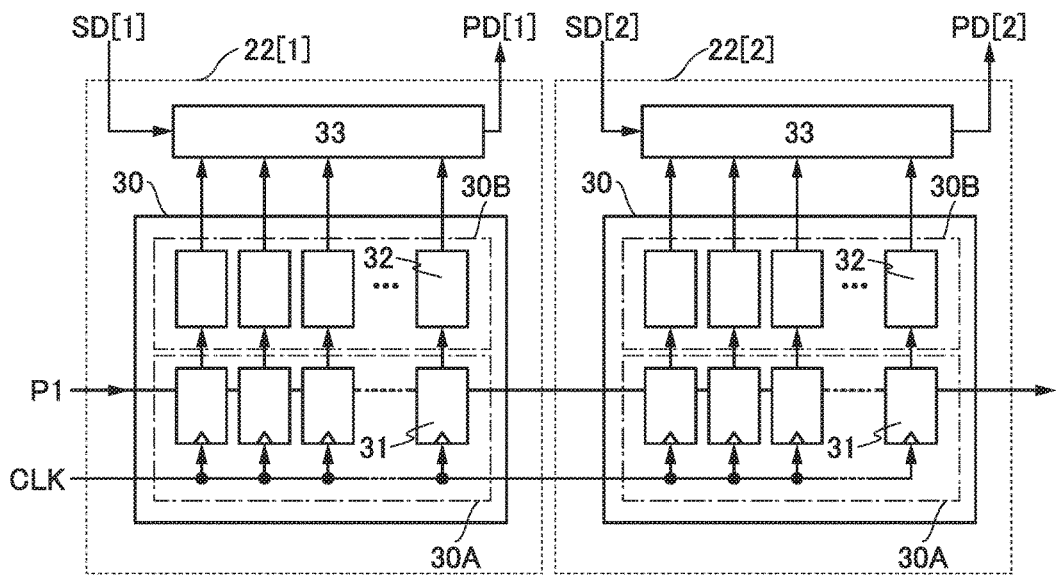
FIGS. 2A and 2B are block diagrams each showing a configuration example of an image processing block.

FIG. 2A is a block diagram showing a configuration example of the image processing block 22. FIG. 2A illustrates the image processing block 22[1] and the image processing block 22[2].

The image processing block 22 includes a retention circuit 30 and an image processing unit 33. The retention circuit 30 has a function of receiving and retaining a parameter. For example, the retention circuit 30 has a function of receiving and retaining the parameter P1 and supplying the parameter P1 to the image processing unit 33.

The image processing unit 33 is a circuit that has a function of performing image processing on the image data SD, which is output from the selector 23, in accordance with the parameter P1, and outputting the processed data as the image data PD. For example, the image processing unit 33 provided in the image processing block 22[1] has a function of performing image processing on the image data SD[1], which is output from the selector 23[1], in accordance with the parameter P1 and outputting the processed data as the image data PD[1]. The image processing unit 33 provided in the image processing block 22[2] has a function of performing image processing on the image data SD[2], which is output from the selector 23[2], in accordance with the parameter P1 and outputting the processed data as the image data PD[2]. From the above, the parameter P1 can be regarded as a parameter indicating information that is necessary for the image processing unit 33 to perform processing.

The retention circuit 30 includes a scan chain register unit 30A and a register unit 30B. The scan chain register unit 30A includes a plurality of registers 31, which compose a register chain. The register unit 30B includes a plurality of registers 32.

The register 31 is a circuit that has a function of receiving a parameter and supplying the parameter to the register 32. For example, the register 31 has a function of receiving the parameter P1 and supplying the parameter P1 to the register 32. A clock signal CLK is supplied to the register 31, and a parameter is received and supplied to the register 32 in synchronization with the clock signal CLK.

The register 32 is a circuit that has a function of retaining the parameter supplied from the register 31 and outputting the parameter to the image processing unit 33. For example, the register 32 has a function of retaining the parameter P1 supplied from the register 31 and outputting the parameter P1 to the image processing unit 33.

Note that the register 31 has a function of retaining every parameter P1 as one-bit data, for example. The register 32 has a function of retaining every parameter P1 as one-bit data, for example.

<Selector>

Figure 2B:
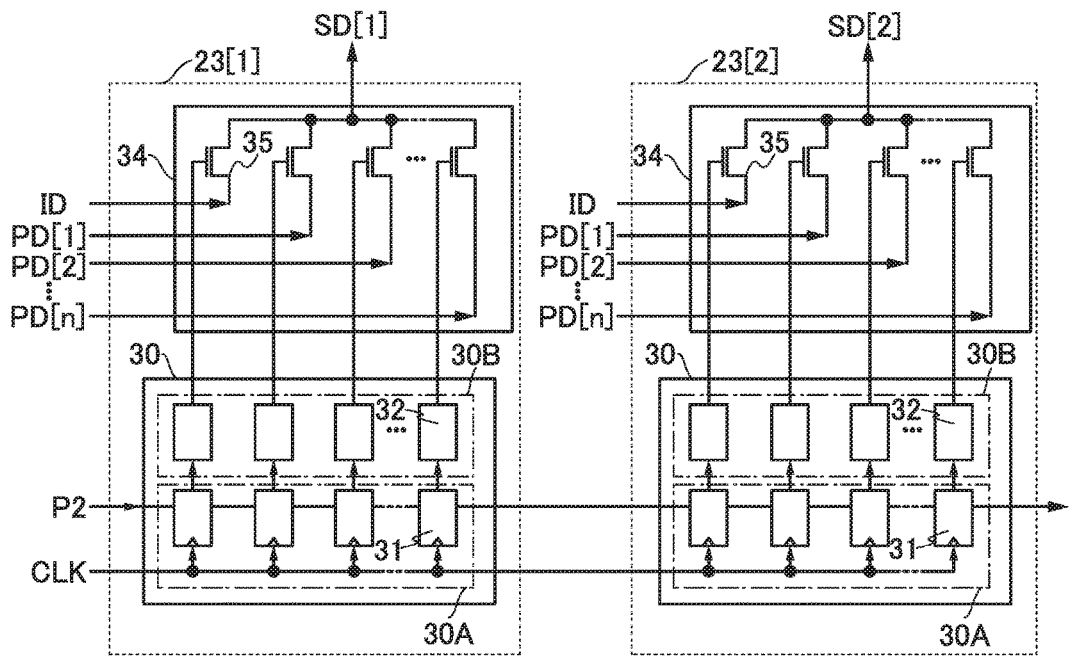

FIG. 2B is a block diagram showing a configuration example of the selector 23. FIG. 2B illustrates the selector 23[1] and the selector 23[2].

The selector 23 includes the retention circuit 30 and a switch unit 34. The retention circuit 30 included in the selector 23 has a function of receiving and retaining the parameter P2 and supplying the parameter P2 to the switch unit 34. Note that the retention circuit 30 included in the selector 23 can have a configuration and the like similar to those of the retention circuit 30 included in the image processing block 22.

The switch unit 34 is a circuit that has a function of, for example, selecting data among the image data supplied to the switch unit 34, e.g., among the image data ID and the image data PD[1] to PD[n], in accordance with the parameter P2, and outputting the selected data as the image data SD. For example, the switch unit 34 provided in the selector 23[1] has a function of selecting data among the image data ID and the image data PD[1] to PD[n] and outputting the selected data as the image data SD[1]. For example, the switch unit 34 provided in the selector 23[2] has a function of selecting data among the image data ID and the image data PD[1] to PD[n] and outputting the selected data as the image data SD[2]. From the above, the parameter P2 can be regarded as a parameter indicating image data output from the switch unit 34.

The switch unit 34 includes transistors 35. The number of the transistors 35 is equal to, for example, the number of pieces of image data supplied to the input terminals of the selector 23, and one of a source and a drain of each transistor 35 serves as the input terminal of the selector 23. That is, in the case where, for example, the image data ID and the image data PD[1] to PD[n] are supplied to the input terminals of the selector 23, (n+1) transistors 35 are provided in the switch unit 34 in the selector 23, and image data is supplied to one of the source and the drain of each transistor 35.

A gate of each transistor 35 is electrically connected to, for example, one register 32. In other words, the number of the registers 32 provided in the register unit 30B can be equal to the number of the transistors 35. The parameter P2 is supplied to the gate of the transistor 35 from the register 32 electrically connected thereto.

In this specification and the like, the gate refers to a front gate in some cases. The gate refers to one or both of a front gate and a back gate in other cases. The gate refers to a back gate in other cases.

The other of the source and the drain of each transistor 35 is electrically connected to each other. Accordingly, when the transistor 35 is turned on, image data supplied to the source or the drain of the transistor 35 is output as the image data SD from the other of the source and the drain of the transistor 35. For example, when the image data ID is supplied to one of the source and the drain of the transistor 35, the image data ID is output as the image data SD when the transistor 35 is turned on.

In the case where the transistor 35 is, for example, an n-channel transistor, the transistor 35 can be turned on when a high potential is applied to the gate of the transistor 35. In other words, with the parameter P2, for example, a high potential is applied to the gate of one of the transistors 35 that has the source or the drain supplied with image data output as the image data SD, and for example, a low potential is applied to the gates of the other transistors 35.

The following description is made on the assumption that all the transistors in the imaging device 10 are n-channel transistors; a p-channel transistor may be used as necessary or as appropriate. In that case, the description in this specification and the like can be referred to when, for example, the levels of potentials are inverted as appropriate.

In this specification and the like, a low potential can be, for example, a ground potential.

In the case where the parameter retained in the retention circuit 30 is updated in FIGS. 2A and 2B, first, the parameter in the scan chain register unit 30A is changed. After rewritten, the parameters in all the registers 31 in the scan chain register unit 30A are collectively loaded to the registers 32 in the register unit 30B.

Thus, the image processing unit 33 can perform various processing with use of the parameters P1 that have been collectively updated. In addition, the switch unit 34 can select image data to be output with use of the parameters P2 that have been collectively updated. Since the parameters are updated simultaneously, the imaging device 10 can operate stably. Furthermore, because the retention circuit 30 includes the scan chain register unit 30A and the register unit 30B, the parameters in the scan chain register unit 30A can be updated even when the image processing unit 33 and the switch unit 34 are in operation.

The register 32 is preferably a nonvolatile register in which a retained parameter is not lost even when power supply is interrupted. In order to make the register 32 nonvolatile, for example, an OS transistor is preferably used to compose the register 32 as will be described in detail later.

When the register 32 is a nonvolatile register, the host 13 does not need to generate the parameter P1 after power supply to the image processing block 22 is interrupted and restarted. Then, the image processing unit 33 can read the parameter from the register 32 and restart processing. In addition, when the register 32 is a nonvolatile register, the host 13 does not need to generate the parameter P2 after power supply to the selector 23 is interrupted and restarted. Then, the switch unit 34 can restart processing in accordance with the parameter retained in the register 32. As a result, the imaging device 10 can operate at higher speed.

The nonvolatile register 32 also allows reducing the frequency of the refresh operation of the register 32. This leads to a reduction in the power consumption of the imaging device 10.

<Register>

Figure 3A:
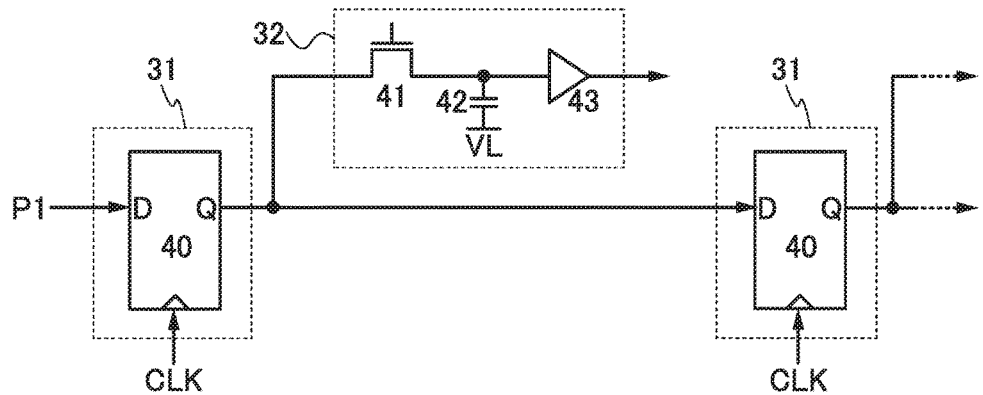
FIGS. 3A to 3C are circuit diagrams each showing a configuration example of a register.
Figure 3B:
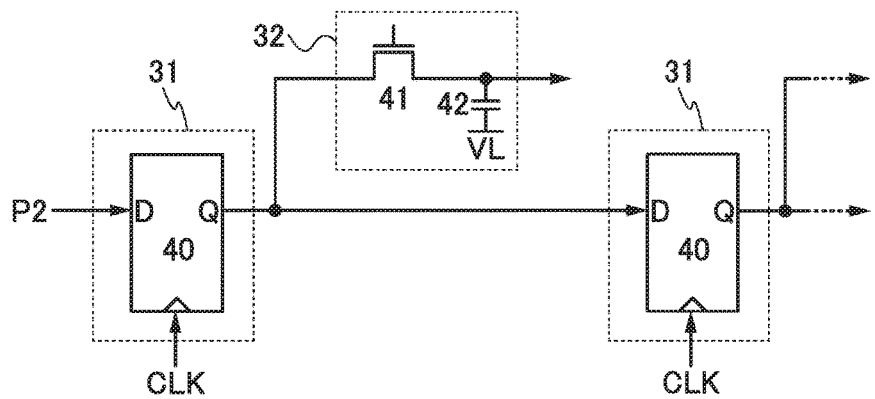
Figure 3C:
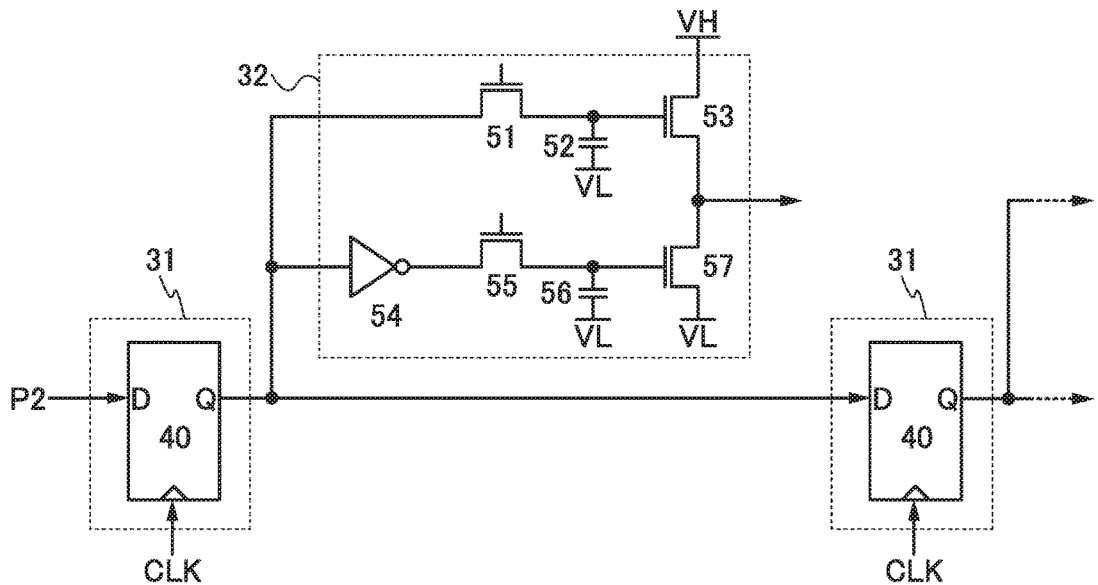

FIGS. 3A to 3C are circuit diagrams each showing configuration examples of the register 31 and the register 32. FIGS. 3A to 3C show the case where the register 31 includes a flip-flop circuit 40. In that case, a parameter is supplied to an input terminal of the flip-flop circuit 40. An output terminal of the flip-flop circuit 40 is electrically connected to the input terminal of the next-stage flip-flop circuit 40. That is, for example, the output terminal of the flip-flop circuit 40 in a register 31 [k] is electrically connected to the input terminal of the flip-flop circuit 40 in a register 31[k+1]. The flip-flop circuit 40 has a function of retaining the parameter as data.

Note that the register 31 does not necessarily include the flip-flop circuit 40. For example, the register 31 may include a latch circuit or any other memory circuit.

The register 31 preferably includes, for example, a Si transistor. Since the Si transistor has a high on-state current, the register 31 can operate at high speed. This increases the operation speed of the imaging device 10. Note that the register 31 may include an OS transistor.

The register 32 includes, in the case of FIG. 3A, a transistor 41, a capacitor 42, and a buffer circuit 43. In the case where the register 31 includes the flip-flop circuit 40, one of a source and a drain of the transistor 41 is electrically connected to the output terminal of the flip-flop circuit 40. The other of the source and the drain of the transistor 41 is electrically connected to one electrode of the capacitor 42 and an input terminal of the buffer circuit 43. Note that a low power source potential can be applied to the other electrode of the capacitor 42, for example.

In FIGS. 3A to 3C, a low power source potential is denoted by VL and a high power source potential is denoted by VH. Note that VL and VH are sometimes used to represent a low power source potential and a high power source potential, respectively, in other drawings.

The transistor 41 has a function of controlling the supply of data retained in the register 31 to the register 32. For example, the data retained in the register 31 is supplied to the register 32 when the transistor 41 is turned on.

The capacitor 42 has a function of retaining data supplied from the register 31 as charge. In other words, the transistor 41 has a function of controlling charge and discharge of the capacitor 42.

The buffer circuit 43 has a function of correcting, for example, the potential of input data without changing the logic of the input data. The data output from the buffer circuit 43 is output to, for example, the image processing unit 33 or the switch unit 34.

The transistor 41 is preferably an OS transistor. The OS transistor has an extremely low off-state current as described above, because the bandgap of an oxide semiconductor is higher than or equal to 3.0 eV and the OS transistor has a low leakage current due to thermal excitation. Accordingly, leakage of charge retained in the capacitor 42 can be reduced. This enables the register 32 to keep retaining data even when, for example, power supply to the image processing block 22 or the selector 23 is interrupted and power supply to the register 32 is interrupted. That is, the register 32 can serve as a nonvolatile register.

Note that the oxide semiconductor preferably contains at least one of indium (In) and zinc (Zn). A typical example of such an oxide semiconductor is an In—M—Zn oxide (the element M is Al, Ga, Y, or Sn, for example). By reducing impurities serving as electron donors, such as moisture or hydrogen, and also reducing oxygen vacancies, an i-type (intrinsic) or a substantially i-type oxide semiconductor can be obtained. Here, such an oxide semiconductor can be referred to as a highly purified oxide semiconductor. By using a highly purified oxide semiconductor in a channel formation region, the off-state current normalized by channel width can be as low as several yoctoamperes per micrometer to several zeptoamperes per micrometer.

The register 32 illustrated in FIG. 3A can output more accurate data to the buffer circuit 43. Therefore, the register 32 illustrated in FIG. 3A is preferably used as the register 32 included in the image processing block 22.

The register 32 may have a configuration illustrated in FIG. 3B. The register 32 in FIG. 3B is different from the register 32 in FIG. 3A in that the buffer circuit 43 is omitted. The register 32 with the configuration illustrated in FIG. 3B occupies a smaller area, which allows a larger number of the registers 31, the registers 32, and the like to be provided in the imaging device 10, and a larger number of the image processing blocks 22, the selectors 23, and the like to be provided in the imaging device 10. As a result, the imaging device 10 can have greater versatility and higher performance.

The register 32 illustrated in FIG. 3B is preferably used as the register 32 included in the selector 23. In that case, data output from the register 32 in the selector 23 is supplied to the gate of the transistor 35 included in the switch unit 34. Hence, the data output from the register 32 in the selector 23 only needs to be distinguished whether it is a high potential or a low potential, and does not need to have an accurate potential. Thus, the buffer circuit 43 can be omitted without any serious problem. The above is the reason that the register 32 illustrated in FIG. 3B is preferably used as the register 32 included in the selector 23.

In the case where the register 32 illustrated in FIG. 3B is used as the register 32 included in the selector 23, the transistor 35 included in the switch unit 34 is preferably an OS transistor. The gate insulating layer of the OS transistor can have a large thickness, thereby having a lower gate leakage current than the Si transistor. In the case where the register 32 illustrated in FIG. 3B is used as the register 32 included in the selector 23, one electrode of the capacitor 42 is electrically connected to the gate of the transistor 35 included in the switch unit 34. When the OS transistor is used as the transistor 35, it is possible to reduce the leakage of charge held in the capacitor 42 through the gate of the transistor 35.

The register 32 may have a configuration illustrated in FIG. 3C. The register 32 illustrated in FIG. 3C includes a transistor 51, a capacitor 52, a transistor 53, an inverter 54, a transistor 55, a capacitor 56, and a transistor 57.

In the case where the register 31 includes the flip-flop circuit 40, the output terminal of the flip-flop circuit 40 is electrically connected to one of a source and a drain of the transistor 51 and an input terminal of the inverter 54. The other of the source and the drain of the transistor 51 is electrically connected to one electrode of the capacitor 52 and a gate of the transistor 53. One of a source and a drain of the transistor 53 is electrically connected to one of a source and a drain of the transistor 57. An output terminal of the inverter 54 is electrically connected to one of a source and a drain of the transistor 55. The other of the source and the drain of the transistor 55 is electrically connected to one electrode of the capacitor 56 and a gate of the transistor 57.

A high power source potential can be applied to the other of the source and the drain of the transistor 53, for example. A low power source potential can be applied to the other electrode of the capacitor 52, the other electrode of the capacitor 56, and the other of the source and the drain of the transistor 57, for example.

The transistor 51 has a function of controlling the supply of data retained in the register 31 to the register 32. When the transistor 51 is turned on, the data retained in the register 31 is supplied to the register 32. The capacitor 52 has a function of retaining data supplied from the register 31 as charge. In other words, the transistor 51 has a function of controlling charge and discharge of the capacitor 52.

The inverter 54 has a function of inverting the logic of data supplied from the register 31. The transistor 55 has a function of controlling the supply of data, which is retained in the register 31 and whose logic is inverted, to the register 32. For example, when the transistor 55 is turned on, data retained in the register 31 is supplied to the register 32 and the logic of the data is inverted by the inverter 54.

The capacitor 56 has a function of retaining data, whose logic is inverted by the inverter 54, as charge. In other words, the transistor 55 has a function of controlling charge and discharge of the capacitor 56.

The transistor 53 and the transistor 57 have a function of outputting a signal having a logic that corresponds to the data supplied from the register 31. For example, in the case where a high potential data is output from the register 31 to the register 32, a high potential is applied to the gate of the transistor 53 whereas a low potential is applied to the gate of the transistor 57. As a result, the transistor 53 is turned on and the transistor 57 is turned off, so that a high potential signal is output.

For example, in the case where a low potential data is output from the register 31 to the register 32, a low potential is applied to the gate of the transistor 53 whereas a high potential is applied to the gate of the transistor 57. As a result, the transistor 53 is turned off and the transistor 57 is turned on, so that a low potential signal is output.

The transistors 51 and 55 are preferably OS transistors. The OS transistor has an extremely low off-state current as described above. Accordingly, leakage of charge retained in the capacitor 52 and leakage of charge retained in the capacitor 56 can be reduced.

The transistors 53 and 57 are preferably OS transistors. The OS transistor has an extremely low gate leakage current as described above. Accordingly, leakage of charge retained in the capacitor 52 and leakage of charge retained in the capacitor 56 can be reduced.

The register 32 illustrated in FIG. 3C can output a high potential signal or a low potential signal. Therefore, the register 32 illustrated in FIG. 3C is preferably used as the register 32 included in the selector 23. In that case, the one of the source and the drain of the transistor 53 and the one of the source and the drain of the transistor 57 are electrically connected to the gate of the transistor 35 included in the switch unit 34. The gate of the transistor 35 is electrically connected neither to the one electrode of the capacitor 52 nor to the one electrode of the capacitor 56; thus, even when the transistor 35 is a Si transistor, gate leakage of charge retained in the capacitors 52 and 56 can be reduced. This allows the on-state current of the transistor 35 to increase and thus the switch unit 34 to output image data immediately after the transistor 35 is turned on. As a result, the imaging device 10 can operate at high speed.

Figure 4A:
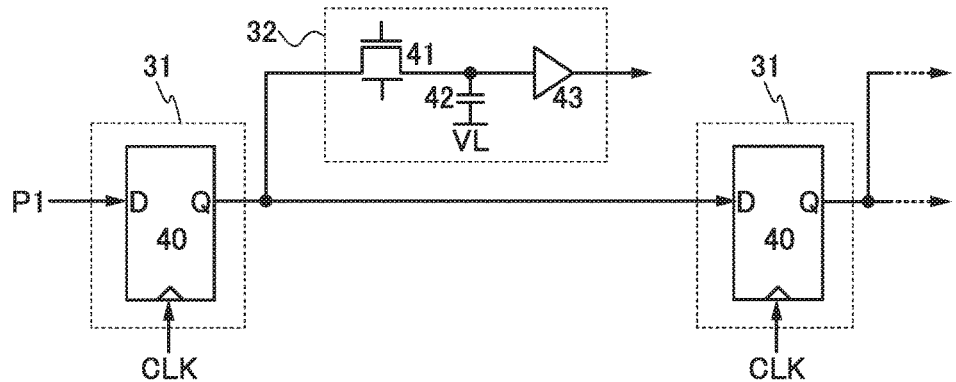
FIGS. 4A to 4C are circuit diagrams each showing a configuration example of a register.
Figure 4B:
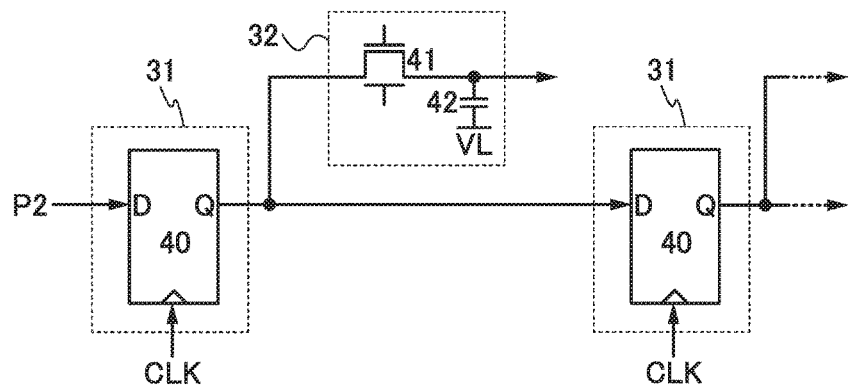
Figure 4C:
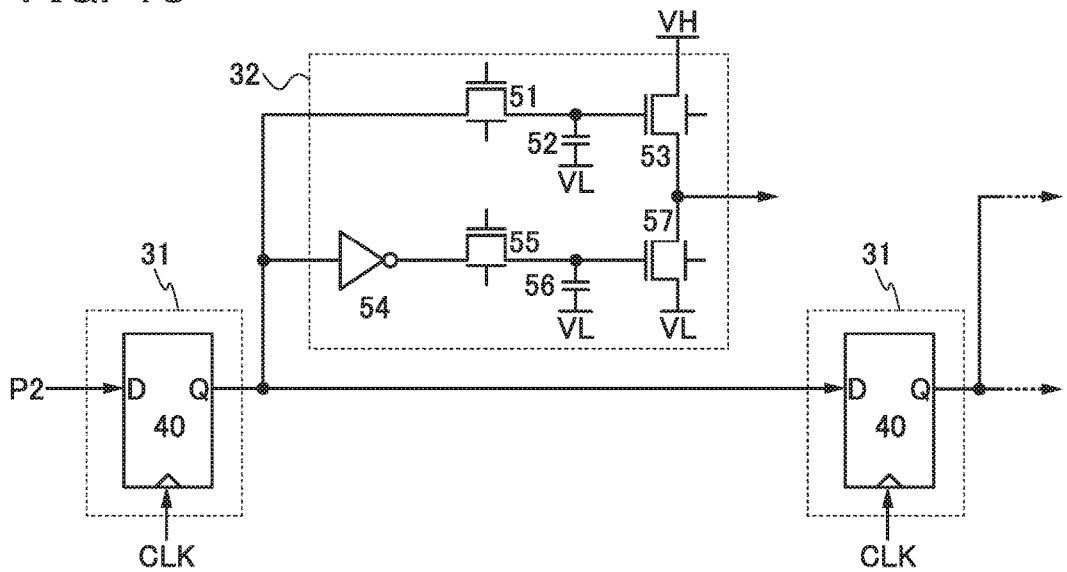

FIGS. 4A to 4C are circuit diagrams each showing configuration examples of the register 31 and the register 32, and correspond to modification examples of FIGS. 3A to 3C. FIGS. 4A and 4B are different from FIGS. 3A and 3B in that the transistor 41 includes a back gate. FIG. 4C is different from FIG. 3C in that the transistors 51, 53, 55, and 57 each include a back gate.

The threshold voltage of a transistor with a back gate can be changed. For example, the threshold voltage of the transistor increases when a negative potential is applied to the back gate, so that the off-state current of the transistor decreases. For example, the threshold voltage of the transistor decreases when a positive potential is applied to the back gate, so that the on-state current of the transistor increases. When a negative potential is applied to the back gate of the transistor in the off state and a positive potential is applied to the back gate of the transistor in the on state, the operation speed of the register 32 can be increased while the nonvolatility of the register 32 is kept.

The back gate of the transistor may be electrically connected to the gate thereof. In that case, a high potential is applied to the back gate of the transistor when a high potential is applied to the gate thereof, and a low potential is applied to the back gate of the transistor when a low potential is applied to the gate thereof. This enables the off-state current of the transistor to decrease and the on-state current to increase while the potential of the back gate is easily controlled.

A constant potential may be applied to the back gate of the transistor. In particular, a positive constant potential is preferably applied to the back gates of the transistors 53 and 57. The off-state current of a transistor is unlikely to influence the gate leakage current of the transistor. Therefore, the leakage of charge retained in the capacitor 52 can be reduced even when a positive potential is continuously applied to the back gate of the transistor 53, and the leakage of charge retained in the capacitor 56 can be reduced even when a positive potential is continuously applied to the back gate of the transistor 57. When a positive constant potential is applied to the back gates of the transistors 53 and 57, the on-state current can be increased while the back gate potential is controlled easily, resulting in increased operation speed of the register 32.

Note that some of the transistors 41, 51, 53, 55, and 57 do not necessarily include a back gate.

Figure 5:
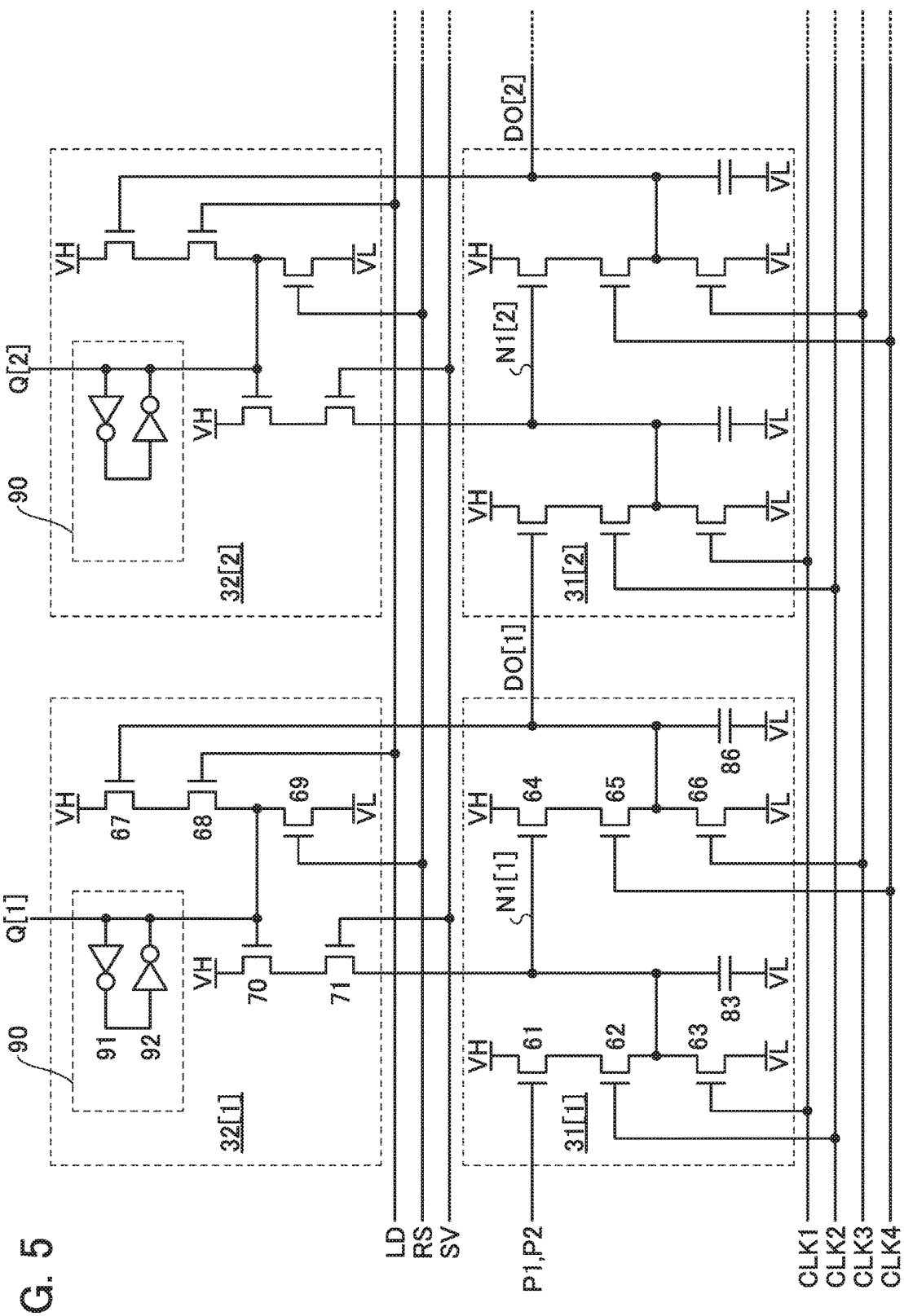
FIG. 5 is a circuit diagram showing a configuration example of a register.

In the configuration examples of the registers 31 and 32 in FIGS. 3A to 3C and FIGS. 4A to 4C, the register 32 is a nonvolatile register; in one embodiment of the present invention, the register 31 may be a nonvolatile register. FIG. 5 is a circuit diagram showing configuration examples of the register 31[1], the register 31[2], the register 32[1], and the register 32[2], where the register 31 is a nonvolatile register.

The register 31 includes a transistor 61, a transistor 62, a transistor 63, a transistor 64, a transistor 65, a transistor 66, a capacitor 83, and a capacitor 86. The transistors 61 to 66 are preferably OS transistors. The transistors 61 to 66 are preferably OS transistors with back gates.

The register 32 includes a transistor 67, a transistor 68, a transistor 69, a transistor 70, a transistor 71, and a latch circuit 90. The latch circuit 90 includes an inverter 91 and an inverter 92. For example, the transistors 67 to 71 can be OS transistors and the inverters 91 and 92 included in the latch circuit 90 can be formed with Si transistors. Alternatively, the transistors 67 to 71 and the transistors constituting the inverters 91 and 92 can be Si transistors.

A low power source potential and a high power source potential are applied to the registers 31 and 32. As the clock signal CLK illustrated in FIGS. 2A and 2B, a clock signal CLK1, a clock signal CLK2, a clock signal CLK3, and a clock signal CLK4 are supplied to the register 31. A signal LD, a signal RS, and a signal SV are supplied to the register 32. The register 31[1] receives the parameter P1 or P2 and outputs data DO[1], and the register 31[2] receives the data DO[1] and outputs data DO[2].

The register 32[1] corresponding to the register 31[1] outputs data Q[1] and the register 32[2] corresponding to the register 31[2] outputs data Q[2]. The data Q[1] and the data Q[2] are output to the image processing unit 33 or the switch unit 34.

<Operation Example>

Figure 6:
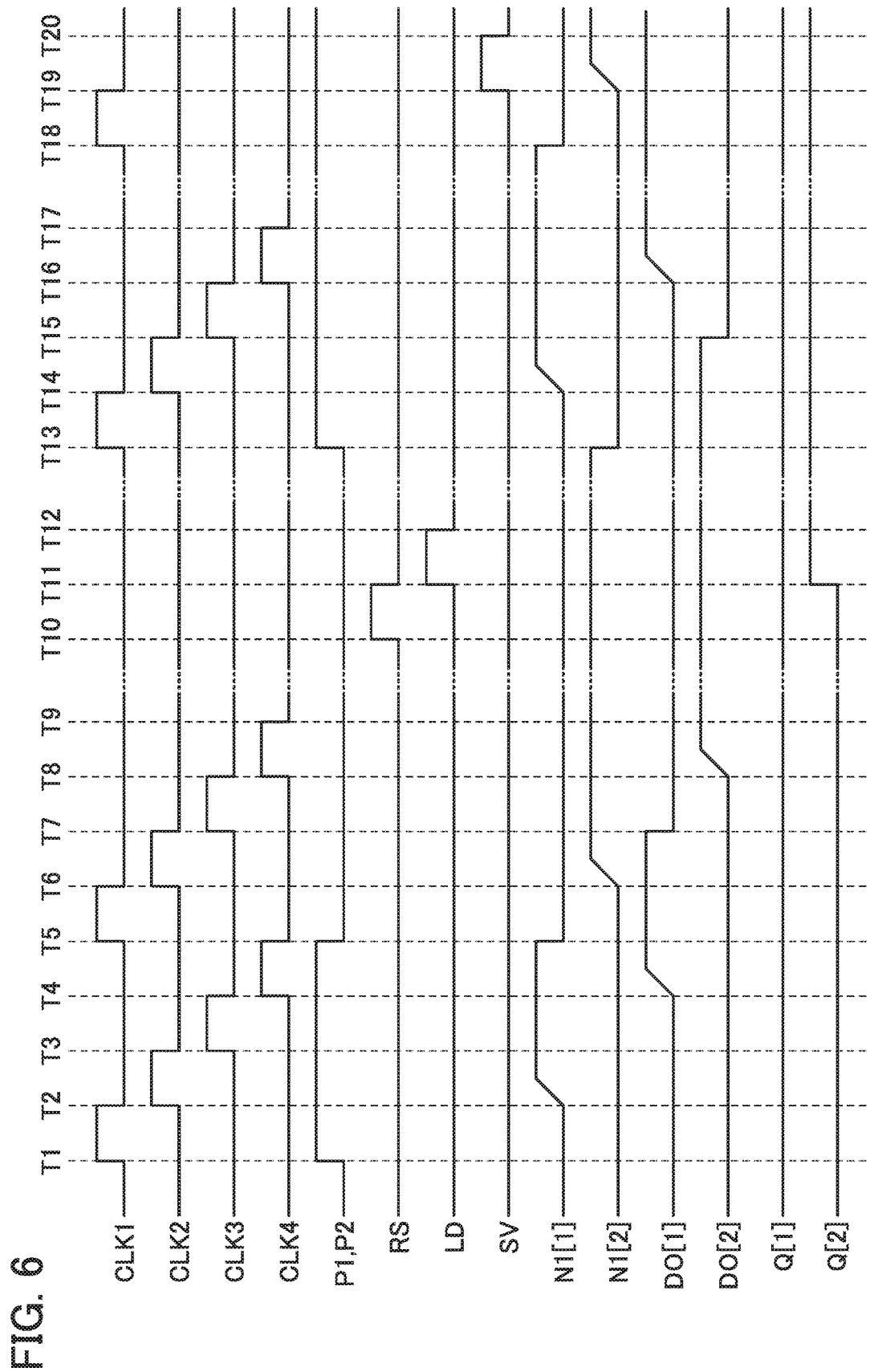
FIG. 6 is a timing chart showing an operation example of a register.

FIG. 6 is a timing chart showing an operation example of the registers 31 and 32 illustrated in FIG. 5. FIG. 6 shows potentials of the clock signals CLK1 to CLK4, the signal LD, the signal RS, the signal SV, the parameter P1 or P2, and the input and output data DO[1], DO[2], Q[1], and Q[2].

In FIG. 6, a period from a time T1 to a time T9 is a period in which data is supplied to the scan chain register unit 30A, a period from a time T10 to a time T12 is a period in which the data in the scan chain register unit 30A is loaded to the register unit 30B, a period from a time T13 to a time T17 is a period in which the data is supplied again to the scan chain register unit 30A, and a period from a time T18 to a time T20 is a period in which the data in the register unit 30B is saved to the scan chain register unit 30A. As will be described in detail later, in the case where the registers 31 and 32 have the configuration illustrated in FIG. 5, the data in the register unit 30B is preferably saved to the scan chain register unit 30A when power supply to the image processing block 22, the selector 23, and the like is interrupted.

In a period from the time T1 to the time T2, setting the clock signal CLK1 to a high potential resets a node N1[1] of the register 31[1] and a node N1[2] of the register 31[2] to a low potential. In a period from the time T2 to the time T3, setting the clock signal CLK2 to the high potential sets the node N1[1] of the register 31[1] to the high potential that is a value corresponding to the parameter P1 or P2, and the node N1[2] of the register 31[2] to the low potential that is a value corresponding to the DO[1].

In a period from the time T3 to the time T4, setting the clock signal CLK3 to the high potential resets the data DO[1] of the register 31[1] and the data DO[2] of the register 31[2] to the low potential. In a period from the time T4 to the time T5, setting the clock signal CLK4 to the high potential sets the data DO[1] of the register 31[1] to the high potential that is a value corresponding to the node N1[1], and the data DO[2] of the register 31[2] to the low potential that is a value corresponding to the node N1[2].

In a period from the time T5 to the time T6, setting the clock signal CLK1 to the high potential resets the node N1[1] of the register 31[1] and the node N1[2] of the register 31[2] to the low potential. In a period from the time T6 to the time T7, setting the clock signal CLK2 to the high potential sets the node N1[1] of the register 31[1] to the low potential that is a value corresponding to the parameter P1 or P2, and the node N1[2] of the register 31[2] to the high potential that is a value corresponding to the data DO[1].

In a period from the time T7 to the time T8, setting the clock signal CLK3 to the high potential resets the data DO[1] of the register 31[1] and the data DO[2] of the register 31[2] to the low potential. In a period from the time T8 to the time T9, setting the clock signal CLK4 to the high potential sets the data DO[1] of the register 31[1] to the low potential that is a value corresponding to the node N1[1], and the data DO[2] of the register 31[2] to the high potential that is a value corresponding to the node N1[2].

In this manner, the operation in the period from the time T1 to the time T9 sets the data DO[1] of the register 31[1] to the low potential and the data DO[2] of the register 31[2] to the high potential, so that data can be supplied to the register 31 included in the scan chain register unit 30A. The values of the data DO[1] and the data DO[2] can be changed by changing the parameter P1 or P2.

Subsequently, in a period from the time T10 to the time T11, setting the signal RS to the high potential resets the data Q[1] of the register 32[1] and the data Q[2] of the register 32[2] to the low potential. In a period from the time T11 to the time T12, setting the signal LD to the high potential sets the data Q[1] of the register 32[1] to the low potential that is a value corresponding to the data DO[1], and the data Q[2] of the register 32[2] to the high potential that is a value corresponding to the data DO[2].

The operation in the period from the time T10 to the time T12 sets the data Q[1] of the register 32[1] to the low potential and the data Q[2] of the register 32[2] to the high potential, so that the data in the scan chain register unit 30A can be loaded to the register 32 included in the register unit 30B.

Note that the capacitors 83 and 86 included in the register 31 are each connected to an OS transistor with an extremely low off-state current, and thus can retain charge for a long period even when power supply is interrupted. Even when the data in the register 32 is lost because of stopping power supply, after the restart of the power supply, the above-described operation in the period from the time T10 to the time T12 enables the data in the scan chain register unit 30A to be loaded to the register unit 30B.

Subsequently, in the period from the time T13 to the time T17, the data is supplied again to the scan chain register unit 30A. The operation is the same as that in the period from the time T1 to the time T5 and thus the description thereof is omitted here; the data DO[1] of the register 31[1] is set to the high potential and the data DO[2] of the register 31[2] is set to the low potential.

In the case where the power supply is interrupted, the data in the register unit 30B is preferably saved to the scan chain register unit 30A because the data supplied to the scan chain register unit 30A by the operation in the period from the time T13 to the time T17 is different from the data of the register 32 loaded by the operation in the period from the time T10 to the time T12 (the data Q[1] is at the low potential and the data Q[2] is at the high potential).

In a period from the time T18 to the time T19, setting the clock signal CLK1 to the high potential resets the node N1[1] of the register 31[1] and the node N1[2] of the register 31[2] to the low potential. In a period from the time T19 to the time T20, setting the signal SV to the high potential sets the node N1[1] of the register 31[1] to the low potential that is a value corresponding to the data Q[1], and the node N1[2] of the register 31[2] to the high potential that is a value corresponding to the data Q[2].

After that, sequentially setting the clock signal CLK3 and the clock signal CLK4 to the high potential sets the data DO[1] of the register 31[1] to the low potential that is a value corresponding to the node N1[1], and the data DO[2] of the register 31[2] to the high potential that is a value corresponding to the node N1[2]; the description and the diagram thereof are the same as those of the period from the time T7 to the time T9, and thus are omitted.

As described above, in the case where the power supply is interrupted while the data in the scan chain register unit 30A is updated, the data in the scan chain register unit 30A and the data in the register unit 30B do not match with each other. When the power supply is restarted, unmatched data are loaded to the register unit 30B; thus, it is preferable to save the data in the register unit 30B to the scan chain register unit 30A. Alternatively, the power supply may be interrupted after the data in the scan chain register unit 30A is updated.

<Image Processing>

Next, processing performed by the image processing unit 33 included in the image processing block 22 is described. Image processing such as gamma correction, dimming, or toning corresponds to processing of correcting image data X supplied to the image processing unit 33 and generating output image data Y. The parameter P1 that image processing unit 33 uses is a parameter for converting the image data X into the image data Y.

Figure 7A:
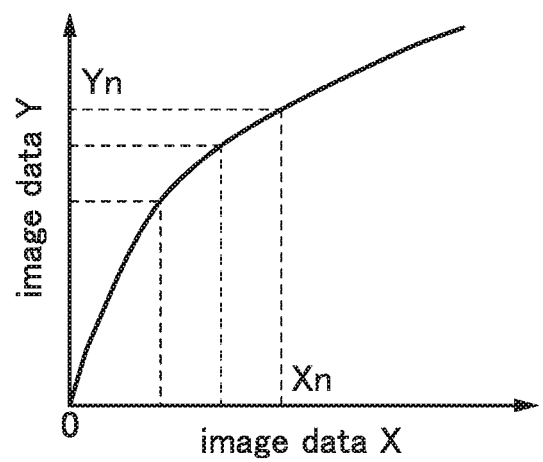
FIGS. 7A and 7B are graphs explaining a parameter.

As a parameter setting method, there are a table method and a function approximation method. In a table method shown in FIG. 7A, image data Yn with respect to image data Xn is stored in a table as a parameter. In the table method, a number of registers for storing the parameters that correspond to the table is necessary; however, correction of the image data X can be performed with high degree of freedom.

Figure 7B:
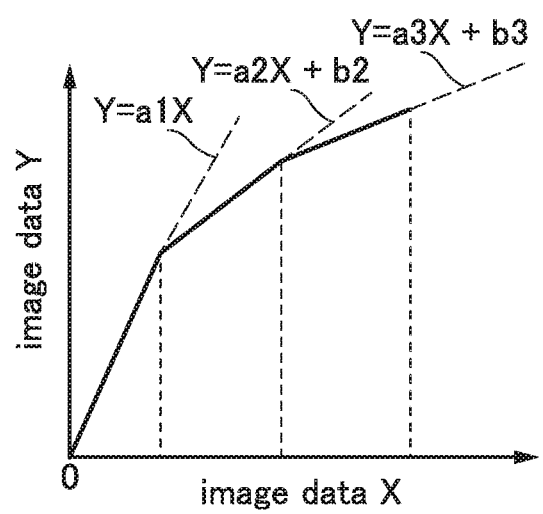

In contrast, in the case where the image data Y with respect to the image data X can be empirically determined in advance, it is effective to employ a function approximation method as shown in FIG. 7B. Note that a1, a2, b2, and the like are parameters P1. Although a method of performing linear approximation in every period is shown here, a method of performing approximation with a nonlinear function can be employed. In the function approximation method, correction of the image data X is performed with low degree of freedom; however, the number of registers for storing parameters that define a function can be small.

This embodiment can be implemented in appropriate combination with any of the structures described in the other embodiments.

Embodiment 2

In this embodiment, specific configuration examples of the imaging circuit 11 will be described with reference to drawings.

<Imaging Circuit>

Figure 8:
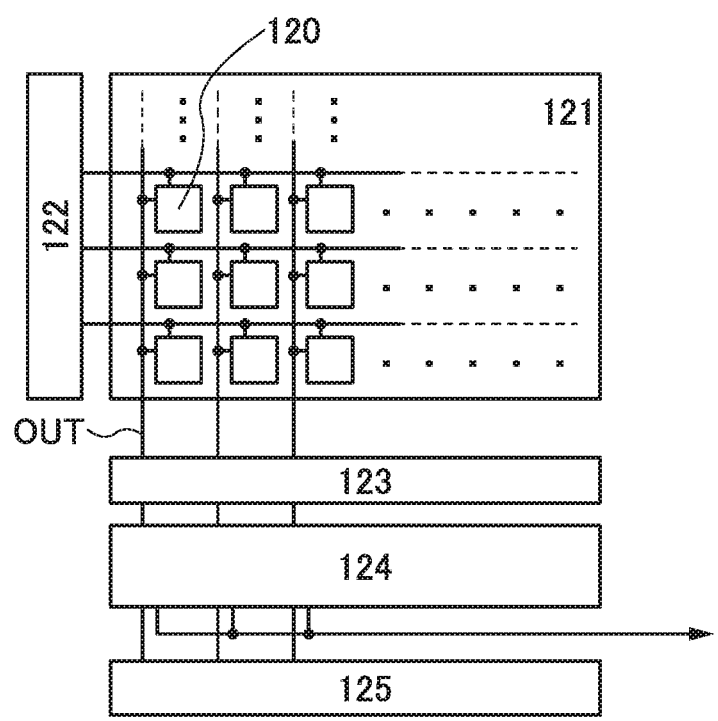
FIG. 8 is a block diagram showing a configuration example of an imaging circuit.

FIG. 8 is a block diagram showing a configuration example of the imaging circuit 11. The imaging circuit 11 includes a pixel array 121 including pixels 120 arranged in a matrix, a gate driver 122 having a function of selecting a row of the pixel array 121, a CDS circuit 123 for performing correlated double sampling (CDS) on a signal output from the pixel 120, an A/D converter circuit 124 having a function of converting analog data output from the CDS circuit 123 into digital data, and a source driver 125 having a function of selecting and reading data converted in the A/D converter circuit 124. The pixel 120 outputs a signal OUT with a potential corresponding to obtained image data. Note that the CDS circuit 123 can be omitted.

<Pixel Circuit>

Figure 9:
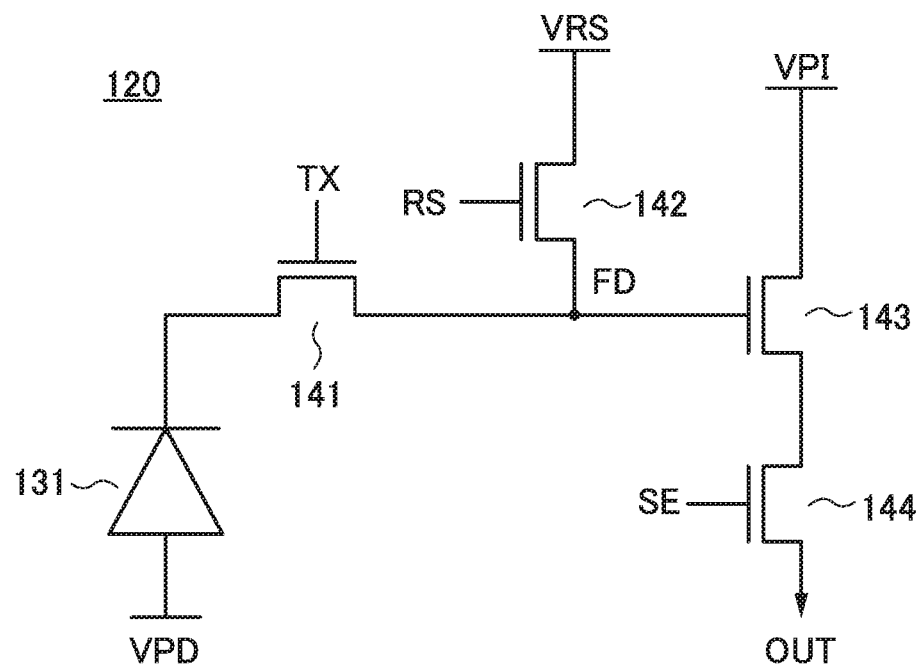
FIG. 9 illustrates a pixel circuit.

FIG. 9 is a circuit diagram of the pixel 120. The pixel 120 includes a photoelectric conversion element 131 and transistors 141 to 144. One electrode of the photoelectric conversion element 131 is electrically connected to one of a source and a drain of the transistor 141. The other of the source and the drain of the transistor 141 is electrically connected to one of a source and a drain of the transistor 142. The other of the source and the drain of the transistor 141 is electrically connected to a gate of the transistor 143. One of a source and a drain of the transistor 143 is electrically connected to one of a source and a drain of the transistor 144.

Here, a node FD where the other of the source and the drain of the transistor 141, the one of the source and the drain of the transistor 142, and the gate of the transistor 143 are connected is a charge accumulation portion.

A potential VPD can be applied to the other electrode of the photoelectric conversion element 131. A potential VRS can be applied to the other of the source and the drain of the transistor 142. A potential VPI can be applied to the other of the source and the drain of the transistor 143. A signal OUT can be output from the other of the source and the drain of the transistor 144.

The potential VPD can be, for example, a low power source potential. The potential VRS and the potential VPI can each be, for example, a high power source potential.

A signal TX can be supplied to a gate of the transistor 141. A signal RS can be supplied to a gate of the transistor 142. A signal SE can be supplied to a gate of the transistor 144.

The transistor 141 has a function of transferring the potential of the one electrode of the photoelectric conversion element 131 to the node FD. The transistor 142 has a function of resetting the potential of the node FD. The transistor 143 has a function of outputting a signal corresponding to the potential of the node FD. The transistor 144 has a function of selecting the pixel 120.

Note that the above configuration of the pixel 120 is just an example, and does not include some of the circuits, the transistors, the capacitor, or the like in some cases. Alternatively, a circuit, a transistor, a capacitor, or the like that is not included in the above configuration may be included; or some of the power source potentials may be different from those described above.

OS transistors can be used as the transistors 141 and 142. An OS transistor has a lower off-state current than a Si transistor as described above. That is, when OS transistors are used as the transistors 141 and 142, charge accumulated in the node FD can be retained for a long period. Thus, a global shutter system in which charge accumulation operation is performed in all the pixels at the same time can be used without a complicated circuit configuration or a complicated operation method.

Note that OS transistors may be used as the transistors 143 and 144. The use of OS transistors as the transistors 141 to 144 and further for all the driver circuits and the like included in the imaging device 10, enables the manufacturing process of Si transistor to be omitted, resulting in simplification of the fabrication process of the imaging device 10.

Figure 10A:
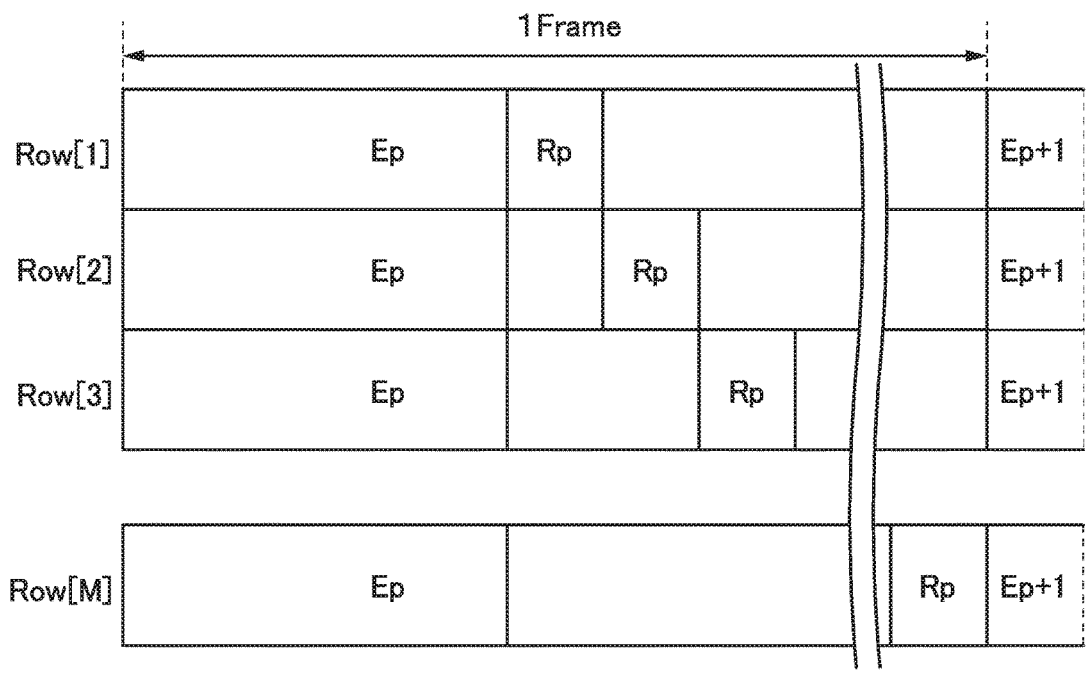
FIGS. 10A and 10B illustrate operation with a global shutter method and operation with a rolling shutter method, respectively.
Figure 10B:
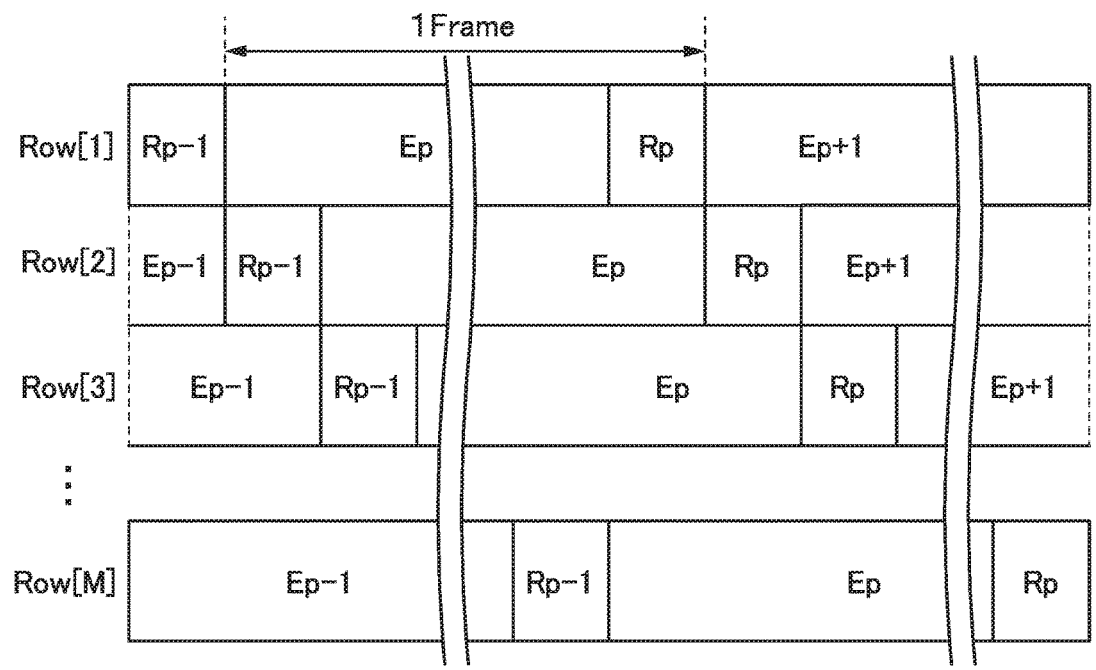

FIGS. 10A and 10B schematically show the operation with a global shutter method and the operation with a rolling shutter method, respectively. In FIGS. 10A and 10B, "E" represents a period in which light exposure operation can be performed, and "R" represents a period in which reading operation can be performed. Moreover, p represents a given p-th frame (p is an integer of 2 or more); (p−1) represents a frame previous to the p-th frame; and (p+1) represents a frame following the p-th frame. Pixels are assumed to be arranged in a matrix as illustrated in FIG. 8. Furthermore, Row[1] represents a pixel in a first row, and Row[M] represents a pixel in an M-th row (last row).

FIG. 10A is a schematic view illustrating the operation with the global shutter method. In the global shutter method, light exposure is simultaneously performed on all pixels, and then data reading is performed row by row. Thus, an image without distortion is obtained even when a moving object is captured.

FIG. 10B is a schematic view illustrating the operation with the rolling shutter method. In the rolling shutter method, light exposure and data reading are sequentially performed row by row. Since imaging cannot be simultaneously performed on all pixels, distortion is caused in an image of a moving object.

Note that the rolling shutter method may be employed in the imaging circuit 11.

The OS transistor has lower temperature dependence of change in electrical characteristics than the Si transistor, and thus can be used in an extremely wide range of temperatures. Therefore, OS transistors are preferably used for a semiconductor device such as a sensor used in automobiles and the like.

Figure 11A:
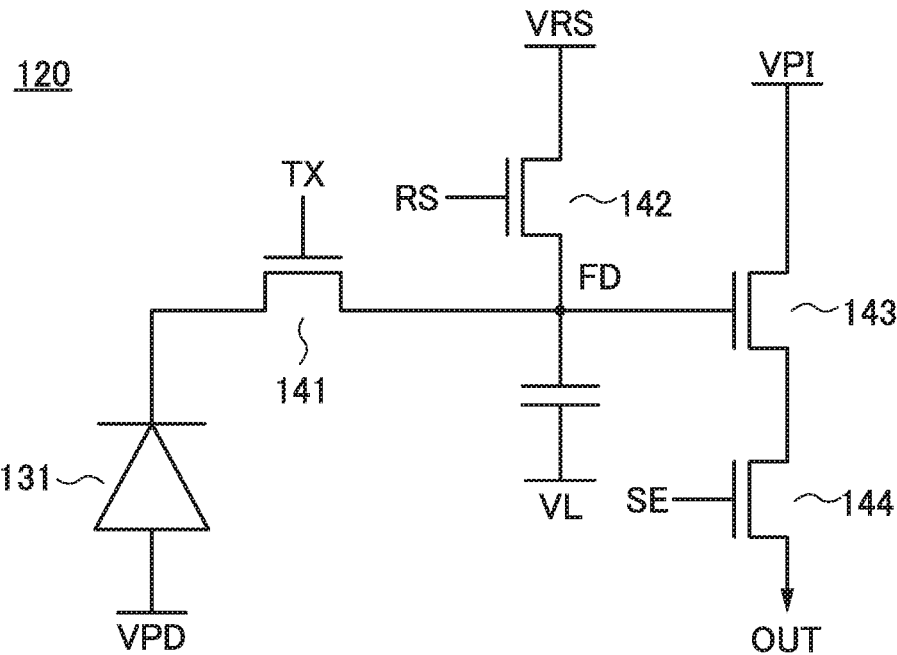
FIGS. 11A and 11B illustrate configuration examples of a pixel circuit.
Figure 11B:
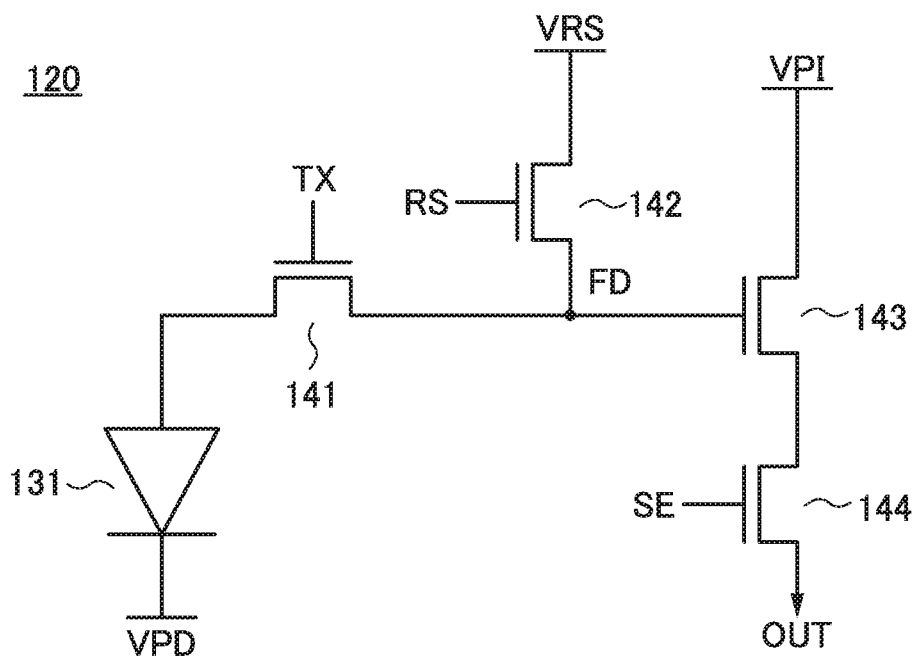

Note that the pixel 120 may have a configuration in which a capacitor is connected to the node FD as illustrated in FIG. 11A. As illustrated in FIG. 11B, the direction of the photoelectric conversion element 131 in the pixel 120 may be opposite to that in FIG. 9.

Figure 12A:
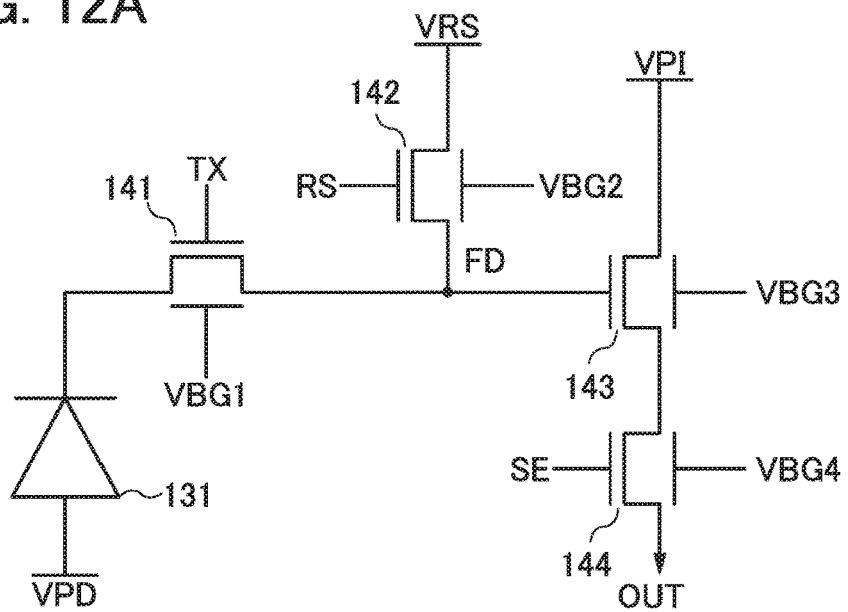
FIGS. 12A to 12C illustrate configuration examples of a pixel circuit.

The transistors 141 to 144 in the pixel 120 may each have a back gate as illustrated in FIG. 12A. With this configuration, the threshold voltages of the transistors 141 to 144 can be controlled.

Different potentials can be applied to the back gates. For example, a potential VBG1, a potential VBG2, a potential VBG3, and a potential VBG4 can be applied to the back gate of the transistor 141, the back gate of the transistor 142, the back gate of the transistor 143, and the back gate of the transistor 144, respectively.

Figure 12B:
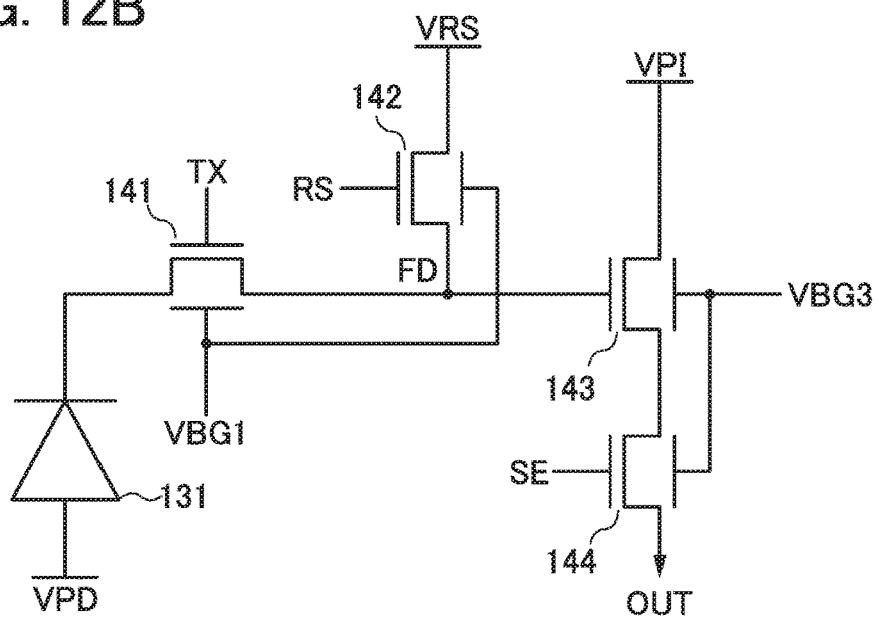

As illustrated in FIG. 12B, a wiring connected to the back gate of the transistor 141 may be electrically connected to a wiring connected to the back gate of the transistor 142. Furthermore, a wiring connected to the back gate of the transistor 143 may be electrically connected to a wiring connected to the back gate of the transistor 144. In that case, for example, the potential VBG1 can be applied to the back gates of the transistors 141 and 142, and the potential VBG3 can be applied to the back gates of the transistors 143 and 144.

As described above, the threshold voltage of an n-channel transistor increases when a negative potential is applied to a back gate. In contrast, the threshold voltage decreases when a positive potential is applied to a back gate. Therefore, in the case where the on/off state of the transistor is controlled by a predetermined gate voltage, the off-state current can be reduced when a negative potential is applied to a back gate and the on-state current can be increased when a positive potential is applied to a back gate.

As described above, transistors with a high on-state current are preferably used as the transistors 143 and 144. The on-state current can be further increased when a positive potential is applied to the back gates of the transistors 143 and 144. Thus, the potential of the signal OUT can be determined quickly, that is, the imaging device 10 can operate at high frequency and high speed.

Figure 12C:
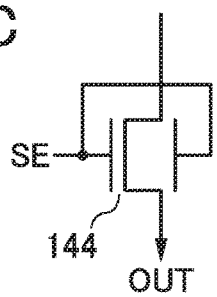

Note that the gate and the back gate of the transistor 144 may be electrically connected as illustrated in FIG. 12C. In other words, the same potential may be applied to the gate and the back gate.

Besides power source potentials, a plurality of potentials such as a signal potential and a potential applied to the back gate are used inside an imaging device. Supply of a plurality of potentials from the outside of the imaging device increases the number of terminals and the like; thus, the imaging device preferably has a power source circuit generating a plurality of potentials inside the imaging device.

<Operation Example of Pixel Circuit>

Figure 13:
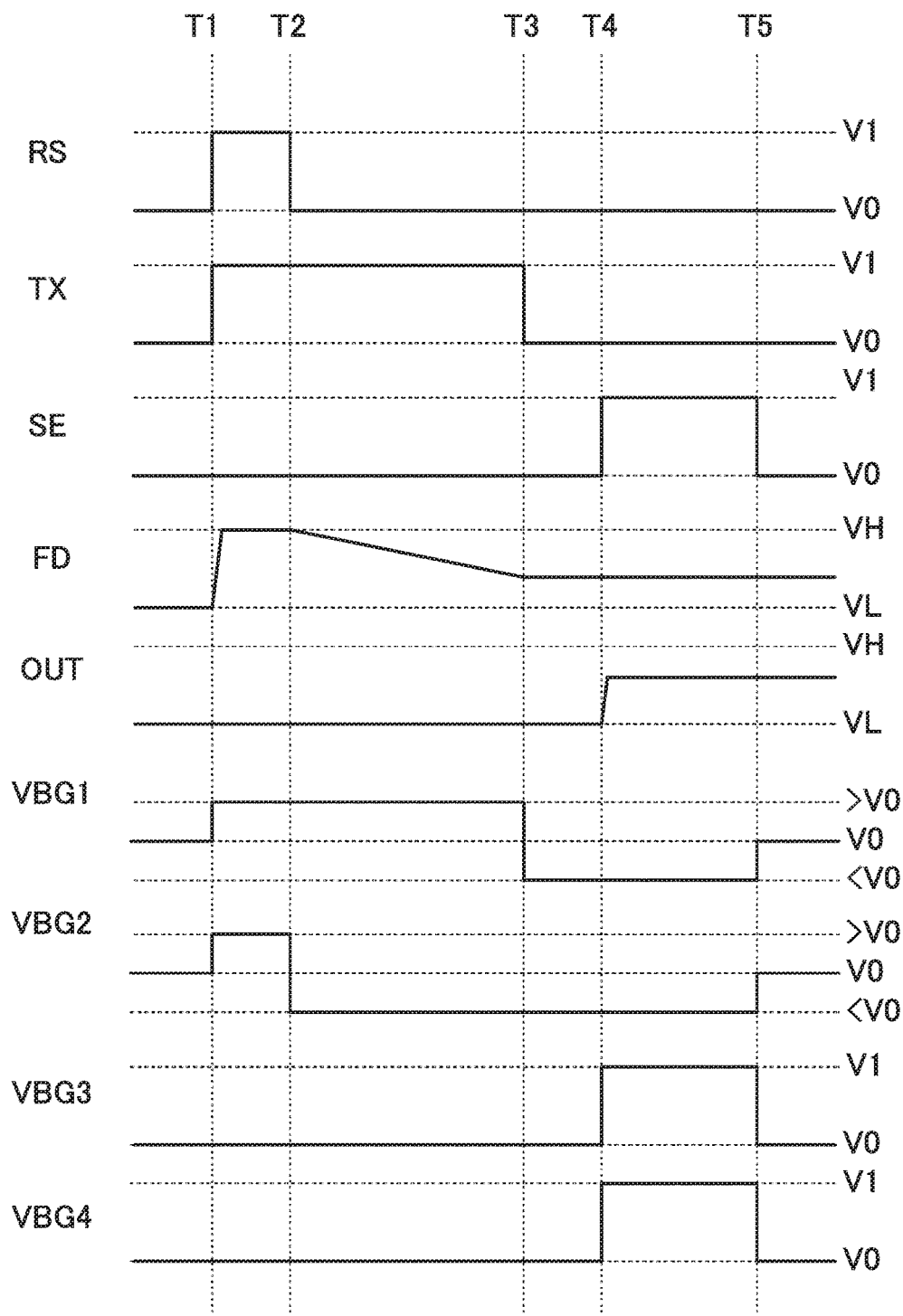
FIG. 13 illustrates an operation example of a pixel circuit.

The operation of the pixel circuit in FIG. 12A is described using a timing chart in FIG. 13. In the timing chart, "V1" is a potential higher than a reference potential, and can be, for example, a high power source potential (VH). "V0" is a reference potential (source potential) and can be, for example, a low power source potential (VL).

First, the potentials of the signal RS and the signal TX are set to V1 at a time T1, so that the transistors 141 and 142 are turned on and the node FD is reset to a reset potential (e.g., VH) (reset operation). At this time, the on-state current of the transistors 141 and 142 is increased when the potentials VBG1 and VBG2 are set to potentials higher than V0 (>V0), allowing the reset operation to be performed immediately.

The potential of the signal RS is set to V0 at a time T2, so that the transistor 142 is turned off and the reset operation is terminated to start accumulation operation. When the potential VBG2 is set to a potential lower than V0 at this time, the off-state current of the transistor 142 can be reduced and supply of charge to the node FD by leakage current can be prevented. Alternatively, the potential VBG1 may be set to V0 at the time T2.

When the potential of the signal TX is set to V0 at a time T3, the transistor 141 is turned off and the potential of the node FD is defined and held (holding operation). When the potential of the signal VBG1 is set to a potential lower than V0 (<V0) at this time, the off-state current of the transistor 141 can be reduced and leakage of charge from the node FD by leakage current can be prevented.

When the potential of the signal SE is set to V1 at a time T4, the transistor 144 is turned on and the potential of the signal OUT changes depending on a current flowing through the transistor 143 (reading operation). At this time, the on-state current of the transistors 143 and 144 is increased when the potentials VBG3 and VBG4 are set to potentials higher than V0 (>V0), allowing the potential of the signal OUT to be determined immediately.

The transistor 144 is turned off when the potential of the signal SE is set to V0 at a time T5, so that the reading operation is completed. Note that the potentials of the signals VBG1 and VBG2 are preferably held lower than V0 (<V0) so that the potential of the node FD does not change until the reading operation is completed. In the above description, the potential of the signal VBG2 may be changed at the same time as the potential of the signal VBG1.

Through the above steps, a signal based on the potential of the node FD can be read. Note that the pixel 120 in FIG. 9 may be operated without controlling the potentials VBG1 to VBG4 in the timing chart in FIG. 13. The pixel 120 in FIG. 12B may be operated without controlling the potentials VBG2 and VBG4 in the timing chart in FIG. 13.

<Pixel Circuit Sharing Transistor>

Figure 14A:
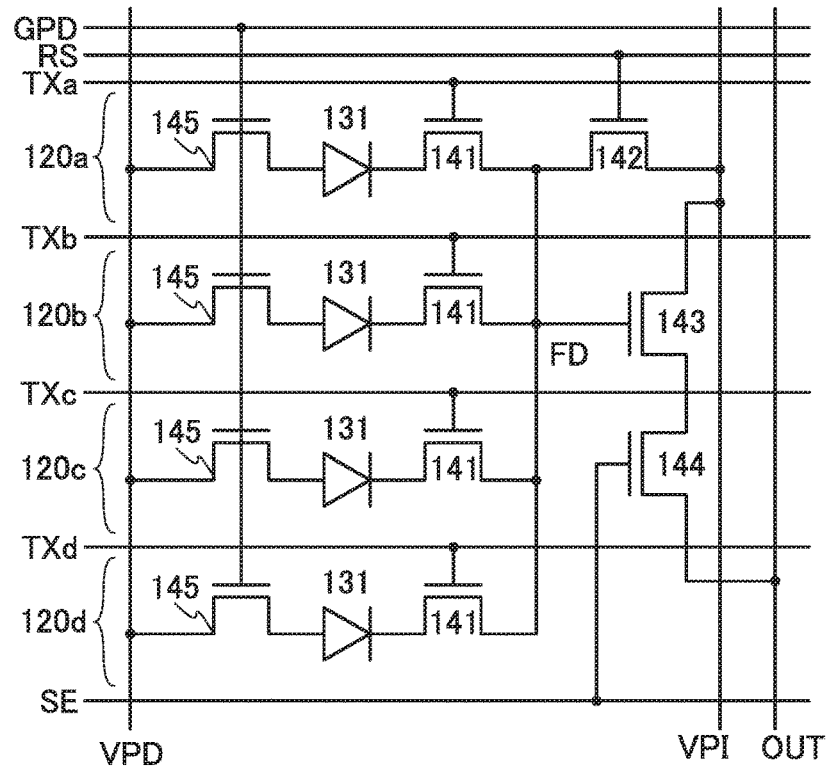
FIGS. 14A and 14B illustrate configuration examples of a pixel circuit.
Figure 14B:
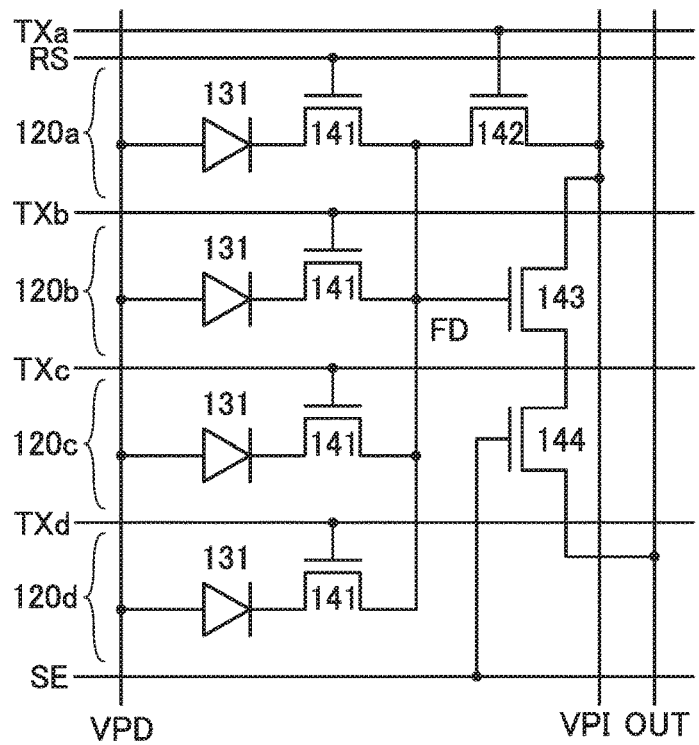

In a pixel circuit of one embodiment of the present invention, transistors may be shared among a plurality of pixels as illustrated in FIGS. 14A and 14B.

FIG. 14A illustrates pixels that share transistors: pixels 120a to 120d each include the photoelectric conversion element 131, the transistor 141, and a transistor 145 and share the transistors 142 to 144. The operation of the transistor 141 included in each of the pixels 120a to 120d is controlled by signals TXa to TXd. The operation of the transistor 145 is controlled by a signal GPD. One of a source and a drain of the transistor 145 is electrically connected to a cathode of the photoelectric conversion element 131, whereby a potential can be held in the cathode of the photoelectric conversion element 131. This configuration is suitable for imaging using a global shutter system, in which reset operation, accumulation operation, and holding operation are sequentially performed in all the pixels at the same time and reading operation is performed by each pixel. Note that in the case where the one of the source and the drain of the transistor 145 is electrically connected to the anode of the photoelectric conversion element 131, the potential can be held in the anode of the photoelectric conversion element 131.

FIG. 14B illustrates pixels that share transistors: the pixels 120a to 120d each include the photoelectric conversion element 131 and the transistor 141, and share the transistors 142 to 144. That is, the pixel in FIG. 14B is different from the pixel in FIG. 14A in that the transistor 145 is not provided.

In the configuration illustrated in FIG. 14B, reset operation, accumulation operation, holding operation, and reading operation can be sequentially performed by each pixel. This configuration is mainly suitable for imaging using a rolling shutter system. In addition, the number of transistors in each pixel can be reduced because the transistor 145 is not provided, reducing the area occupied by each pixel.

In FIGS. 14A and 14B, the transistors are shared among the four pixels 120a, 120b, 120c, and 120d; alternatively, they may be shared among two pixels, three pixel, or five or more pixels.

<Structure Example of Pixel>

FIG. 15 shows a specific structure example of the pixel 120 and is a cross-sectional view in the channel length direction of the transistors 141 to 144 included in the pixel circuit.

Although wirings, electrodes, metal layers, and contact plugs (conductors 182) are shown as independent components in cross-sectional views in this embodiment, some of them are provided as one component in some cases when they are electrically connected to each other. In addition, a structure in which components such as wirings, electrodes, and metal layers are connected to each other through the conductors 182 is only an example, and the components may be directly connected to each other not through the conductor 182.

Insulating layers 181a to 181k and the like that function as protective films, interlayer insulating films, or planarization films are provided over a substrate and components such as transistors. For example, an inorganic insulating film such as a silicon oxide film or a silicon oxynitride film can be used as the insulating layers 181a to 181k. Alternatively, an organic insulating film such as an acrylic resin film or a polyimide resin film may be used. Top surfaces of the insulating layers 181a to 181k and the like may be subjected to planarization treatment as necessary by chemical mechanical polishing (CMP) or the like.

In some cases, some of the wirings, the transistors, and the like illustrated in the drawing are not provided, or a wiring, a transistor, or the like that is not illustrated in the drawing is included in each layer.

The pixel 120 can include a layer 1100 and a layer 1200.

The layer 1100 can include the photoelectric conversion element 131. A photodiode with two terminals can be used for the photoelectric conversion element 131, for example. The photodiode can be a PN photodiode using a single crystal silicon substrate, a PIN photodiode using an amorphous silicon thin film, a microcrystalline silicon thin film, or a polycrystalline silicon thin film, a photodiode using selenium, a selenium compound, or an organic compound, or the like.

In FIG. 15, the photoelectric conversion element 131 included in the layer 1100 is a PN photodiode using a single crystal silicon substrate. The photoelectric conversion element 131 can include a p$^+$ region 620, a p$^-$ region 630, an n-type region 640, and a p$^+$ region 650.

The layer 1200 can include OS transistors that constitute the pixel circuit; FIG. 15 illustrates the transistors 141 to 144 included in the pixel circuit. The photoelectric conversion element 131 can overlap with the transistors as shown in the drawing, which increases the area where the photoelectric conversion element 131 receives light.

An insulating layer 180 is provided between a region including OS transistors and a region including Si devices (e.g., Si transistors or Si photodiodes).

An insulating layer provided near a Si device preferably contains hydrogen to terminate dangling bonds of silicon. Meanwhile, hydrogen in an insulating layer provided near an oxide semiconductor layer that is the active layer of the transistors 141, 142, and the like causes carriers to be generated in the oxide semiconductor layer. Thus, the hydrogen might reduce the reliability of the transistors 141, 142, and the like. For this reason, the insulating layer 180 that has a function of preventing diffusion of hydrogen is preferably provided between one layer including the Si device and another layer that includes the OS transistors and is stacked over the one layer. Diffusion of hydrogen can be prevented by the insulating layer 180; thus, the reliability of both the Si device and the OS transistors can be improved.

The insulating layer 180 can be formed using aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like.

One electrode (the n-type region 640) of the photoelectric conversion element 131 can be electrically connected to the transistor 141 through two conductors 182 and a wiring 169, for example.

Here, the conductor 182 is provided to penetrate the insulating layer 180; hence, the conductor 182 also preferably has a function of preventing diffusion of hydrogen. For example, the conductor 182 has the following structure illustrated in FIG. 15: a conductor 182b with a barrier property against hydrogen is provided at least on the outer side in contact with a sidewall of an opening, and a conductor 182a with low resistance is provided on the inner side. For instance, tungsten can be used for the conductor 182a, and tantalum nitride or the like can be used for the conductor 182b. When a layer containing impurities such as hydrogen is not in contact with the conductor 182, the conductor 182 may be formed only of the conductor 182a or 182b.

In FIG. 15, top-gate OS transistors are provided in the layer 1200. For example, each of the OS transistors is provided over a stack of insulating layers (the insulating layers 181a, 180, and 181b) formed over the layer 1100, and includes an oxide semiconductor layer 230, conductive layers 240 and 250 serving as a source electrode and a drain electrode, an insulating layer 260 serving as a gate insulating layer, and a conductive layer 270 serving as a gate electrode. Note that the insulating layer 181b can also function as a gate insulating layer.

The conductive layer 270 included in the transistor 141 is electrically connected to a wiring 161 through the conductor 182. The conductive layer 270 included in the transistor 142 is electrically connected to a wiring 162 through the conductor 182. The conductive layer 270 included in the transistor 144 is electrically connected to a wiring 163 through the conductor 182. The conductive layer 250 included in the transistor 144 is electrically connected to a wiring 191 through the conductor 182.

The signal TX can be supplied to the wiring 161. The signal RS can be supplied to the wiring 162. The signal SE can be supplied to the wiring 163. The signal OUT can be output from the wiring 191.

The p$^+$ region 620 included in the photoelectric conversion element 131 is electrically connected to a wiring 171 through the p+region 650 and the conductor 182. The conductive layer 250 included in the transistor 142 is electrically connected to a wiring 172 through the conductor 182. The conductive layer 240 included in the transistor 143 is electrically connected to a wiring 173 through the conductor 182.

The potential VPD can be applied to the wiring 171. The potential VRS can be applied to the wiring 172. The potential VPI can be applied to the wiring 173.

FIG. 15 exemplifies a structure where the OS transistors are each provided with a conductive layer 273 serving as a back gate electrode. In the structure of FIG. 15, back gate electrodes that double as light-blocking layers are preferably provided because light that passes through the layer 1100 might change the electrical characteristics of the transistors. Moreover, providing the back gates enables control of the threshold voltages and the like of the OS transistors.

Figure 16:
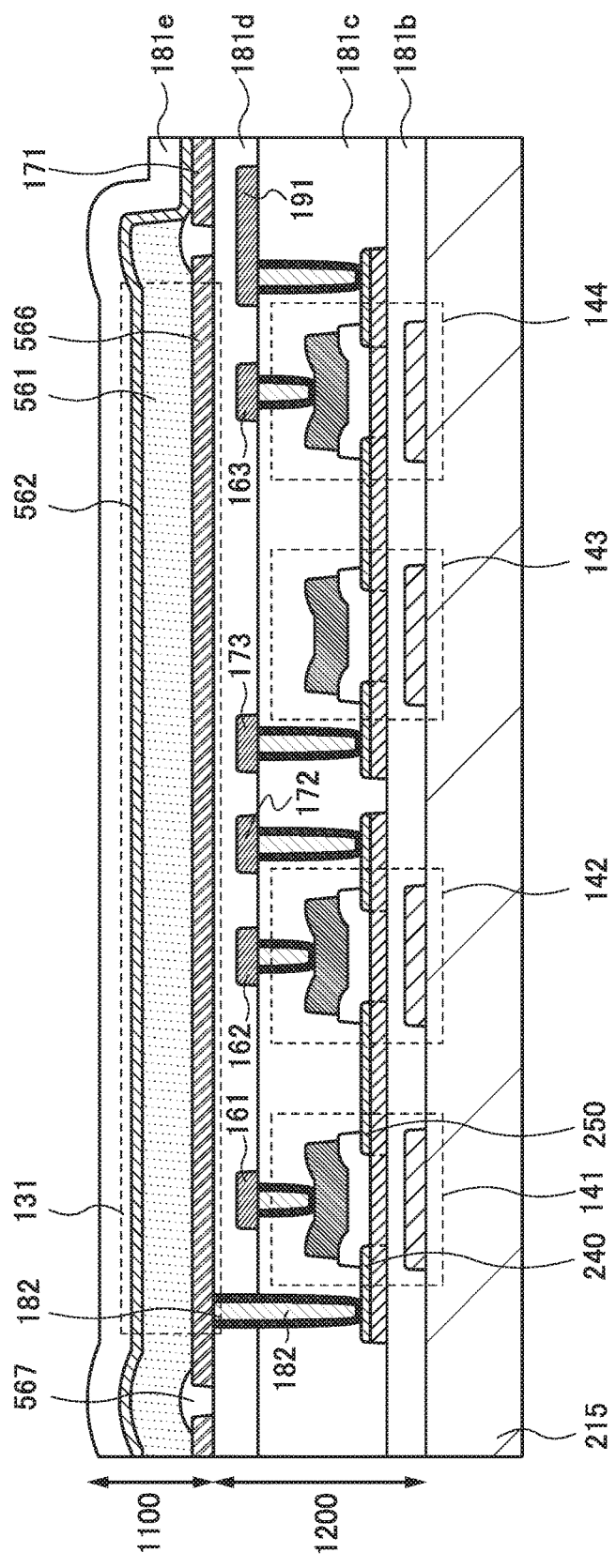
FIG. 16 is a cross-sectional view showing a structure example of an imaging device.

The pixel 120 can also employ a stacked structure illustrated in FIG. 16. In the pixel 120 in FIG. 16, the layer 1200 and the layer 1100 are provided over a substrate 215. The photoelectric conversion element 131 is provided over the OS transistors, which facilitates electrical connection between the OS transistors and one electrode of the photoelectric conversion element 131.

In FIG. 16, a selenium-based material is used for a photoelectric conversion layer 561. The photoelectric conversion element 131 containing a selenium-based material has high external quantum efficiency with respect to visible light. Furthermore, a selenium-based material has a high light-absorption coefficient, making the photoelectric conversion layer 561 thin easily. The photoelectric conversion element 131 containing a selenium-based material can be a highly sensitive sensor with a large amount of amplification because of avalanche multiplication. In other words, the use of a selenium-based material for the photoelectric conversion layer 561 allows a sufficient amount of photocurrent to be obtained even when the pixel area is reduced. Thus, the photoelectric conversion element 131 containing a selenium-based material is also suitable for imaging in a low-illuminance environment.

As a selenium-based material, amorphous selenium or crystalline selenium can be used. Crystalline selenium can be obtained, for example, by depositing amorphous selenium and then performing heat treatment. When the crystal grain size of crystalline selenium is smaller than a pixel pitch, variations in characteristics between pixels can be reduced. Moreover, crystalline selenium has higher spectral sensitivity and light-absorption coefficient for visible light than amorphous selenium.

Figure 17A:
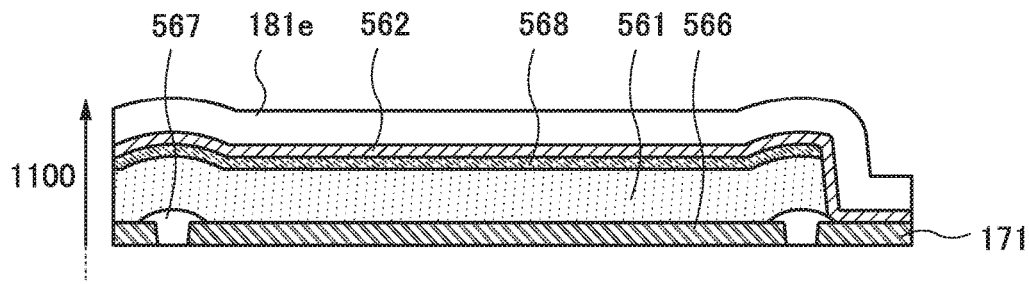
FIGS. 17A to 17E are cross-sectional views showing connection examples of a photoelectric conversion element.
Figure 17B:
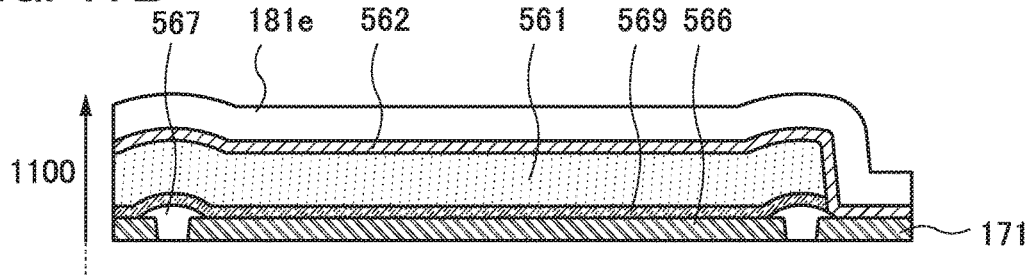
Figure 17C:
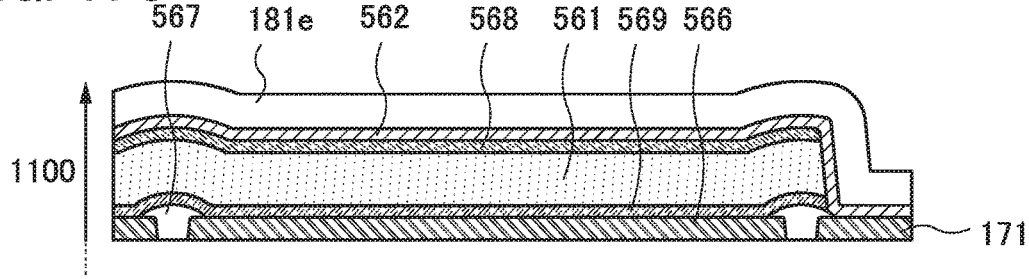

Although the photoelectric conversion layer 561 is a single layer in FIG. 16, a layer of gallium oxide, cerium oxide, In—Ga—Zn oxide, or the like may be provided as a hole-injection blocking layer 568 on a light-receiving surface side as illustrated in FIG. 17A. Alternatively, as illustrated in FIG. 17B, a layer of nickel oxide, antimony sulfide, or the like may be provided as an electron-injection blocking layer 569 on an electrode 566 side. Further alternatively, the hole-injection blocking layer 568 and the electron-injection blocking layer 569 may be provided as illustrated in FIG. 17C.

The photoelectric conversion layer 561 may be a layer containing a compound of copper, indium, and selenium (CIS); or a layer containing a compound of copper, indium, gallium, and selenium (CIGS). The use of CIS or CIGS makes it possible to form a photoelectric conversion element that utilizes avalanche multiplication as in the case of using a single layer of selenium.

In the photoelectric conversion element 131 using a selenium-based material, for example, the photoelectric conversion layer 561 can be provided between a light-transmitting conductive layer 562 and the electrode 566 formed using a metal material or the like. Furthermore, CIS and CIGS are p-type semiconductors, and an n-type semiconductor such as cadmium sulfide or zinc sulfide may be provided in contact with the p-type semiconductor in order to form a junction.

Figure 17D:
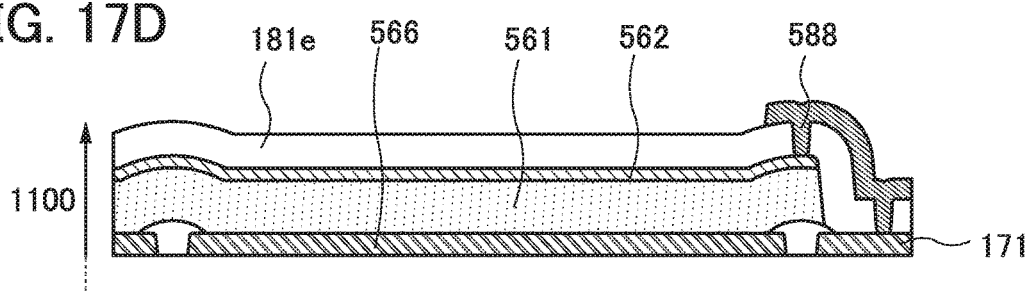
Figure 17E:
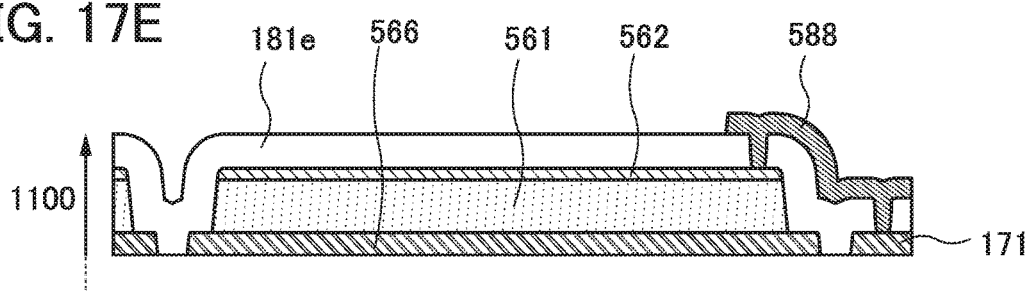
Figure 18A:
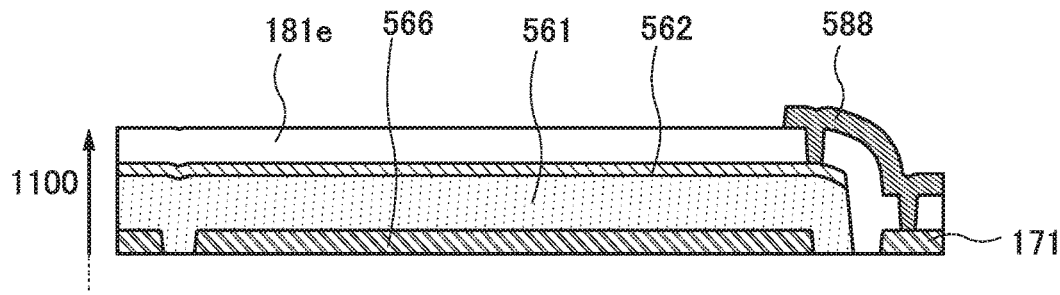
FIGS. 18A to 18D are cross-sectional views showing connection examples of a photoelectric conversion element.
Figure 18B:
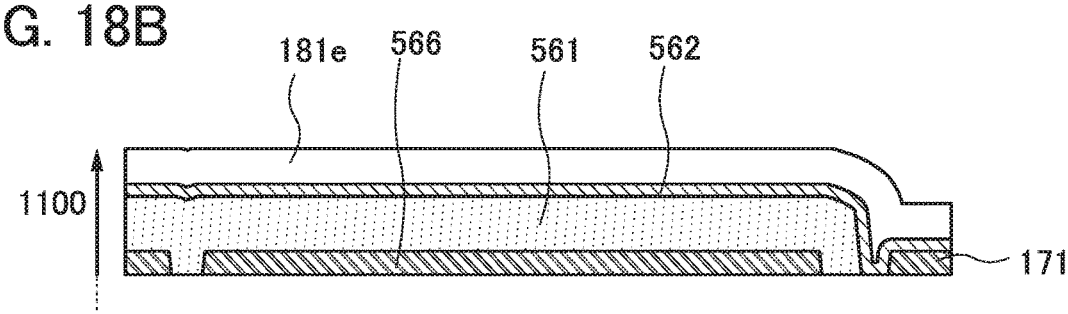

Although the light-transmitting conductive layer 562 is directly in contact with a wiring 171 in FIG. 16, they may be in contact with each other through a wiring 588 as illustrated in FIG. 17D. Although the photoelectric conversion layer 561 and the light-transmitting conductive layer 562 are not divided between pixel circuits in FIG. 16, they may be divided between pixel circuits as illustrated in FIG. 17E. In a region between pixels where the electrode 566 is not provided, a partition wall 567 formed of an insulator is preferably provided, thereby preventing generation of a crack in the photoelectric conversion layer 561 and the light-transmitting conductive layer 562. However, the partition wall 567 is not necessarily provided as illustrated in FIGS. 18A and 18B.

Figure 18C:
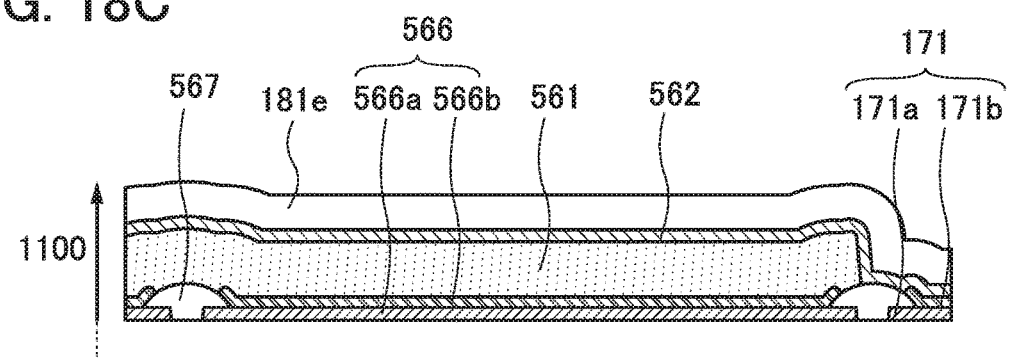

The electrode 566, the wiring 171, and the like may be a multilayer. For example, as illustrated in FIG. 18C, the electrode 566 can include two conductive layers 566a and 566b and the wiring 171 can include two conductive layers 171a and 171b. In the structure in FIG. 18C, it is preferred that, for example, the conductive layers 566a and 171a be made of a low-resistance metal or the like, and the conductive layers 566b and 171b be made of a metal or the like that exhibits an excellent contact property with the photoelectric conversion layer 561. Such a structure improves the electrical properties of the photoelectric conversion element 131. Note that some kinds of metal may cause electrochemical corrosion by being in contact with the light-transmitting conductive layer 562; even when such a metal is used for the conductive layer 171a, electrochemical corrosion can be prevented by the conductive layer 171b.

The conductive layers 566b and 171b can be formed using molybdenum or tungsten, for example. The conductive layers 566a and 171a can be formed using, for example, aluminum, titanium, or a stack of titanium, aluminum, and titanium that are stacked in this order.

Figure 18D:
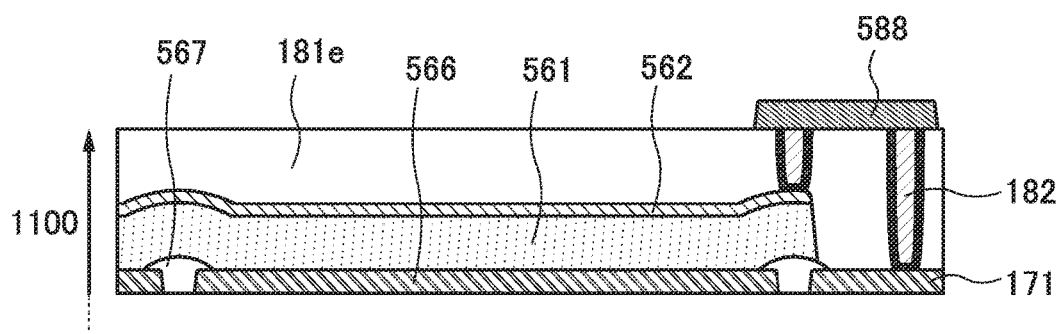

As illustrated in FIG. 18D, the light-transmitting conductive layer 562 may be connected to the wiring 171 through the conductor 182 and the wiring 588.

The partition wall 567 can be formed using an inorganic insulator, an insulating organic resin, or the like. The partition wall 567 may be colored black or the like in order to shield the transistors and the like from light and/or to determine the area of a light-receiving portion in each pixel.

Figure 19:
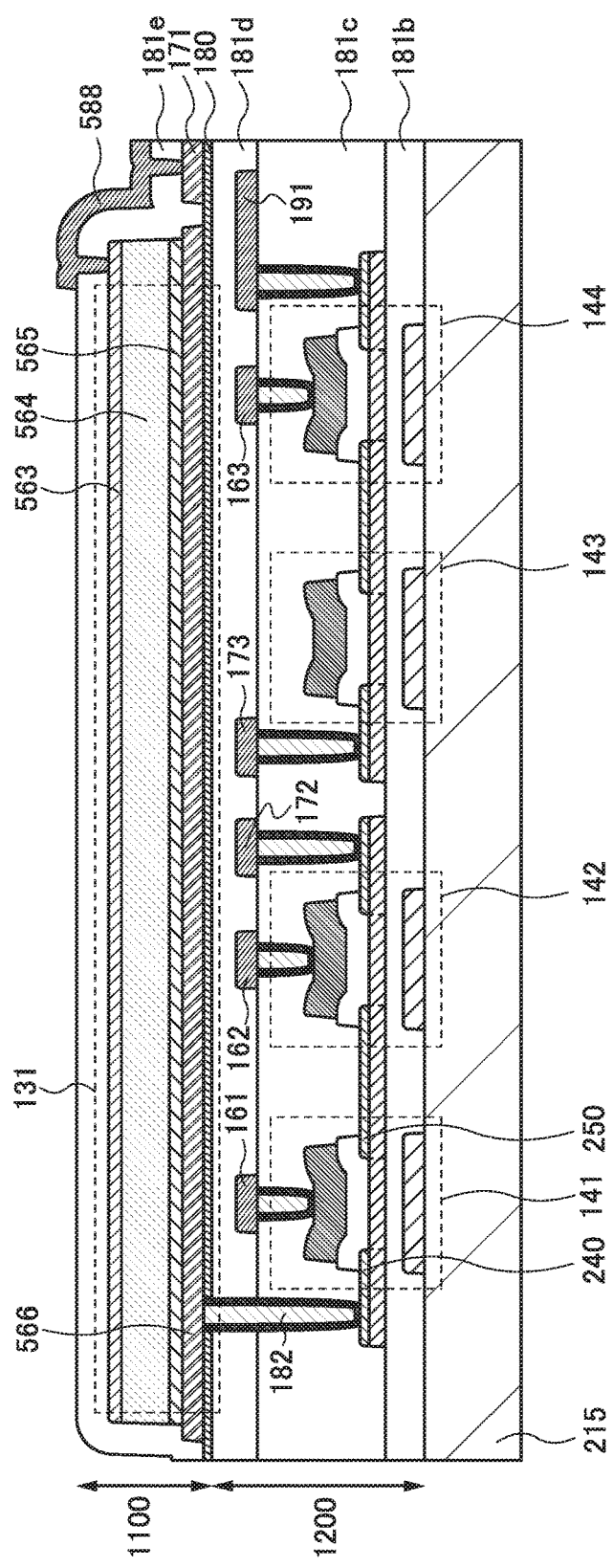
FIG. 19 is a cross-sectional view showing a structure example of an imaging device.

Alternatively, the pixel 120 can employ a stacked structure illustrated in FIG. 19. The pixel 120 in FIG. 19 is the same as the pixel 120 in FIG. 16 except for the structure of the layer 1100.

In FIG. 19, the photoelectric conversion element 131 included in the layer 1100 is a PIN photodiode using an amorphous silicon film, a microcrystalline silicon film, or the like as a photoelectric conversion layer. The photoelectric conversion element 131 can include an n-type semiconductor layer 565, an i-type semiconductor layer 564, a p-type semiconductor layer 563, the electrode 566, the wiring 171, and the wiring 588.

The electrode 566 is electrically connected to the conductive layer 240 included in the transistor 141 through the conductor 182. The p-type semiconductor layer 563 is electrically connected to the wiring 171 through the wiring 588.

The i-type semiconductor layer 564 is preferably formed using amorphous silicon. The p-type semiconductor layer 563 and the n-type semiconductor layer 565 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and thus can easily sense weak visible light.

Figure 20A:
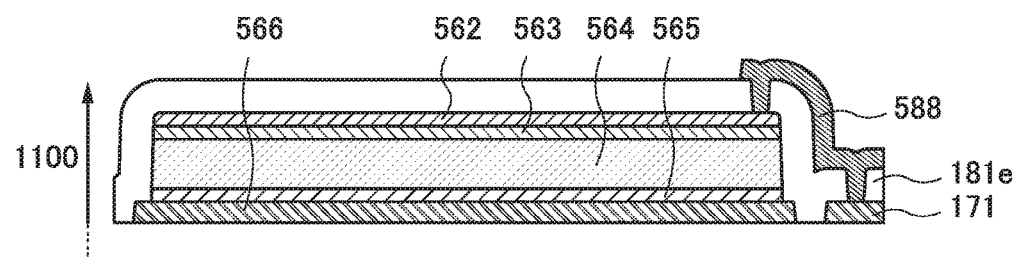
FIGS. 20A to 20C are cross-sectional views showing connection examples of a photoelectric conversion element.
Figure 20B:
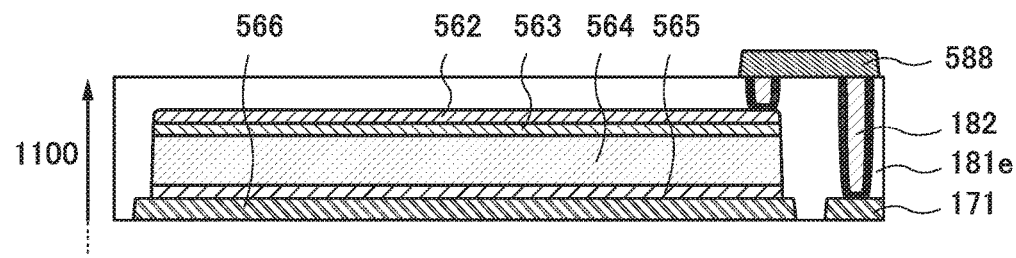
Figure 20C:
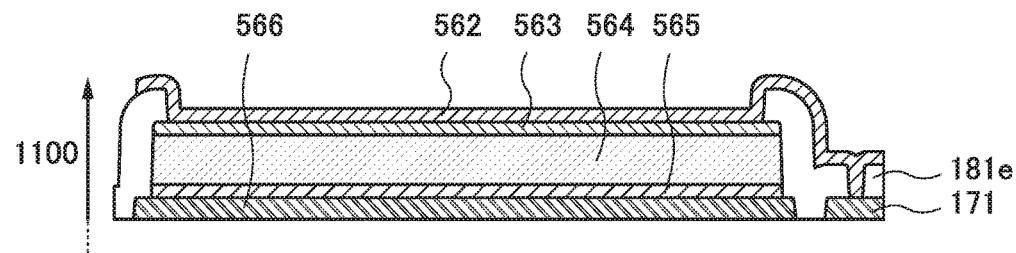

FIGS. 20A to 20C show other examples of the structure of the photoelectric conversion element 131 having a structure of a PIN thin film photodiode and the connection between the photoelectric conversion element 131 and the wirings. Note that the structure of the photoelectric conversion element 131 and the connection between the photoelectric conversion element 131 and the wirings are not limited thereto, and other structures may be employed.

In FIG. 20A, the photoelectric conversion element 131 includes the light-transmitting conductive layer 562 in contact with the p-type semiconductor layer 563. The light-transmitting conductive layer 562 serves as an electrode and can increase the output current of the photoelectric conversion element 131.

The light-transmitting conductive layer 562 can be formed using, for example, indium tin oxide, indium tin oxide containing silicon, indium oxide containing zinc, zinc oxide, zinc oxide containing gallium, zinc oxide containing aluminum, tin oxide, tin oxide containing fluorine, tin oxide containing antimony, graphene, or graphene oxide. The light-transmitting conductive layer 562 is not limited to a single layer and may be a stack of different films.

In FIG. 20B, the light-transmitting conductive layer 562 and the wiring 171 are connected to each other through the conductor 182 and the wiring 588. Note that the p-type semiconductor layer 563 of the photoelectric conversion element 131 and the wiring 171 can be connected to each other through the conductor 182 and the wiring 588. In the structure of FIG. 20B, the light-transmitting conductive layer 562 is not necessarily provided.

In FIG. 20C, an opening that exposes the p-type semiconductor layer 563 is provided in an insulating layer 181e covering the photoelectric conversion element 131, and the light-transmitting conductive layer 562 covering the opening is electrically connected to the wiring 171.

The photoelectric conversion element 131 containing the selenium-based material, amorphous silicon, or the like can be manufactured through general semiconductor manufacturing processes such as a deposition process, a lithography process, and an etching process. Since the resistance of the selenium-based material is high, the photoelectric conversion layer 561 does not need to be divided between circuits as illustrated in FIG. 16. Thus, the photoelectric conversion element 131 can be manufactured with a high yield at low cost.

Figure 21A:
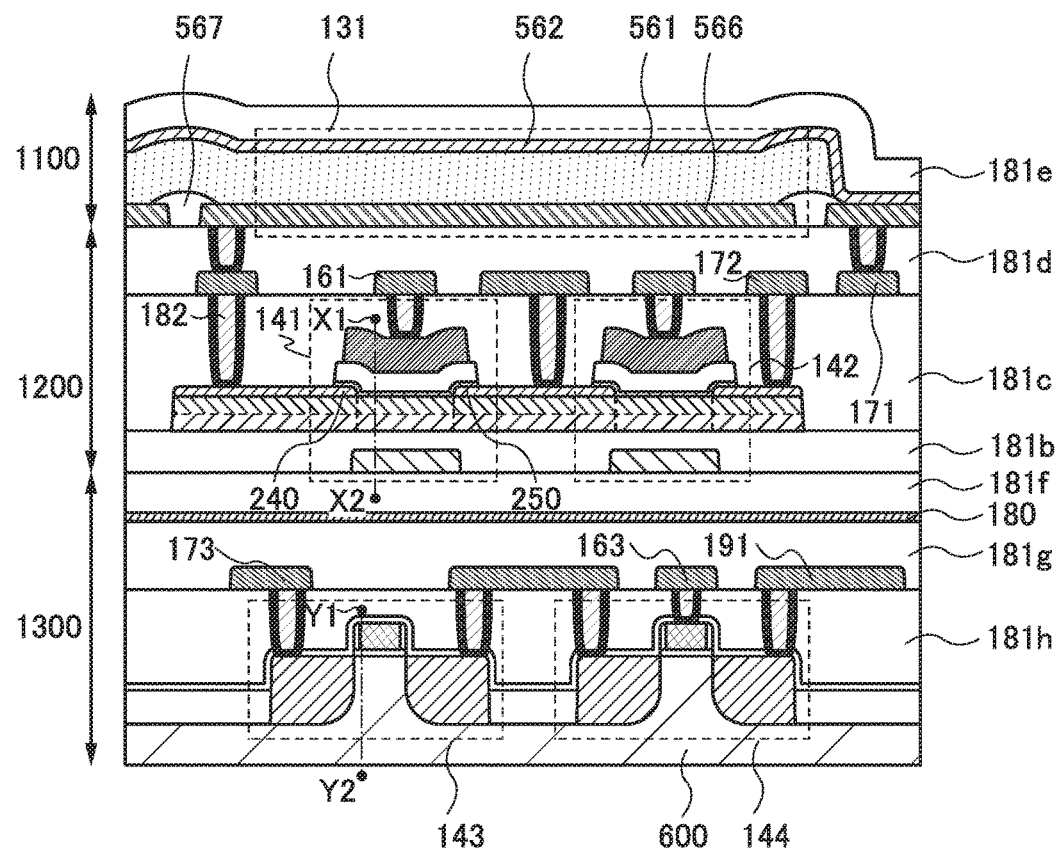
FIGS. 21A to 21C are cross-sectional views showing structure examples of an imaging device.
Figure 21B:
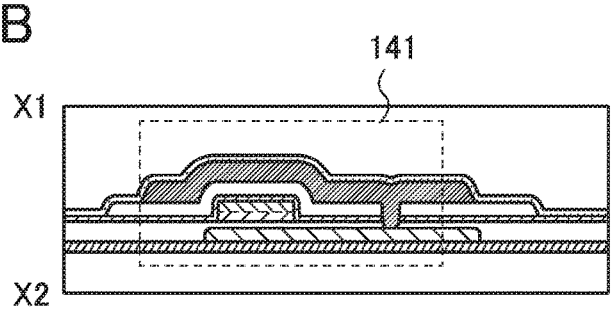
Figure 21C:
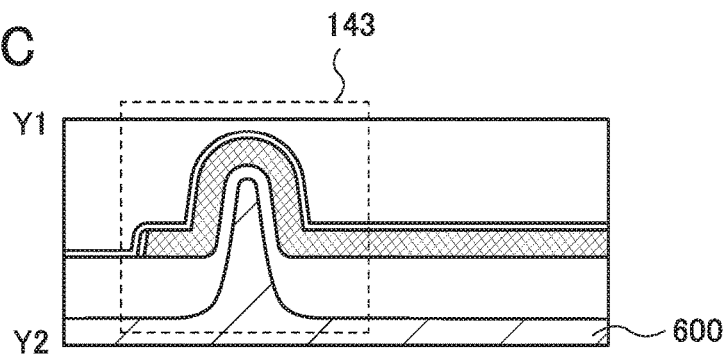

The pixel 120 may have a stacked structure of the layer 1100, the layer 1200, and a layer 1300 as illustrated in FIGS. 21A to 21C. FIG. 21A is a cross-sectional view in the channel length direction of the transistors 141 to 144. FIG. 21B is a cross-sectional view in the channel width direction of the transistor 141 taken along dashed-dotted line X1-X2 in FIG. 21A. FIG. 21C is a cross-sectional view in the channel width direction of the transistor 143 taken along dashed-dotted line Y1-Y2 in FIG. 21A.

The layer 1100 may include the photoelectric conversion element 131 as in the pixel 120 with the aforementioned structure. In the structure exemplified in FIG. 21A, the photoelectric conversion element 131 containing a selenium-based material is provided as in the structure in FIG. 16; alternatively, the photoelectric conversion element 131 may have a structure of a PIN thin film photodiode as in the structure in FIG. 19.

The layer 1200 can include the transistors 141 and 142. OS transistors are preferably used as the transistors 141 and 142.

The layer 1300 may include the transistors 143 and 144. Si transistors are preferably used as the transistors 143 and 144. The Si transistor has a high on-state current and efficiently amplifies the potential of the node FD.

Figure 22A:
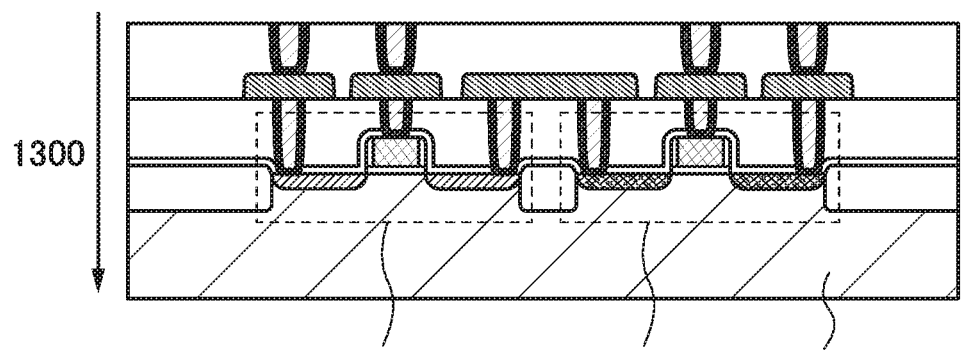
FIGS. 22A and 22B are cross-sectional views showing structure examples of an imaging device.
Figure 22B:
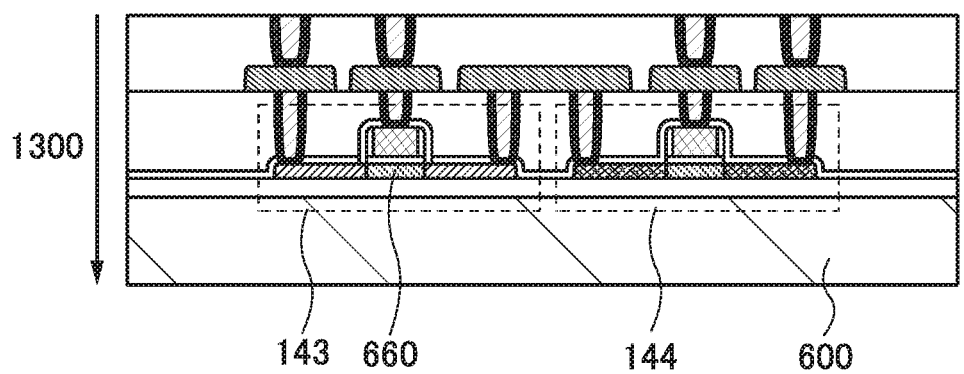

Although the transistors 143 and 144 are fin-type transistors in FIGS. 21A and 21C, the transistors may be planar transistors as illustrated in FIG. 22A. Alternatively, as illustrated in FIG. 22B, transistors each including an active layer 660 formed using a silicon thin film may be used. The active layer 660 can be formed using polycrystalline silicon or single crystal silicon of a silicon-on-insulator (SOI) structure.

Figure 23:
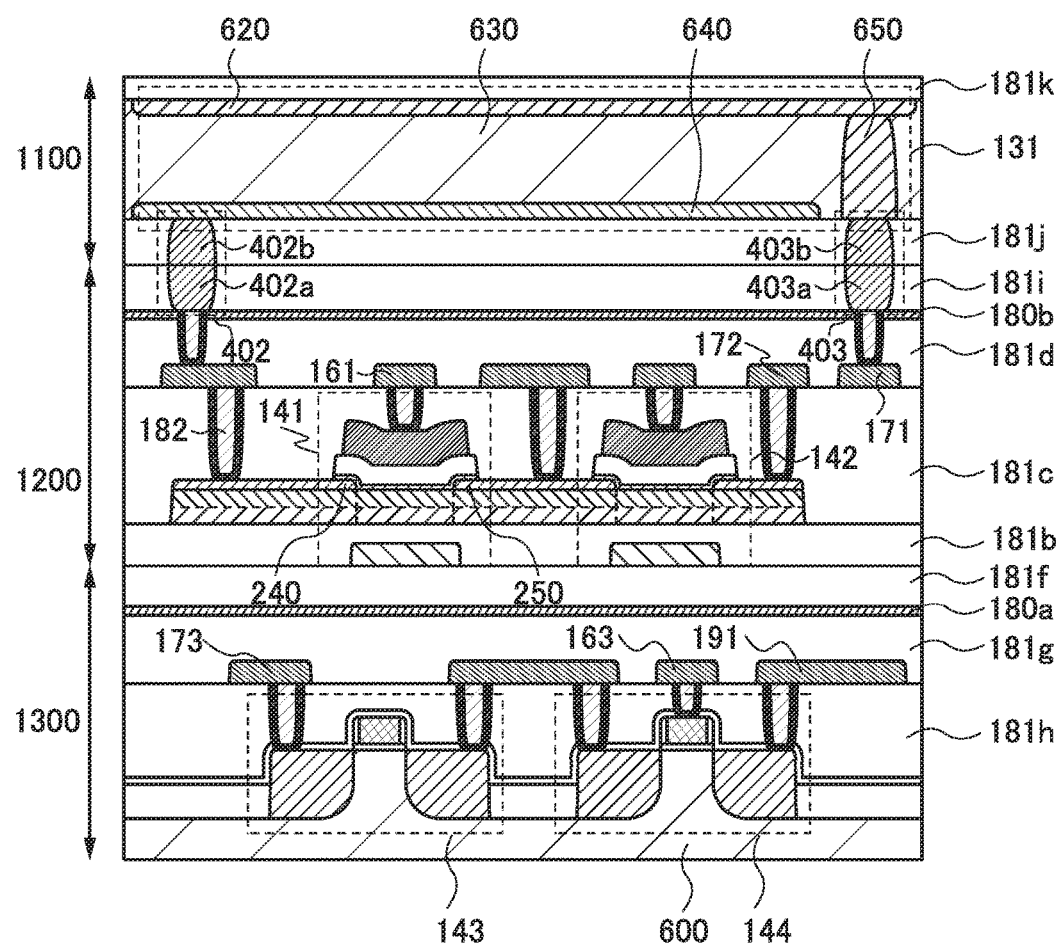
FIG. 23 is a cross-sectional view showing a structure example of an imaging device.

The photoelectric conversion element 131 included in the layer 1100 may be a PN photodiode using a single crystal silicon substrate as illustrated in FIG. 23.

In the case of using this structure, it is preferable to use a method in which the layer 1200 is formed over the layer 1300 and then, the layer 1100 formed separately is bonded thereto. In that case, the insulating layer 181i and metal layers 402a and 403a are provided in the layer 1200. Furthermore, the insulating layer 181j and the metal layers 402b and 403b are provided in the layer 1100.

The metal layers 402a and 403a include a region embedded in the insulating layer 181i and the metal layer 402a is electrically connected to one of the source and the drain of the transistor 141. The metal layer 403a is electrically connected to the wiring 171 through the conductor 182. The metal layers 402b and 403b include a region embedded in the insulating layer 181j, and the metal layer 402b is electrically connected to the n-type region 640 of the photoelectric conversion element 131. The metal layer 403b is electrically connected to the p$^+$ region 620 through the p$^+$ region 650.

As illustrated in FIG. 23, the metal layers 402a and 402b are provided to be in direct contact with each other and the metal layers 403a and 403b are provided to be in direct contact with each other to form connection portions 402 and 403.

The metal layers 402a and 402b preferably include metal elements with the same main component. The metal layers 403a and 403b preferably include metal elements with the same main component. Moreover, the insulating layers 181i and 181j are preferably formed using the same component.

For example, Cu, Al, Sn, Zn, W, Ag, Pt, Au, or the like can be used for the metal layers 402a, 402b, 403a, and 403b. Preferably, Cu, Al, W, or Au is used for easy bonding. In addition, silicon oxide, silicon oxynitride, silicon nitride oxide, silicon nitride, titanium nitride, or the like can be used for the insulating layers 181i and 181j.

When the above same metal material is used for the metal layers 402a, 402b, 403a, and 403b and the above same insulating material is used for the insulating layers 181i and 181j, a step of bonding the layers 1100 and 1200 can be performed. The metal layers 402a and 402b can be electrically connected to each other and the metal layer 403a and the metal layer 403b can be electrically connected to each other through the bonding step. Furthermore, the insulating layers 181i and 181j can be connected with mechanical strength.

For bonding the metal layers to each other, surface activated bonding and diffusion bonding can be used. Surface activated bonding is a method in which an oxide film, a layer adsorbing impurities, and the like are removed by sputtering or the like and the cleaned and activated surfaces of the metal layers are brought into contact to be bonded to each other. Diffusion bonding is a method in which the surfaces of the metal layers are bonded to each other by using temperature and pressure together. Both of the methods can cause bonding at an atomic level, thereby offering bonding with excellent electrical and mechanical strength.

For bonding the insulating layers to each other, hydrophilic bonding or the like can be used after high planarity is obtained by polishing or the like. Hydrophilic bonding is a method in which the surfaces of the insulating layers are subjected to hydrophilicity treatment by oxygen plasma or the like, brought into contact to be bonded to each other temporarily, and then dehydrated by heat treatment to perform final bonding. The hydrophilic bonding can also cause bonding at an atomic level; thus, bonding with excellent mechanical strength can be obtained.

The insulating layers and the metal layers are mixed on the bonding surfaces of the layers 1100 and 1200; therefore, for example, surface activated bonding and hydrophilic bonding are preferably performed in combination when the layers 1100 and 1200 are bonded to each other.

For example, the following method can be used: the surfaces of the layers 1100 and 1200 are made clean after polishing, the surfaces of the metal layers are subjected to antioxidant treatment and hydrophilicity treatment, and then bonding is performed. Alternatively, hydrophilicity treatment may be performed on the surfaces of the metal layers with the use of hardly oxidizable metal such as Au. Note that a bonding method other than the above method may be used.

Bonding is performed after the devices in the layers are completed, so that the devices can be fabricated using an optimum process for each of them. Therefore, the electrical characteristics and reliability of the transistors and the photoelectric conversion element can be improved.

Note that in the structure of FIG. 23, as a layer corresponding to the insulating layer 180, an insulating layer 180a is provided between the OS transistors and the Si transistors. Furthermore, an insulating layer 180b is provided between the OS transistors and the Si photodiode.

In the imaging device of one embodiment of the present invention, a circuit different from the pixel circuit can be provided using the Si transistors formed in the layer 1300. Examples of the circuit include the gate driver 122, the CDS circuit 123, the A/D converter circuit 124, and the source driver 125.

Figure 24:
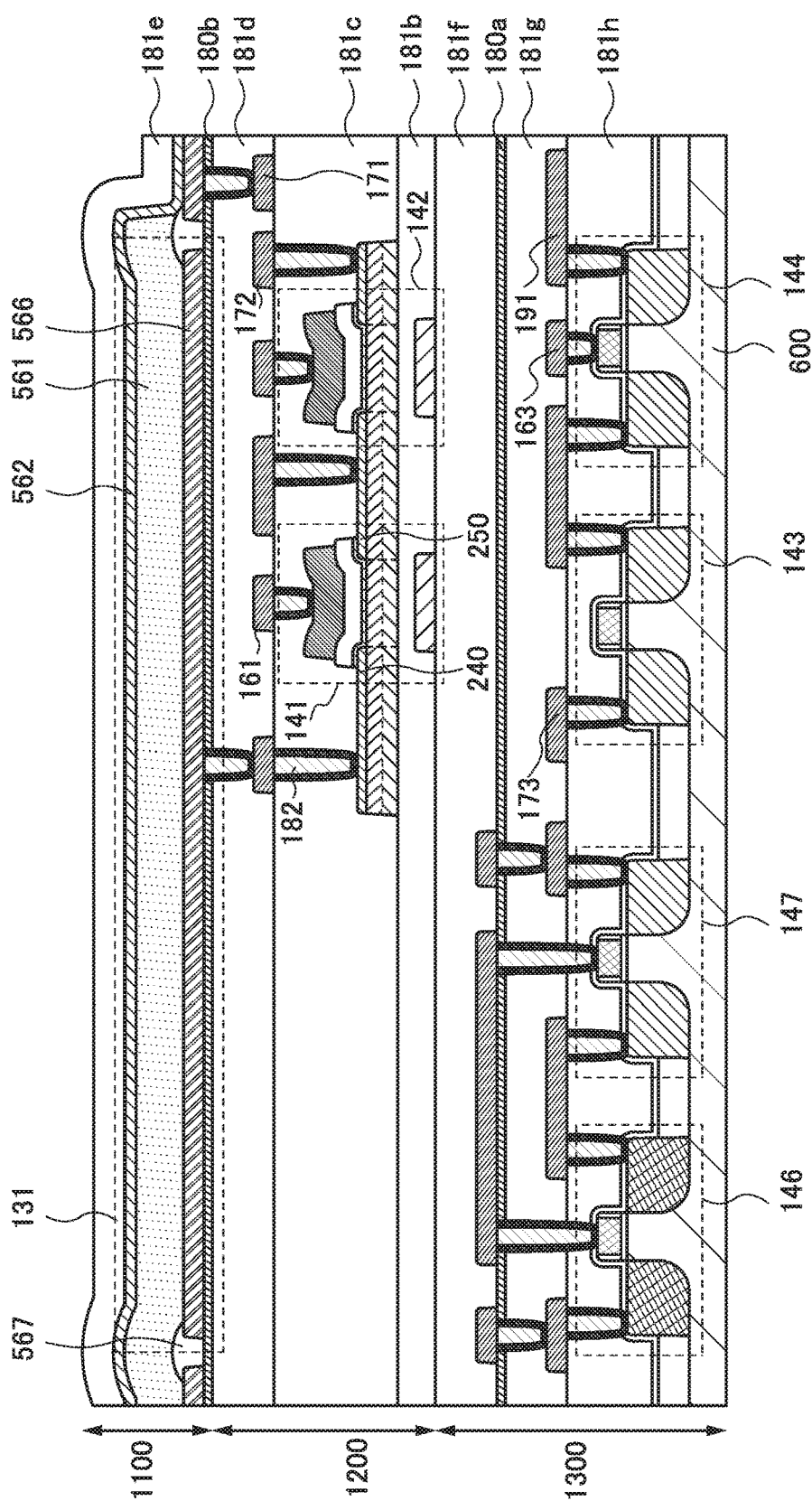
FIG. 24 is a cross-sectional view showing a structure example of an imaging device.

A transistor 146 and a transistor 147 included in any of the above circuits are illustrated in FIG. 24. The transistors 146 and 147 can be formed in a region overlapping with the photoelectric conversion element 131. That is, the above circuit is formed in a region overlapping with the pixel 120. Note that although an example of a CMOS inverter in which the transistor 146 is a p-channel transistor and the transistor 147 is an n-channel transistor is illustrated in FIG. 24, another circuit configuration may also be employed.

Figure 25:
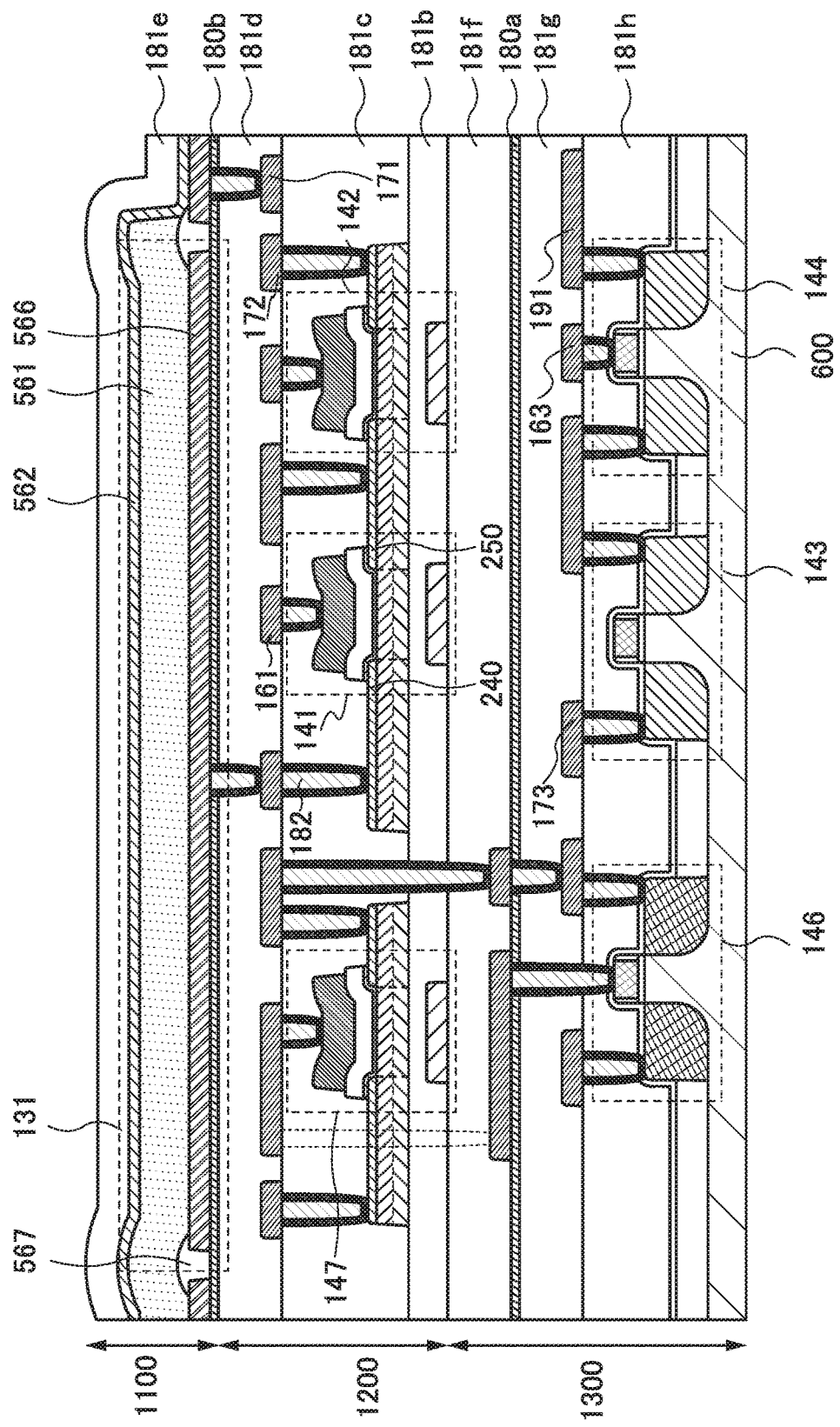
FIG. 25 is a cross-sectional view showing a structure example of an imaging device.

Alternatively, as illustrated in FIG. 25, the transistor 147 may be an OS transistor provided in the layer 1200. In the configuration illustrated in FIG. 25, the transistors 146 and 147 can be provided to overlap with each other in a bonding step; thus, the area of the circuit can be reduced. In addition, when the transistors 143 and 144 included in the pixel circuit are p-channel transistors, all the transistors provided on a single crystal silicon substrate 600 can be p-channel transistors; thus, a step of forming n-channel Si transistors can be omitted.

Figure 26:
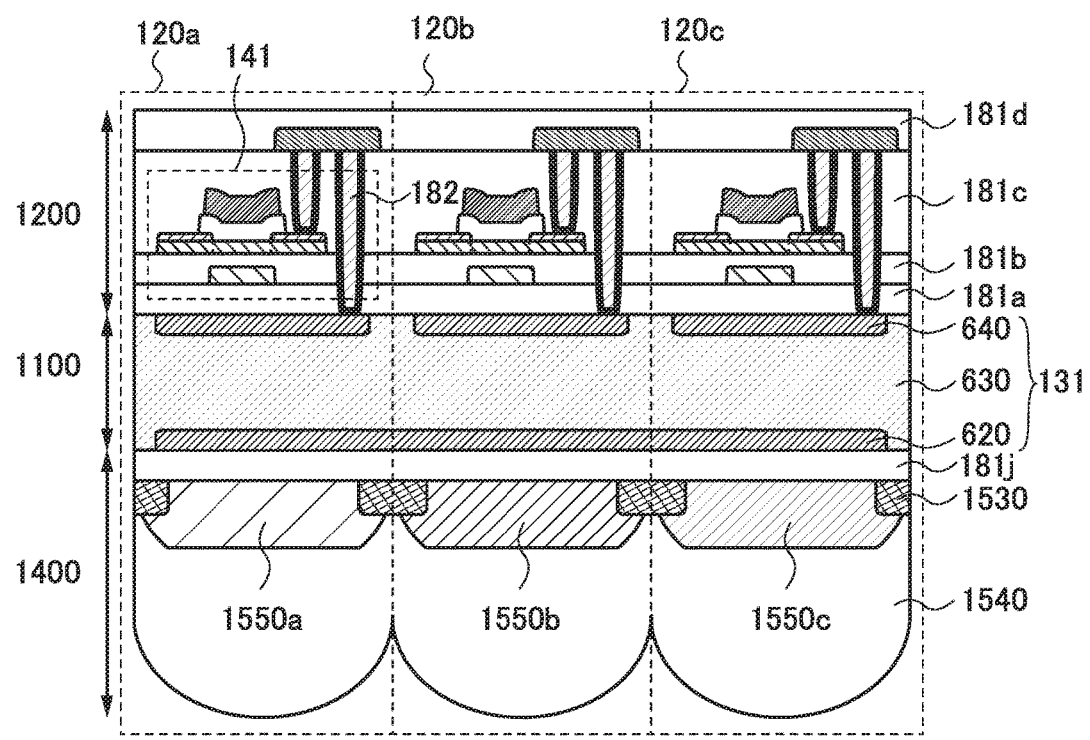
FIG. 26 is a cross-sectional view showing a structure example of an imaging device.

FIG. 26 is a cross-sectional view of a structure obtained by adding a layer 1400 to the structure illustrated in FIG. 15, and illustrates three pixels (the pixels 120a, 120b, and 120c).

In the layer 1400, a light-blocking layer 1530, optical conversion layers 1550a, 1550b, and 1550c, a microlens array 1540, and the like can be provided.

In the layer 1400, an insulating layer 181j is formed in a region in contact with the layer 1100. As the insulating layer 181j, a silicon oxide film with a high visible-light transmitting property can be used, for example. In addition, a silicon nitride film may be stacked as a passivation film. A dielectric film of hafnium oxide or the like may be stacked as an anti-reflection film.

The light-blocking layer 1530 can be provided on the insulating layer 181j. The light-blocking layer 1530 is provided at a boundary between adjacent pixels and has a function of blocking stray light that enters from oblique directions. The light-blocking layer 1530 can be formed of a metal layer of aluminum, tungsten, or the like, or a stack including the metal layer and a dielectric layer functioning as an anti-reflection film.

The optical conversion layers 1550a to 1550c can be provided on the insulating layer 181j and the light-blocking layer 1530. Color images are obtained, for example, when color filters of red, green, blue, violet, orange, yellow, cyan, magenta, and/or the like are assigned to the optical conversion layers 1550a to 1550c.

In this specification and the like, red refers to, for example, light with a wavelength greater than or equal to 620 nm and less than 750 nm; green, light with a wavelength greater than or equal to 500 nm and less than 570 nm; blue, light with a wavelength greater than or equal to 450 nm and less than 500 nm; violet, light with a wavelength greater than or equal to 380 nm and less than 450 nm; and orange, light with a wavelength greater than or equal to 590 nm and less than 620 nm. Yellow refers to, for example, a complementary color of blue, cyan refers to, for example, a complementary color of red, and magenta refers to, for example, a complementary color of green.

Note that when a filter that blocks light with a wavelength shorter than or equal to that of visible light is used as the optical conversion layer, an infrared imaging device is obtained. When a filter that blocks light with a wavelength shorter than or equal to that of near infrared light is used as the optical conversion layer, a far-infrared imaging device is obtained. When a filter that blocks light with a wavelength longer than or equal to that of visible light is used as the optical conversion layer, an ultraviolet imaging device is obtained. A visible light color filter and an infrared or ultraviolet filter may be combined.

When a scintillator is used as the optical conversion layer, it is possible to obtain an imaging device that takes an image visualizing the intensity of radiation and is used for an X-ray imaging device or the like. Radiations such as X-rays that pass through an object to enter a scintillator are converted into light (fluorescence) such as visible light or ultraviolet light owing to photoluminescence. Then, the photoelectric conversion element 131 detects the light to obtain image data. Moreover, the imaging device having the above structure may be used in a radiation detector or the like.

A scintillator contains a substance that, when irradiated with radiation such as X-rays or gamma rays, absorbs energy of the radiation to emit visible light or ultraviolet light. For example, it is possible to use a resin or ceramics in which any of $Gd_2O_2S$:Tb, $Gd_2O_2S$:Pr, $Gd_2O_2S$:Eu, $BaFCl$:Eu, NaI, CsI, $CaF_2$, $BaF_2$, $CeF_3$, LiF, LiI, and ZnO is dispersed.

The microlens array 1540 can be provided on the optical conversion layers 1550a to 1550c. Light that passes through lenses of the microlens array 1540 passes through the optical conversion layers 1550a to 1550c that are placed directly on the microlens array 1540, and is emitted to the photoelectric conversion element 131.

In this embodiment, one embodiment of the present invention has been described. Other embodiments of the present invention are described in other embodiments. Note that one embodiment of the present invention is not limited thereto. In other words, various embodiments of the invention are described in this embodiment and the other embodiments, and one embodiment of the present invention is not limited to a particular embodiment. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with another function, for example. For example, an example in which a channel formation region, source and drain regions, and the like of a transistor include an oxide semiconductor is described as one embodiment of the present invention; however, one embodiment of the present invention is not limited to this example. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor. Although an example in which a global shutter system is employed is described as one embodiment of the present invention, one embodiment of the present invention is not limited thereto. Depending on circumstances or conditions, another system such as a rolling shutter system may be employed in one embodiment of the present invention. Alternatively, depending on circumstances or conditions, the global shutter system is not necessarily employed.

This embodiment can be implemented in appropriate combination with any of the structures described in the other embodiments.

Embodiment 3

In this embodiment, an OS transistor that can be used in one embodiment of the present invention will be described with reference to drawings. In the drawings in this embodiment, some components are enlarged, reduced in size, or omitted for easy understanding.

Figure 27A:
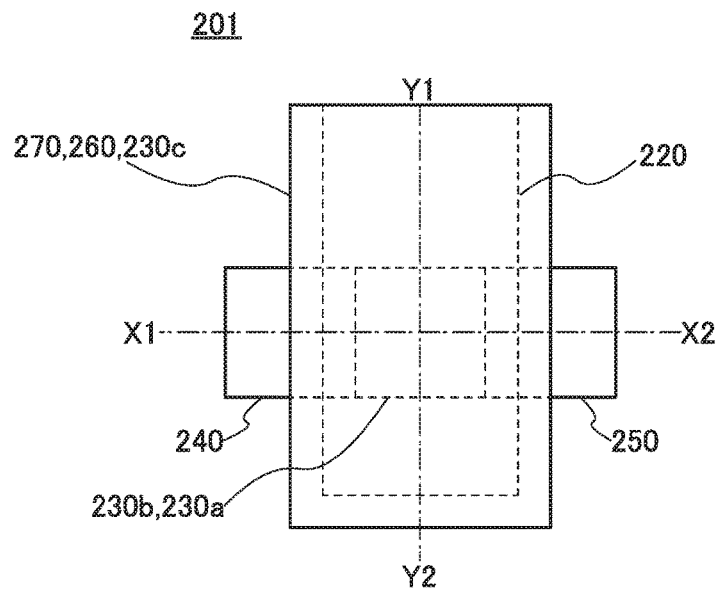
FIGS. 27A to 27C are a top view and cross-sectional views showing structure examples of a transistor.
Figure 27B:
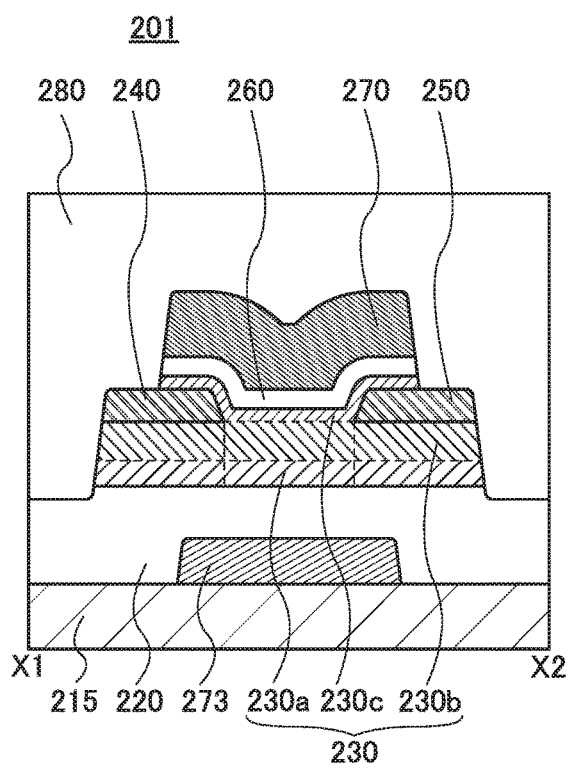
Figure 27C:
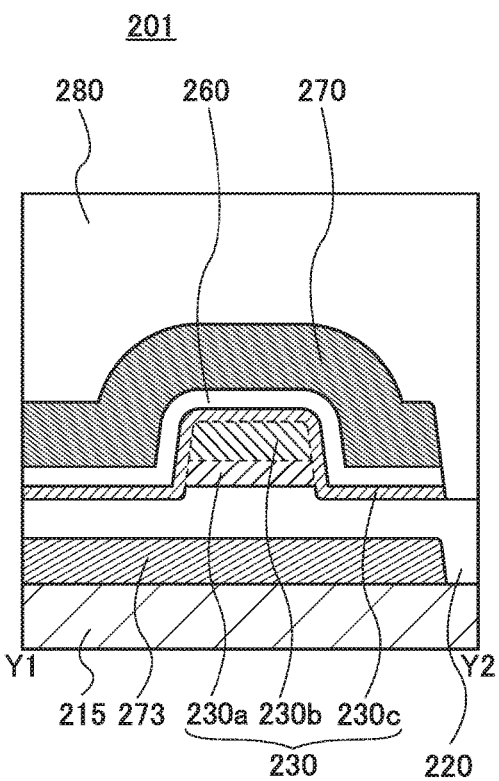

FIGS. 27A to 27C are a top view and cross-sectional views of a transistor 201 of one embodiment of the present invention. FIG. 27A is the top view. FIG. 27B shows a cross section along the dashed-dotted line X1-X2 in FIG. 27A. FIG. 27C shows a cross section along the dashed-dotted line Y1-Y2 in FIG. 27A.

In the drawings explained in this embodiment, the direction of the dashed-dotted line X1-X2 is referred to as channel length direction, and the direction of the dashed-dotted line Y1-Y2 is referred to as channel width direction.

The transistor 201 includes the substrate 215, the conductive layer 273 in contact with the substrate 215, an insulating layer 220 in contact with the substrate 215 and the conductive layer 273, the oxide semiconductor layer 230 in contact with the insulating layer 220, the conductive layers 240 and 250 in contact with the oxide semiconductor layer 230, the insulating layer 260 in contact with the oxide semiconductor layer 230, and the conductive layer 270 in contact with the insulating layer 260.

Over the transistor 201, an insulating layer 280 in contact with the oxide semiconductor layer 230, the conductive layers 240 and 250, the insulating layer 260, and the conductive layer 270 may be provided as necessary.

The oxide semiconductor layer 230 can have a three-layer structure of oxide semiconductor layers 230a, 230b, and 230c, for example. In that case, the insulating layer 260 can be in contact with the oxide semiconductor layer 230c.

The conductive layers 240 and 250 can function as a source electrode layer and a drain electrode layer. The insulating layer 260 and the conductive layer 270 can function as a gate insulating layer and a gate electrode layer, respectively.

Using the conductive layer 273 as a back gate electrode layer enables the increase in on-state current and control of the threshold voltage. Note that the conductive layer 273 can also serve as a light-blocking layer.

In order to increase the on-state current, for example, the conductive layers 270 and 273 are made to have the same potential, and the transistor is driven as a double-gate transistor. Furthermore, in order to control the threshold voltage, a fixed potential that is different from the potential of the conductive layer 270 is supplied to the conductive layer 273.

In the oxide semiconductor layer 230, a region in contact with the conductive layer 240 and a region in contact with the conductive layer 250 can function as a source region and a drain region.

Since the oxide semiconductor layer 230 is in contact with the conductive layers 240 and 250, an oxygen vacancy is generated in the oxide semiconductor layer 230, and the regions become n-type low-resistance regions owing to interaction between the oxygen vacancy and hydrogen that remains in the oxide semiconductor layer 230 or diffuses into the oxide semiconductor layer 230 from the outside.

The conductive layers 240 and 250 are in contact with a top surface of the oxide semiconductor layer 230 and are not in contact with side surfaces of the oxide semiconductor layer 230. This structure facilitates compensation for oxygen vacancies in the oxide semiconductor layer 230 with oxygen included in the insulating layer 220.

Figure 28A:
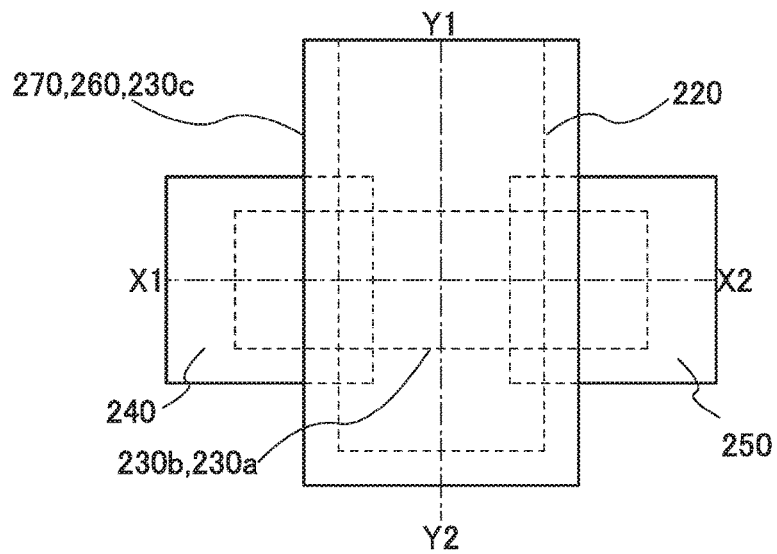
FIGS. 28A to 28C are a top view and cross-sectional views showing structure examples of a transistor.
Figure 28B:
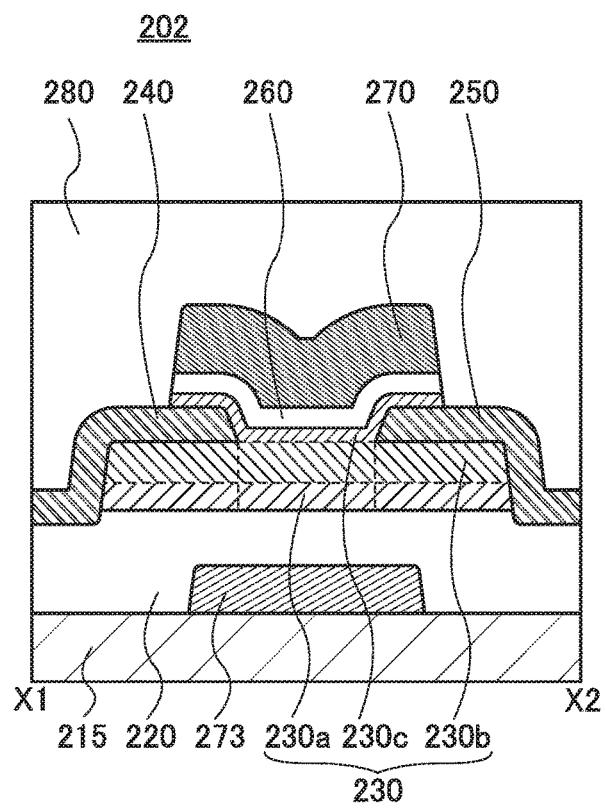
Figure 28C:
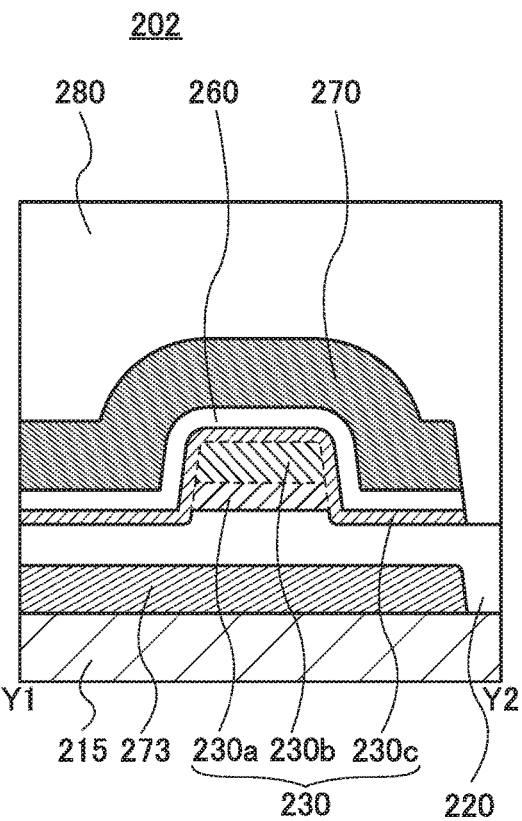

The transistor in one embodiment of the present invention may have a structure illustrated in FIGS. 28A to 28C. FIG. 28A is a top view of a transistor 202. FIG. 28B shows a cross section along the dashed-dotted line X1-X2 in FIG. 28A. FIG. 28C shows a cross section along the dashed-dotted line Y1-Y2 in FIG. 28A.

The transistor 202 has the same structure as the transistor 201 except that the conductive layers 240 and 250 are in contact with the insulating layer 220, and that the conductive layers 240 and 250 are in contact with side surfaces of the oxide semiconductor layer 230.

The transistors 201 and 202 each have a top-gate structure including a region where the conductive layer 270 overlaps with the conductive layers 240 and 250. To reduce parasitic capacitance, the width of the region in the channel length direction is preferably greater than or equal to 3 nm and less than 300 nm. Since an offset region is not formed in the oxide semiconductor layer 230 in this structure, a transistor with a high on-state current can be easily formed.

Figure 29A:
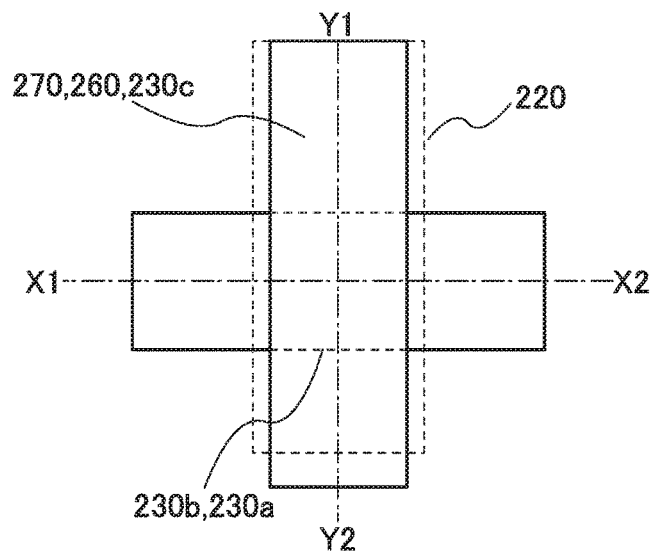
FIGS. 29A to 29C are a top view and cross-sectional views showing structure examples of a transistor.
Figure 29B:
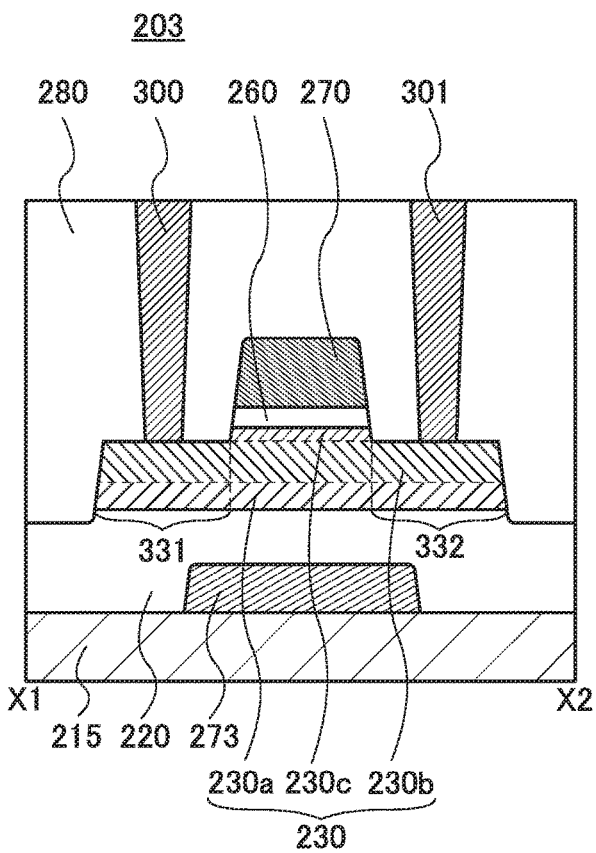
Figure 29C:
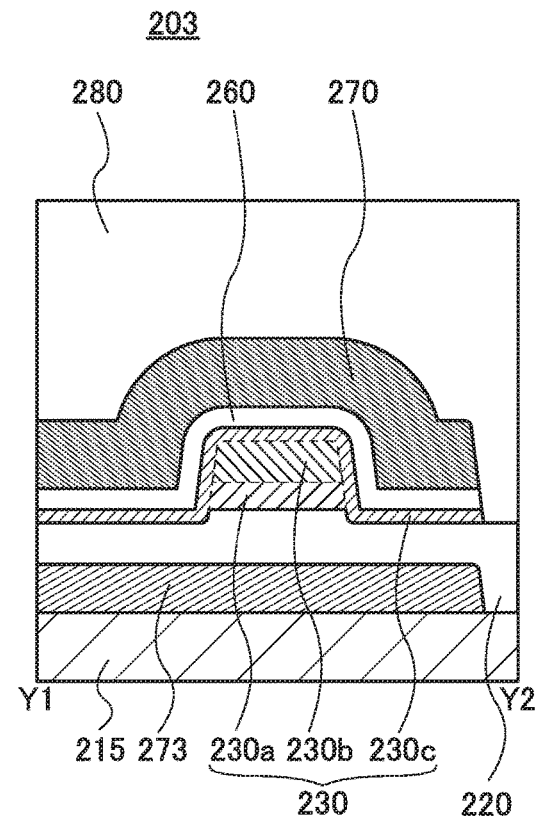

The transistor in one embodiment of the present invention may have a structure illustrated in FIGS. 29A to 29C. FIG. 29A is a top view of a transistor 203. FIG. 29B shows a cross section along the dashed-dotted line X1-X2 in FIG. 29A. FIG. 29C shows a cross section along the dashed-dotted line Y1-Y2 in FIG. 29A.

The transistor 203 includes the substrate 215, the conductive layer 273 in contact with the substrate 215, the insulating layer 220 in contact with the substrate 215 and the conductive layer 273, the oxide semiconductor layer 230 (the oxide semiconductor layers 230a, 230b, and 230c) in contact with the insulating layer 220, the insulating layer 260 in contact with the oxide semiconductor layer 230c, and the conductive layer 270 in contact with the insulating layer 260.

In the insulating layer 280 serving as an interlayer insulating film, a conductor 300 in contact with a region 331 of the oxide semiconductor layer 230 and a conductor 301 in contact with a region 332 of the oxide semiconductor layer 230 are provided. The conductors 300 and 301 function as part of the source electrode layer and part of the drain electrode layer.

An impurity for forming an oxygen vacancy to increase conductivity is preferably added to the regions 331 and 332 in the transistor 203. As an impurity for forming an oxygen vacancy in an oxide semiconductor layer, one or more of the following can be used, for example: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor that has become a conductor.

The transistor 203 has a self-aligned structure that does not include a region where the gate electrode layer overlaps with the source electrode layer and the drain electrode layer. A transistor with a self-aligned structure, which has extremely low parasitic capacitance between a gate electrode layer and source and drain electrode layers, is suitable for applications that require high-speed operation.

Figure 30A:
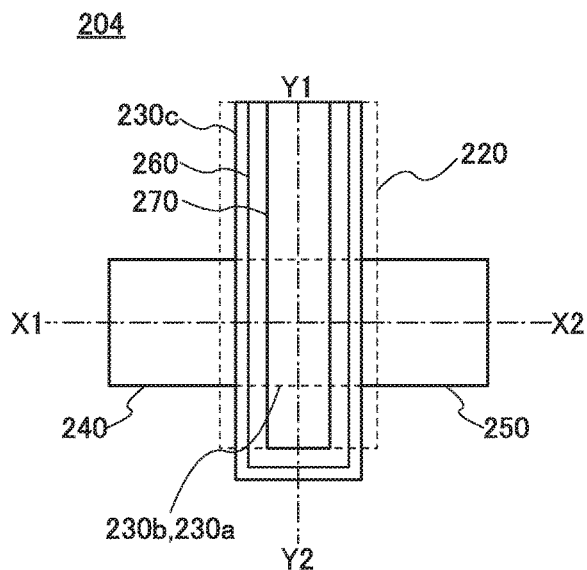
FIGS. 30A to 30C are a top view and cross-sectional views showing structure examples of a transistor.
Figure 30B:
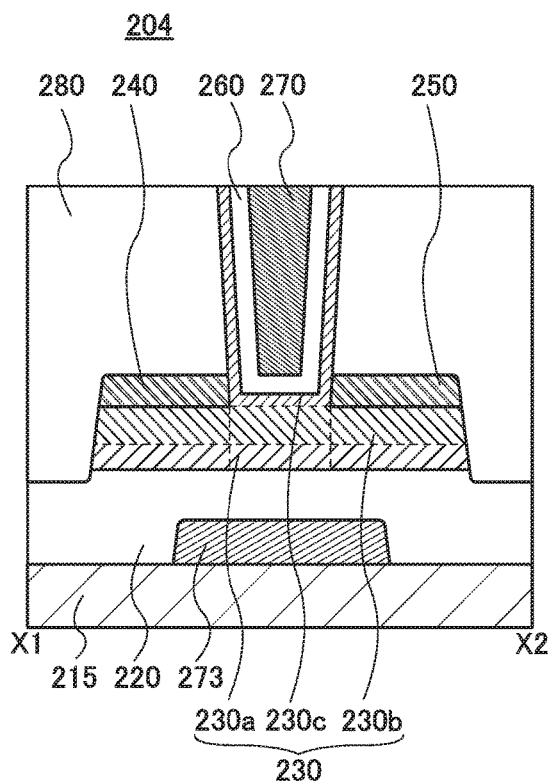
Figure 30C:
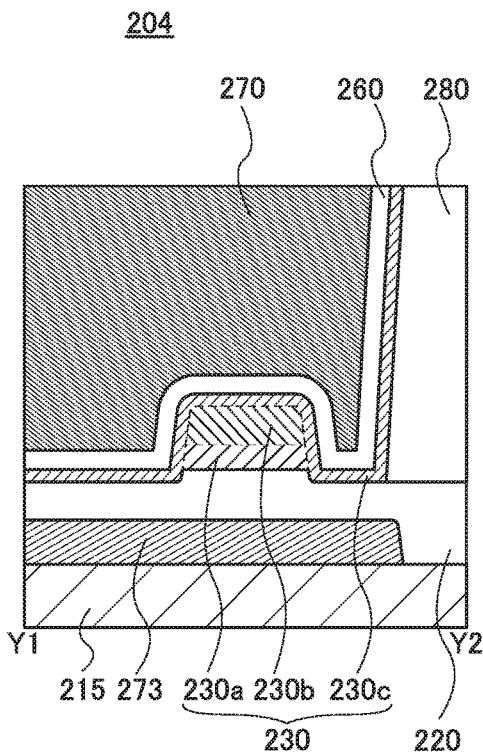

The transistor in one embodiment of the present invention may have a structure illustrated in FIGS. 30A to 30C. FIG. 30A is a top view of a transistor 204. FIG. 30B shows a cross section along the dashed-dotted line X1-X2 in FIG. 30A. FIG. 30C shows a cross section along the dashed-dotted line Y1-Y2 in FIG. 30A.

The transistor 204 includes the substrate 215, the conductive layer 273 in contact with the substrate 215, the insulating layer 220 in contact with the substrate 215 and the conductive layer 273, the oxide semiconductor layer 230 (the oxide semiconductor layers 230a, 230b, and 230c) in contact with the insulating layer 220, the conductive layers 240 and 250 in contact with the oxide semiconductor layers 230b and 230c, the insulating layer 260 in contact with the oxide semiconductor layer 230c, and the conductive layer 270 in contact with the insulating layer 260.

Note that the oxide semiconductor layer 230c, the insulating layer 260, and the conductive layer 270 are provided in an opening that is provided in the insulating layer 280 over the transistor 204 and reaches the oxide semiconductor layer 230b and the insulating layer 220.

The transistor 204 has a small region in which the source and drain electrode layers overlap with the gate electrode layer, thereby having a low parasitic capacitance. Hence, the transistor 204 is suitable for applications that require high-speed operation.

Figure 31A:
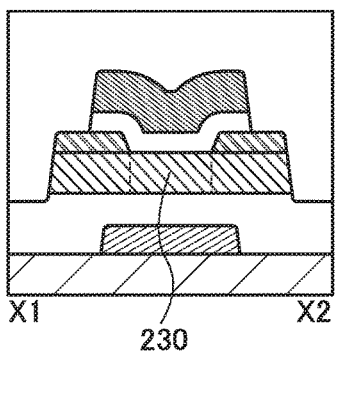
FIGS. 31A to 31G are top views and cross-sectional views showing structure examples of a transistor.
Figure 31B:
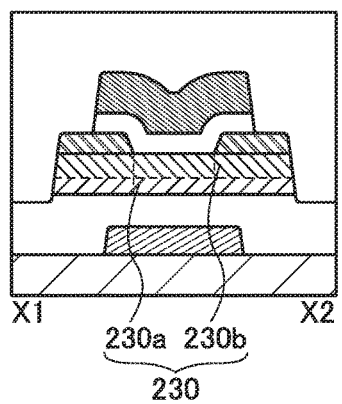

In the transistor of one embodiment of the present invention, the oxide semiconductor layer 230 may be a single layer as illustrated in FIG. 31A, or may be formed of two layers as illustrated in FIG. 31B.

Figure 31C:
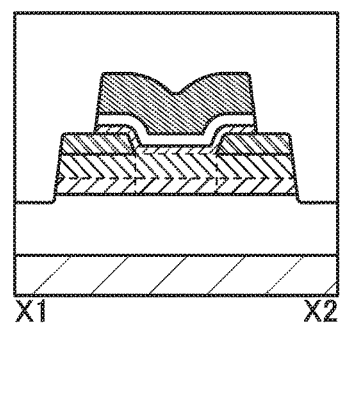

The transistor of one embodiment of the present invention may be configured not to include the conductive layer 273 as illustrated in FIG. 31C.

Figure 31D:
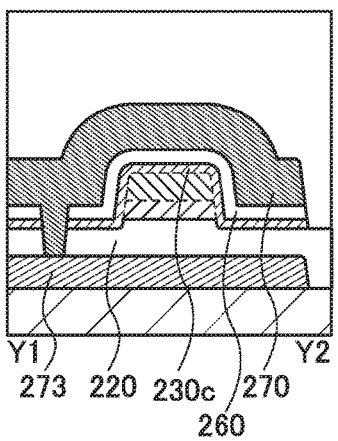

To electrically connect the conductive layer 270 to the conductive layer 273 in the transistor of one embodiment of the present invention, for example, an opening is formed in the insulating layer 220, the oxide semiconductor layer 230c, and the insulating layer 260 to reach the conductive layer 273, and the conductive layer 270 is formed to cover the opening as illustrated in FIG. 31D.

Figure 31E:
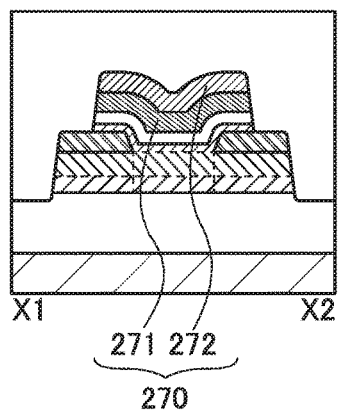

In the transistor of one embodiment of the present invention, the conductive layer 270 may be a stack including a conductive layer 271 and a conductive layer 272, as illustrated in FIG. 31E.

Figure 31F:
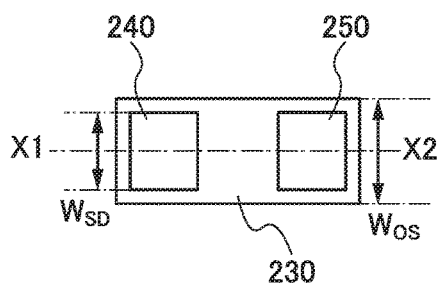
Figure 31G:
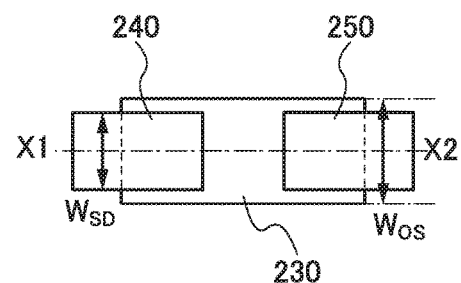

In the transistor of one embodiment of the present invention, in which the conductive layers 240 and 250 are provided over the oxide semiconductor layer 230, the width ($W_{SD}$) of the conductive layers 240 and 250 may be smaller than the width ($W_{OS}$) of the oxide semiconductor layer 230 as shown in top views of FIGS. 31F and 31G (that only show the oxide semiconductor layer 230 and the conductive layers 240 and 250). When $W_{OS} \geq W_{SD}$ is satisfied ($W_{SD}$ is smaller than or equal to $W_{OS}$), a gate electric field is easily applied to the entire channel formation region, so that the electrical characteristics of the transistor can be improved.

FIGS. 31A to 31E illustrate variation examples of the transistor 201; these examples can also be applied to the other transistors described in this embodiment.

In the transistor with any of the above structures in one embodiment of the present invention, the conductive layer 270 (and the conductive layer 273) serving as a gate electrode layer electrically surrounds the oxide semiconductor layer 230 in the channel width direction with the insulating layer therebetween. Such a structure can increase the on-state current and is referred to as a surrounded channel (s-channel) structure.

In the transistor including the oxide semiconductor layers 230a and 230b and the transistor including the oxide semiconductor layers 230a, 230b, and 230c, selecting appropriate materials for the two or three layers forming the oxide semiconductor layer 230 allows current to flow in the oxide semiconductor layer 230b. Since current flows through the oxide semiconductor layer 230b, the current is hardly influenced by interface scattering, leading to a high on-state current.

A semiconductor device including the transistor with any of the above structures can have favorable electrical characteristics.

The structure described in this embodiment can be used in appropriate combination with the structure described in any of the other embodiments.

Embodiment 4

In this embodiment, components of the transistors shown in Embodiment 3 will be described in detail.
<Components>

As the substrate 215, a glass substrate, a quartz substrate, a semiconductor substrate, a ceramic substrate, a metal substrate with an insulated surface, or the like can be used. Other examples are a silicon substrate provided with a transistor and/or a photodiode; and a silicon substrate over which an insulating layer, a wiring, a conductor functioning as a contact plug, and the like are provided. When a p-channel transistor is formed on a silicon substrate, a silicon substrate with n⁻-type conductivity is preferably used. Alternatively, an SOI substrate including an n⁻-type or i-type silicon layer may be used. Moreover, when a p-channel transistor is formed on a silicon substrate, a surface of the silicon substrate where the transistor is formed preferably has a (110) plane orientation, in which case the mobility can be increased.

The insulating layer 220 can have a function of supplying oxygen to the oxide semiconductor layer 230 as well as a function of preventing diffusion of impurities from a component of the substrate 215. For this reason, the insulating layer 220 preferably contains oxygen and more preferably has an oxygen content higher than that in the stoichiometric composition. The insulating layer 220 is a film in which the amount of released oxygen when converted into oxygen atoms is preferably greater than or equal to $1.0 \times 10^{19}$ atoms/cm³ in TDS analysis. In the TDS analysis, heat treatment is performed such that the film surface temperature ranges from 100° C. to 700° C., preferably from 100° C. to 500° C. When the substrate 215 is provided with another device, the insulating layer 220 also functions as an interlayer insulating film. In that case, the insulating layer 220 is preferably subjected to planarization treatment such as CMP treatment so as to have a flat surface.

As the conductive layer 273 functioning as a back gate electrode layer, a conductive film formed using Al, Ti, Cr, Co, Ni, Cu, Y, Zr, Mo, Ru, Ag, Mn, Nd, Sc, Ta, or W can be used, for example. It is also possible to use an alloy or a conductive nitride of any of the above materials, or a stack including a plurality of materials selected from these materials, alloys of these materials, and conductive nitrides of these materials.

For example, the insulating layer 220 can be formed using an oxide insulating film containing aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film containing silicon nitride, silicon nitride oxide, aluminum nitride, aluminum nitride oxide, or the like; or a mixed material of any of these. The insulating layer 220 may be a stack of any of the above materials.

The oxide semiconductor layer 230 can have a three-layer structure in which the oxide semiconductor layers 230a, 230b, and 230c are stacked in this order from the insulating layer 220 side.

Note that when the oxide semiconductor layer 230 is a single layer, a layer corresponding to the oxide semiconductor layer 230b described in this embodiment is used.

In the case of employing a two-layer structure, the oxide semiconductor layer 230 can be a stack in which a layer corresponding to the oxide semiconductor layer 230a and a layer corresponding to the oxide semiconductor layer 230b are stacked in this order from the insulating layer 220 side. In this structure, the positions of the oxide semiconductor layers 230a and 230b can be interchanged.

For the oxide semiconductor layer 230b, an oxide semiconductor whose electron affinity (energy difference between the vacuum level and the conduction band minimum) is higher than those of the oxide semiconductor layers 230a and 230c is used, for example.

In such a structure, when a voltage is applied to the conductive layer 270, a channel is formed in the oxide semiconductor layer 230b whose conduction band minimum is the lowest in the oxide semiconductor layer 230. Therefore, the oxide semiconductor layer 230b can be regarded as having a region serving as a semiconductor, while the oxide semiconductor layer 230a and the oxide semiconductor layer 230c can be regarded as having a region serving as an insulator or a semi-insulator.

An oxide semiconductor that can be used for each of the oxide semiconductor layers 230a, 230b, and 230c preferably contains at least one of In and Zn, or both In and Zn. In order to reduce variations in electrical characteristics of the transistor including the oxide semiconductor, the oxide semiconductor preferably contains a stabilizer such as Al, Ga, Y, or Sn in addition to In and/or Zn.

For the oxide semiconductor layers 230a and 230c, In—Ga—Zn oxide with an atomic ratio of In to Ga and Zn (In: Ga: Zn) of 1:3:2, 1:3:3, 1:3:4, 1:3:6, 1:4:5, 1:6:4, or 1:9:6 or close to these ratios can be used, for example. For the oxide semiconductor layer 230b, In—Ga—Zn oxide with an atomic ratio In: Ga: Zn of 1:1:1, 2:1:3, 5:5:6, 3:1:2, 3:1:4, 5:1:6, or 4:2:3 or close to these ratios can be used, for example.

The oxide semiconductor layers 230a, 230b, and 230c may include crystal parts. For example, when crystals with c-axis alignment are used, the transistor can have stable electrical characteristics. Moreover, crystals with c-axis alignment are resistant to bending; thus, using such crystals can improve the reliability of a semiconductor device using a flexible substrate.

The conductive layer 240 functioning as a source electrode layer and the conductive layer 250 functioning as a drain electrode layer can be formed with a single layer or a stacked layer using a material selected from Al, Cr, Cu, Ta, Ti, Mo, W, Ni, Mn, Nd, and Sc and alloys or conductive nitrides of any of these metal materials, for example. Using tantalum nitride, which is a conductive nitride, can prevent oxidation of the conductive layers 240 and 250. It is also possible to use a stack of any of the above materials and Cu or an alloy such as Cu-Mn, which has low resistance.

The above materials are capable of extracting oxygen from an oxide semiconductor layer. Thus, in a region of the oxide semiconductor layer that is in contact with any of the above materials, oxygen is released from the oxide semiconductor layer and an oxygen vacancy is formed. Hydrogen slightly contained in the oxide semiconductor layer and the oxygen vacancy are bonded to each other, so that the region is markedly changed to an n-type region. Accordingly, the n-type region can serve as a source or a drain of the transistor.

The insulating layer 260 functioning as a gate insulating layer can be an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 260 may be a stack including any of the above materials.

As the insulating layers 220 and 260 in contact with the oxide semiconductor layer 230, a film that releases less nitrogen oxide is preferably used. When the oxide semiconductor is in contact with an insulating layer that releases a large amount of nitrogen oxide, the density of states caused by nitrogen oxide becomes high in some cases.

By using the above insulating film as the insulating layers 220 and 260, a shift in the threshold voltage of the transistor can be reduced, which leads to reduced fluctuations in the electrical characteristics of the transistor.

As the conductive layer 270 functioning as a gate electrode layer, a conductive film of Al, Ti, Cr, Co, Ni, Cu, Y, Zr, Mo, Ru, Ag, Mn, Nd, Sc, Ta, or W can be used, for example. An alloy or a conductive nitride of any of these materials can also be used. A stack containing a plurality of materials selected from the above materials, alloys of these materials, and conductive nitrides of these materials can also be used. As a typical example, tungsten, a stack of tungsten and titanium nitride, or a stack of tungsten and tantalum nitride can be used. Alternatively, Cu or an alloy such as Cu—Mn, which has low resistance, or a stack of any of the above materials and Cu or an alloy such as Cu—Mn may be used. For example, titanium nitride can be used for the conductive layer 271 and tungsten can be used for the conductive layer 272 to form the conductive layer 270.

As the conductive layer 270, an oxide conductive layer of In—Ga—Zn oxide, zinc oxide, indium oxide, tin oxide, indium tin oxide, or the like may be used. When the oxide conductive layer is provided in contact with the insulating layer 260, oxygen can be supplied from the oxide conductive layer to the oxide semiconductor layer 230.

The insulating layer 280 can be an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 280 may be a stack of any of the above materials.

Here, like the insulating layer 220, the insulating layer 280 preferably contains oxygen more than that in the stoichiometric composition. Oxygen released from the insulating layer 280 can be diffused into the channel formation region in the oxide semiconductor layer 230 through the insulating layer 260, so that oxygen vacancies formed in the channel formation region can be filled with oxygen. In this manner, stable electrical characteristics of the transistor can be achieved.

A film having an effect of blocking impurities is preferably provided over the transistor or the insulating layer 280. The blocking film can be a silicon nitride film, an aluminum nitride film, an aluminum oxide film, or the like.

A nitride insulating film has a function of blocking moisture and the like and can improve the reliability of the transistor. An aluminum oxide film has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 230, preventing release of oxygen from the oxide semiconductor layer, and preventing unnecessary release of oxygen from the insulating layer 220.

High integration of a semiconductor device requires transistor miniaturization. However, miniaturization of a transistor tends to cause deterioration of electrical characteristics of the transistor. For example, a decrease in channel width causes a reduction in on-state current.

In the transistor of one embodiment of the present invention, the oxide semiconductor layer 230c can cover the oxide semiconductor layer 230b in which the channel is formed. In this structure, the channel formation layer is not in contact with the gate insulating layer; thus, scattering of carriers formed at the interface between the channel formation layer and the gate insulating layer can be reduced, and the on-state current of the transistor can be increased.

In the transistor of one embodiment of the present invention, as described above, the gate electrode layer (the conductive layer 270) is formed to electrically surround the oxide semiconductor layer 230 in the channel width direction. Accordingly, a gate electric field is applied to the oxide semiconductor layer 230 in a direction perpendicular to its side surface in addition to a direction perpendicular to its top surface. In other words, a gate electric field is applied to the entire channel formation layer and effective channel width is increased, leading to a further increase in the on-state current.

<Formation Examples of Components>

Although the variety of films such as the metal films, the semiconductor films, and the inorganic insulating films described in this embodiment can be formed typically by a sputtering method or a plasma-enhanced CVD method, such films may be formed by another method such as a thermal CVD method. Examples of a thermal CVD method include a metal organic chemical vapor deposition (MOCVD) method and an atomic layer deposition (ALD) method.

Since plasma is not used for deposition, a thermal CVD method has an advantage that no defect due to plasma damage is generated.

Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of the substrate or over the substrate.

Deposition by an ALD method is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas together with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of an inert gas, and then the second source gas may be introduced. The first source gas is adsorbed on the surface of the substrate and reacted to form a first layer, and then, the second source gas introduced is adsorbed on the first layer and reacted. As a result, a second layer is stacked over the first layer, so that a thin film is formed. The sequence of the gas introduction is controlled and repeated more than once until a desired thickness is obtained, whereby a thin film with excellent step coverage can be formed. The thickness of the thin film can be adjusted by the number of repetitions of the sequence of gas introduction; therefore, ALD makes it possible to accurately adjust a film thickness and thus is suitable for manufacturing a minute FET.

A facing-target-type sputtering apparatus can be used to form an oxide semiconductor layer. Deposition using a facing-target-type sputtering apparatus can be referred to as vapor deposition sputtering (VDSP).

When an oxide semiconductor layer is deposited using a facing-target-type sputtering apparatus, plasma damage to the oxide semiconductor layer at the time of deposition can be reduced. Thus, oxygen vacancies in the layer can be reduced. In addition, the use of the facing-target-type sputtering apparatus enables low-pressure deposition. Accordingly, the concentration of impurities (e.g., hydrogen, a rare gas such as argon, and water) in a deposited oxide semiconductor layer can be lowered.

The structure described in this embodiment can be used in appropriate combination with the structure described in any of the other embodiments.

Embodiment 5

Hereinafter, the composition of a CAC-OS applicable to a transistor disclosed in one embodiment of the present invention will be described.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

As an example of the CAC-OS, an In—Ga—Zn oxide with the CAC composition (such an In—Ga—Zn oxide may be particularly referred to as CAC-IGZO) will be described. The CAC-IGZO has a composition with a mosaic pattern in which materials are separated into indium oxide ($InO_{X1}$, where X1 is a real number greater than 0) or indium zinc oxide ($In_{X2}Zn_{Y2}O_{Z2}$, where X2, Y2, and Z2 are each a real number greater than 0) and gallium oxide ($GaO_{X3}$, where X3 is a real number greater than 0) or gallium zinc oxide ($Ga_{X4}Zn_{Y4}O_{Z4}$, where X4, Y4, and Z4 are each a real number greater than 0), for example. Furthermore, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. In this specification, for example, when the atomic ratio of In to an element M in a first region is larger than the atomic ratio of In to the element M in a second region, the first region has a higher In concentration than the second region.

Note that a compound containing In, Ga, Zn, and O is known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compound has a single-crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In part of the material composition of a CAC-OS containing In, Ga, Zn, and O, nanoparticle regions including Ga as a main component and nanoparticle regions including In as a main component are observed. These nanoparticle regions are randomly dispersed in a mosaic pattern. Therefore, the crystal structure is a secondary element for the CAC-OS.

Note that the CAC-OS does not include a stacked structure of two or more films with different compositions. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In part of the composition of a CAC-OS which contains, instead of gallium, one or more metal elements selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like, nanoparticle regions including the metal element(s) as a main component(s) and nanoparticle regions including In as a main component are observed. These nanoparticle regions are randomly dispersed in a mosaic pattern.

The CAC-OS can be formed by a sputtering method under conditions where a substrate is not heated intentionally, for example. In the case of forming the CAC-OS by a sputtering method, one or more gases selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible; for example, the flow ratio of an oxygen gas is preferably higher than or equal to 0% and lower than 30%, further preferably higher than or equal to 0% and lower than or equal to 10%.

The CAC-OS is characterized in that no clear peak is observed in measurement using $\theta/2\theta$ scan by an out-of-plane method, which is an X-ray diffraction (XRD) measurement method. That is, XRD shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in the plan-view direction and the cross-sectional direction.

For example, an energy dispersive X-ray spectroscopy (EDX) mapping image confirms that an In—Ga—Zn oxide with the CAC composition has a structure in which regions including $GaO_{X3}$ as a main component and regions including $In_{X2}Zn_{Y2}O_{Z2}$ or $InO_{X1}$ as a main component are unevenly distributed and mixed.

The CAC-OS has a structure and characteristics different from those of an IGZO compound in which metal elements are evenly distributed. That is, in the CAC-OS, regions including $GaO_{X3}$ or the like as a main component and regions including $In_{X2}Zn_{Y2}O_{Z2}$ or $InO_{X1}$ as a main component are phase-separated from each other in a mosaic pattern.

The conductivity of the region including $In_{X2}Zn_{Y2}O_{Z2}$ or $InO_{X1}$ as a main component is higher than that of the region including $GaO_{X3}$ or the like as a main component. In other words, when carriers flow through the region including $In_{X2}Zn_{Y2}O_{Z2}$ or $InO_{X1}$ as a main component, the oxide semiconductor exhibits conductivity. Accordingly, when the regions including $In_{X2}Zn_{Y2}O_{Z2}$ or $InO_{X1}$ as a main component are distributed like clouds in the oxide semiconductor, a high field-effect mobility ($\mu$) can be achieved.

In contrast, the insulating property of the region including $GaO_{X3}$ or the like as a main component is higher than that of the region including $In_{X2}Zn_{Y2}O_{Z2}$ or $InO_{X1}$ as a main component. In other words, when the regions including $GaO_{X3}$ or the like as a main component are distributed in the oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and a high field-effect mobility ($\mu$) can be achieved.

A semiconductor element including a CAC-OS has a high reliability. Thus, the CAC-OS is suitably used for a variety of semiconductor devices typified by a display.

The structure described in this embodiment can be used in appropriate combination with any of the structures described in the other embodiments.

Embodiment 6

In this embodiment, examples of a package and a camera module each including an image sensor chip are described. For the image sensor chip, the structure of an imaging device of one embodiment of the present invention can be used. This can increase the operation speed of an electronic appliance including a package or a camera module equipped with the image sensor chip.

Figure 32A:
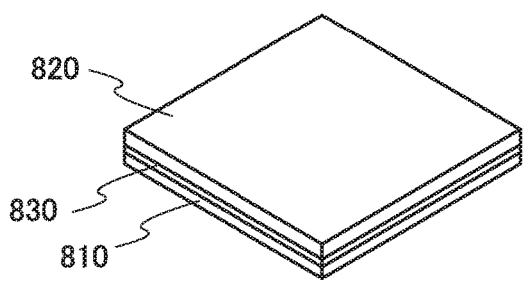
FIGS. 32A to 32D are perspective views and a cross-sectional view of a package including an imaging device.

FIG. 32A is an external perspective view showing the top surface side of a package including an image sensor chip. The package includes a package substrate 810 to which an image sensor chip 850 is fixed, a cover glass 820, an adhesive 830 for bonding the package substrate 810 and the cover glass 820 to each other, and the like.

Figure 32B:
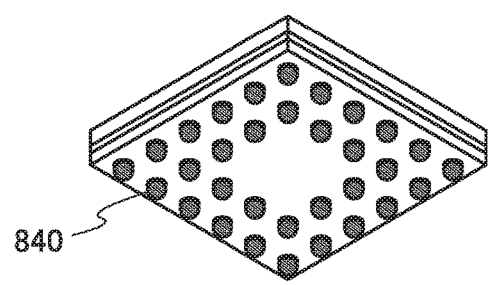

FIG. 32B is an external perspective view showing the bottom surface side of the package. On the bottom surface of the package, a ball grid array (BGA) including solder balls as bumps 840 is formed. Although the BGA is employed here, a land grid array (LGA), a pin grid array (PGA), or the like may be alternatively employed.

Figure 32C:
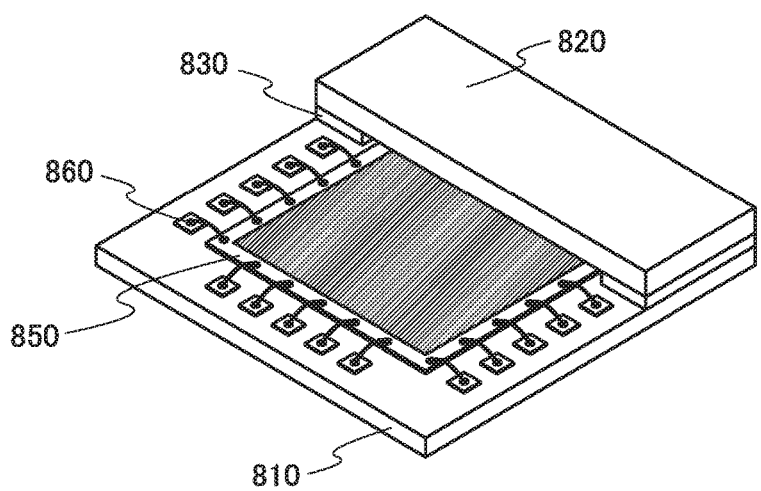
Figure 32D:
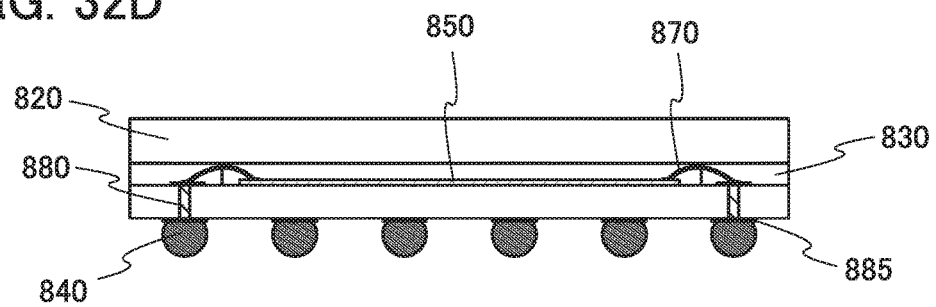

FIG. 32C is a perspective view of the package, in which the cover glass 820 and the adhesive 830 are partly illustrated. FIG. 32D is a cross-sectional view of the package. Electrode pads 860 are formed over the package substrate 810, and electrically connected to the bumps 840 through through-holes 880 and lands 885. The electrode pads 860 are electrically connected to electrodes of the image sensor chip 850 through wires 870.

FIG. 33A is an external perspective view showing the top surface side of a camera module in which an image sensor chip is mounted on a package with a built-in lens. The camera module includes a package substrate 811 to which an image sensor chip 851 is fixed, a lens cover 821, a lens 835, and the like. Furthermore, an IC chip 890 having functions of a driver circuit, a signal conversion circuit, and the like of an imaging device is provided between the package substrate 811 and the image sensor chip 851. Thus, a system in package (SiP) is formed.

FIG. 33B is an external perspective view showing the bottom surface side of the camera module. On the bottom surface and four side surfaces of the package substrate 811, mounting lands 841 are provided; this structure can be called a quad flat no-lead package (QFN). Although QFN is employed here, a quad flat package (QFP), the above BGA, or the like may be alternatively employed.

FIG. 33C is a perspective view of the module, in which the lens cover 821 and the lens 835 are partly illustrated. FIG. 33D is a cross-sectional view of the camera module. The lands 841 are partly used as electrode pads 861. The electrode pads 861 are electrically connected to electrodes of the image sensor chip 851 and the IC chip 890 through wires 871.

The image sensor chip placed in the package having the above structure can be easily mounted on and incorporated into a variety of semiconductor devices and electronic appliances.

The structures described in this embodiment can be used in appropriate combination with any of the structures described in the other embodiments.

Embodiment 7

Examples of an electronic appliance that can use the imaging device according to one embodiment of the present invention include display devices, personal computers, image memory devices or image reproducing devices provided with storage media, mobile phones, game machines (including portable game machines), portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIGS. 34A to 34F illustrate specific examples of these electronic appliances.

Figure 34A:
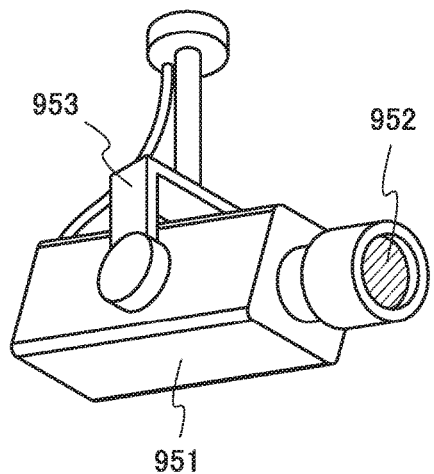
FIGS. 34A to 34F illustrate examples of electronic appliances.

FIG. 34A illustrates a monitoring camera, which includes a housing 951, a lens 952, a support portion 953, and the like. The imaging device of one embodiment of the present invention can be included as a component for obtaining an image in the monitoring camera, allowing the monitoring camera to operate at high speed. Note that a "monitoring camera" is a common name and does not limit the uses. For example, a device that has a function of a monitoring camera can also be called a camera or a video camera.

Figure 34B:
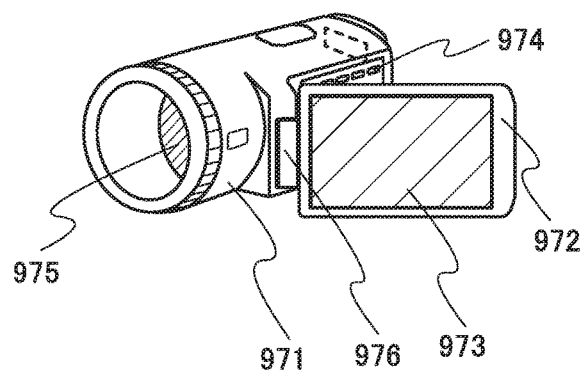

FIG. 34B illustrates a video camera, which includes a first housing 971, a second housing 972, a display portion 973, operation buttons 974, a lens 975, a joint 976, and the like. The operation buttons 974 and the lens 975 are provided for the first housing 971, and the display portion 973 is provided for the second housing 972. The imaging device of one embodiment of the present invention can be included as a component for obtaining an image in the video camera, allowing the video camera to operate at high speed.

Figure 34C:
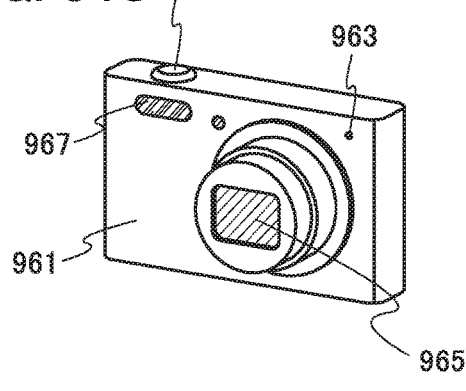

FIG. 34C illustrates a digital camera, which includes a housing 961, a shutter button 962, a microphone 963, a light-emitting portion 967, a lens 965, and the like. The imaging device of one embodiment of the present invention can be included as a component for obtaining an image in the digital camera, allowing the digital camera to operate at high speed.

Figure 34D:
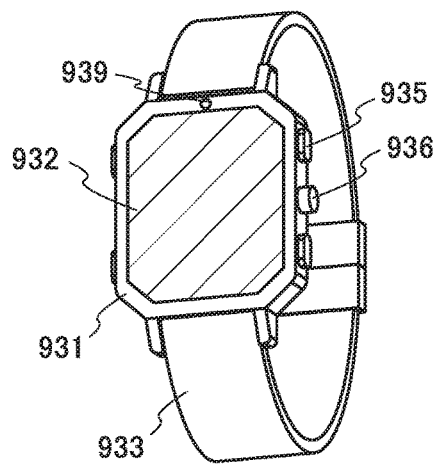

FIG. 34D illustrates a wrist-watch-type information terminal, which includes a housing 931, a display portion 932, a wristband 933, operation buttons 935, a winder 936, a camera 939, and the like. The display portion 932 may be a touch panel. The imaging device of one embodiment of the present invention can be included as a component for obtaining an image in the information terminal, allowing the information terminal to operate at high speed.

Figure 34E:
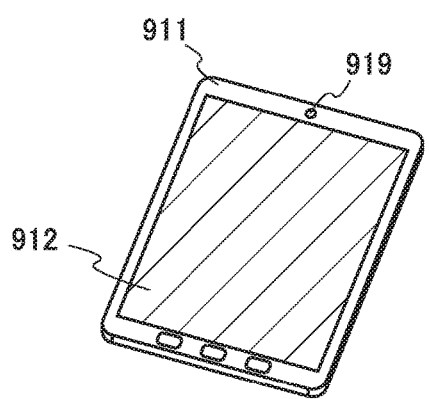

FIG. 34E illustrates a portable data terminal, which includes a housing 911, a display portion 912, a camera 919, and the like. A touch panel function of the display portion 912 enables input and output of information. The imaging device of one embodiment of the present invention can be included as one component for obtaining an image in the portable data terminal, allowing the portable data terminal to operate at high speed.

Figure 34F:
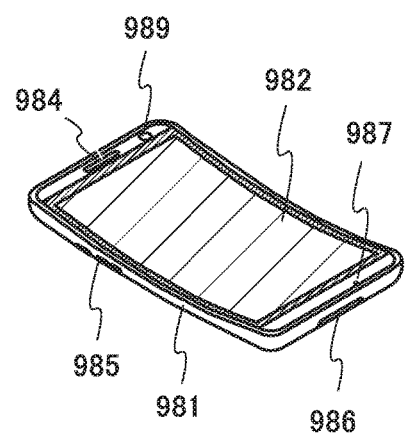

FIG. 34F illustrates a mobile phone, which includes a housing 981 provided with a display portion 982, a microphone 987, a speaker 984, a camera 989, an input/output terminal 986, operation buttons 985, and the like. The imaging device of one embodiment of the present invention can be included as one component for obtaining an image in the mobile phone, allowing the mobile phone to operate at high speed.

Note that this embodiment can be combined as appropriate with any of the other embodiments in this specification.

This application is based on Japanese Patent Application Serial No. 2016-252967 filed with Japan Patent Office on Dec. 27, 2016, the entire contents of which are hereby incorporated by reference.

What is claimed is:

1. An imaging device comprising:
   an imaging circuit;
   a first controller;
   a plurality of circuits including a first circuit and a second circuit; and
   a plurality of selectors including a first selector and a second selector, wherein each of the plurality of circuits includes an image processing unit and a first retention circuit,
   wherein each of the plurality of selectors includes a switch unit and a second retention circuit,
   wherein the first retention circuit includes a first transistor,
   wherein the second retention circuit includes a second transistor,
   wherein the imaging circuit is configured to generate image data by performing imaging operation,
   wherein the first controller is configured to control power supply to the plurality of circuits,
   wherein the image processing unit of the first circuit is configured to process image data that has been generated by the imaging circuit,
   wherein the image processing unit of the first circuit is configured to process image data that has been processed by the image processing unit of the second circuit,
   wherein the first retention circuit of the first circuit is configured to receive a first parameter,
   wherein the first retention circuit of the first circuit is configured to retain the first parameter while power supply to the first circuit is interrupted,
   wherein the switch unit of the first selector is configured to output the image data selected from the image data that has been generated by the imaging circuit and the image data that has been processed by the image processing unit of the first circuit or the second circuit,
   wherein the second retention circuit of the first selector is configured to receive a second parameter,
   wherein the second retention circuit of the first selector is configured to retain the second parameter while power supply to the first selector is interrupted, and
   wherein the first transistor and the second transistor each include a metal oxide in a channel formation region.

2. The imaging device according to claim 1,
   wherein the first parameter indicates information that is necessary for the image processing unit to perform processing, and
   wherein the second parameter indicates image data that is output from the switch unit.

3. The imaging device according to claim 1,
   wherein the first retention circuit includes a first register and a second register,
   wherein the second retention circuit includes a third register and a fourth register,
   wherein the first register is configured to supply the first parameter to the second register,
   wherein the second register is configured to output the first parameter, which has been received from the first register, to the image processing unit,
   wherein the third register is configured to supply the second parameter to the fourth register, and
   wherein the fourth register is configured to output the second parameter, which has been received from the third register, to the switch unit.

4. The imaging device according to claim 3,
   wherein the second register includes the first transistor,
   wherein the fourth register includes the second transistor,
   wherein the second register of the first circuit is configured to retain the first parameter while power supply to the first circuit is interrupted, and
   wherein the fourth register of the first selector is configured to retain the second parameter while power supply to the first selector is interrupted.

5. The imaging device according to claim 3,
   wherein the first register and the third register each include a flip-flop circuit.

6. The imaging device according to claim 1, wherein the plurality of circuits are n (n is an integer of 2 or more) circuits and the plurality of selectors are (n+1) selectors.

7. The imaging device according to claim 1,
   wherein the first retention circuit includes a first capacitor,
   wherein the second retention circuit includes a second capacitor,
   wherein a source or a drain of the first transistor is electrically connected to the first capacitor, and
   wherein a source or a drain of the second transistor is electrically connected to the second capacitor.

8. The imaging device according to claim 1, further comprising a second controller,
   wherein the second controller controls power supply to the imaging circuit and the first controller.

9. The imaging device according to claim 1, further comprising a host,
   wherein the host is configured to generate the first parameter and the second parameter.

10. The imaging device according to claim 9,
    wherein the first controller is configured to receive the first parameter that has been generated by the host,
    wherein the first controller is configured to receive the second parameter that has been generated by the host,
    wherein the first controller is configured to supply the received first parameter to the first circuit, and
    wherein the first controller is configured to supply the received second parameter to the first selector.

11. An electronic appliance comprising:
    the imaging device according to claim 1; and
    an operation button.

12. An imaging device comprising:
    an imaging circuit;
    a first controller;
    a plurality of circuits including a first circuit and a second circuit; and
    a plurality of selectors including a first selector and a second selector,
    wherein each of the plurality of circuits includes an image processing unit and a first retention circuit,
    wherein each of the plurality of selectors includes a switch unit and a second retention circuit,
    wherein the first retention circuit includes a first transistor,
    wherein the second retention circuit includes a second transistor,
    wherein the imaging circuit is configured to generate image data by performing imaging operation,
    wherein the first controller is configured to control power supply to the plurality of circuits,
    wherein the image processing unit of the first circuit is configured to process image data that has been generated by the imaging circuit,
    wherein the image processing unit of the first circuit is configured to process image data that has been processed by the image processing unit of the second circuit,
    wherein the first retention circuit of the first circuit is configured to receive a first parameter, wherein the first retention circuit of the first circuit is configured to retain the first parameter while power supply to the first circuit is interrupted, wherein the switch unit of the first selector is configured to output the image data selected from the image data that has been generated by the imaging circuit and the image data that has been processed by the image processing unit of the first circuit or the second circuit, wherein the second retention circuit of the first selector is configured to receive a second parameter, and wherein the second retention circuit of the first selector is configured to retain the second parameter while power supply to the first selector is interrupted.

13. The imaging device according to claim 12,
wherein the first parameter indicates information that is necessary for the image processing unit to perform processing, and
wherein the second parameter indicates image data that is output from the switch unit.

14. The imaging device according to claim 12,
wherein the first retention circuit includes a first register and a second register,
wherein the second retention circuit includes a third register and a fourth register,
wherein the first register is configured to supply the first parameter to the second register,
wherein the second register is configured to output the first parameter, which has been received from the first register, to the image processing unit,
wherein the third register is configured to supply the second parameter to the fourth register, and
wherein the fourth register is configured to output the second parameter, which has been received from the third register, to the switch unit.

15. The imaging device according to claim 14,
wherein the second register includes the first transistor,
wherein the fourth register includes the second transistor,
wherein the second register of the first circuit is configured to retain the first parameter while power supply to the first circuit is interrupted, and
wherein the fourth register of the first selector is configured to retain the second parameter while power supply to the first selector is interrupted.

16. The imaging device according to claim 14,
wherein the first register and the third register each include a flip-flop circuit.

17. The imaging device according to claim 12, wherein the plurality of circuits are n (n is an integer of 2 or more) circuits and the plurality of selectors are (n+1) selectors.

18. The imaging device according to claim 12,
wherein the first retention circuit includes a first capacitor,
wherein the second retention circuit includes a second capacitor,
wherein a source or a drain of the first transistor is electrically connected to the first capacitor, and
wherein a source or a drain of the second transistor is electrically connected to the second capacitor.

19. The imaging device according to claim 12 further comprising a second controller,
wherein the second controller controls power supply to the imaging circuit and the first controller.

20. An electronic appliance comprising:
the imaging device according to claim 12; and
an operation button.

* * * * *